US011069687B2

(12) United States Patent
Tang et al.

(10) Patent No.: US 11,069,687 B2
(45) Date of Patent: Jul. 20, 2021

(54) INTEGRATED ASSEMBLIES HAVING SHIELD LINES BETWEEN DIGIT LINES, AND METHODS OF FORMING INTEGRATED ASSEMBLIES

(71) Applicant: Micron Technology, Inc., Boise, ID (US)

(72) Inventors: Sanh D. Tang, Meridian, ID (US); Srinivas Pulugurtha, Boise, ID (US); Richard J. Hill, Boise, ID (US); Yunfei Gao, Boise, ID (US); Nicholas R. Tapias, Boise, ID (US); Litao Yang, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/809,924

(22) Filed: Mar. 5, 2020

(65) Prior Publication Data
US 2020/0286895 A1 Sep. 10, 2020

Related U.S. Application Data

(60) Provisional application No. 62/814,664, filed on Mar. 6, 2019.

(51) Int. Cl.
*H01L 27/108* (2006.01)
(52) U.S. Cl.
CPC .. *H01L 27/10841* (2013.01); *H01L 27/10802* (2013.01); *H01L 27/10876* (2013.01)
(58) Field of Classification Search
None
See application file for complete search history.

(56) References Cited

U.S. PATENT DOCUMENTS 8,530,312 B2 *  9/2013  Filippini ........... H01L 21/76224
                                                       438/270
10,229,874 B1   3/2019  Ramaswamy
(Continued)

FOREIGN PATENT DOCUMENTS

WO          WO         6/2020
     PCT/US2020/021103

OTHER PUBLICATIONS

Yeo et al., "Direct Tunneling Gate Leakage Current in Transistors with Ultrathin Silicon Nitride Gate Dielectric", IEEE Electron Device Letters vol. 21, Issue 11, Nov. 2000, United States, pp. 540-542.

*Primary Examiner* — Steven M Christopher
(74) *Attorney, Agent, or Firm* — Wells St. John P.S.

(57) ABSTRACT

Some embodiments include an integrated assembly having digit lines which extend along a first direction, and which are spaced from one another by intervening regions. Each of the intervening regions has a first width along a cross-section. Pillars extend upwardly from the digit lines; and the pillars include transistor channel regions extending vertically between upper and lower source/drain regions. Storage elements are coupled with the upper source/drain regions. Wordlines extend along a second direction which crosses the first direction. The wordlines include gate regions adjacent the channel regions. Shield lines are within the intervening regions and extend along the first direction. The shield lines may be coupled with at least one reference voltage node. Some embodiments include methods of forming integrated assemblies.

23 Claims, 79 Drawing Sheets

(56) References Cited

U.S. PATENT DOCUMENTS

| | | | |
|---|---|---|---|
| 2006/0267158 A1* | 11/2006 | Weis | G11C 7/18 |
| | | | 257/659 |
| 2009/0004843 A1 | 1/2009 | Mokhlesi et al. | |
| 2014/0346652 A1 | 11/2014 | Surthi et al. | |
| 2018/0182764 A1* | 6/2018 | Juengling | H01L 27/0886 |
| 2018/0331029 A1* | 11/2018 | Sukekawa | H01L 27/2463 |
| 2019/0348424 A1 | 11/2019 | Karda et al. | |

* cited by examiner

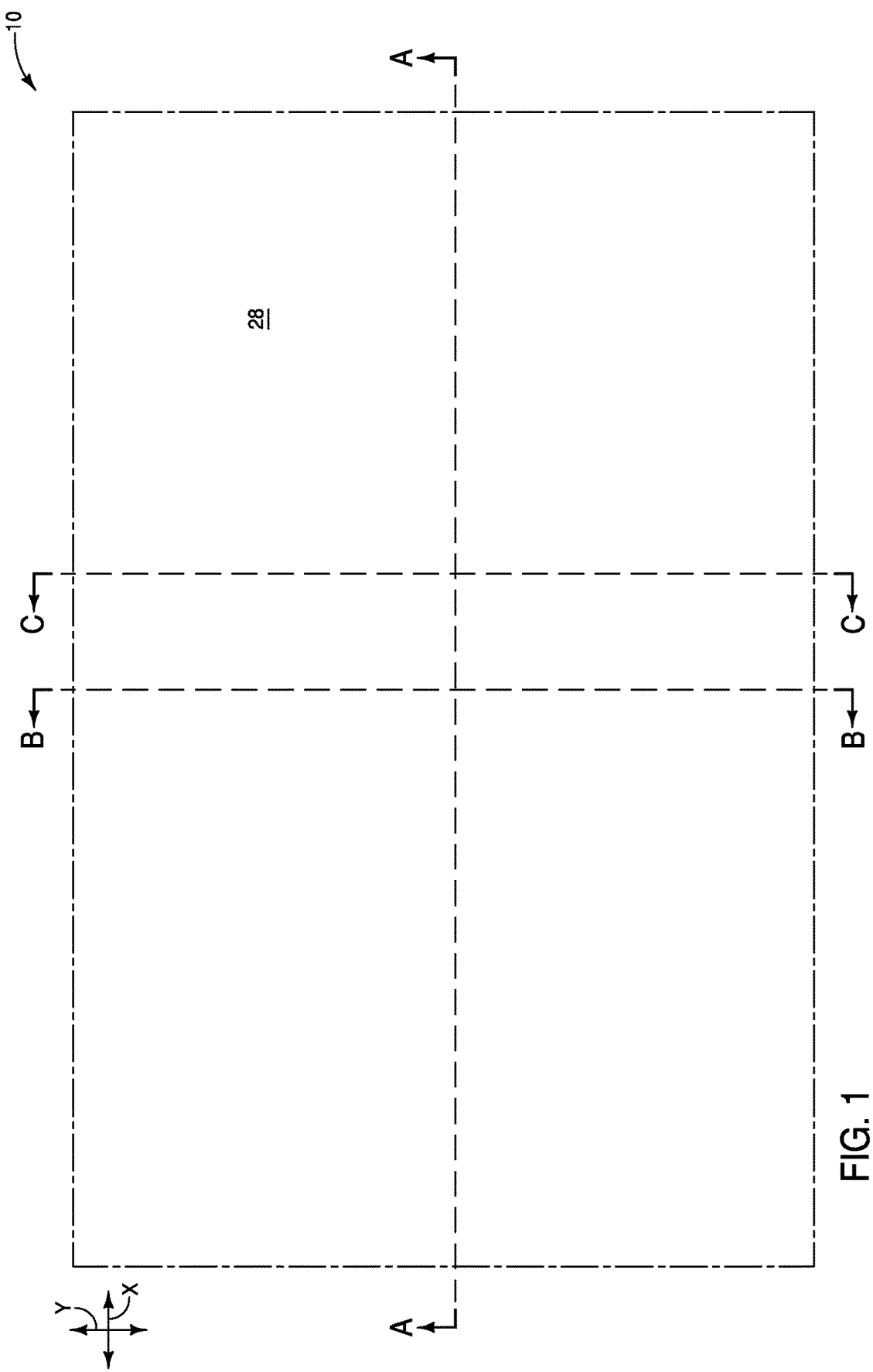

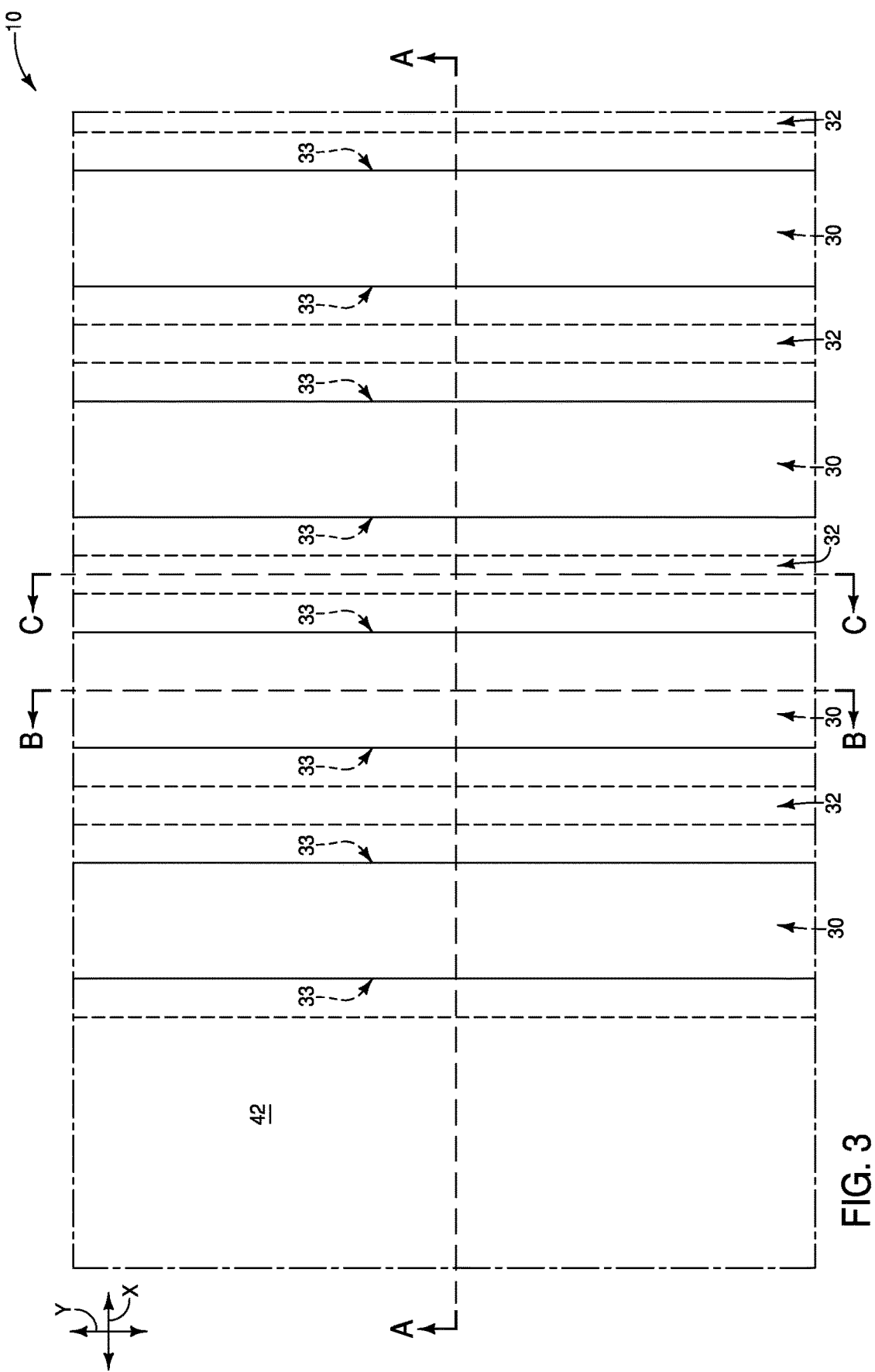

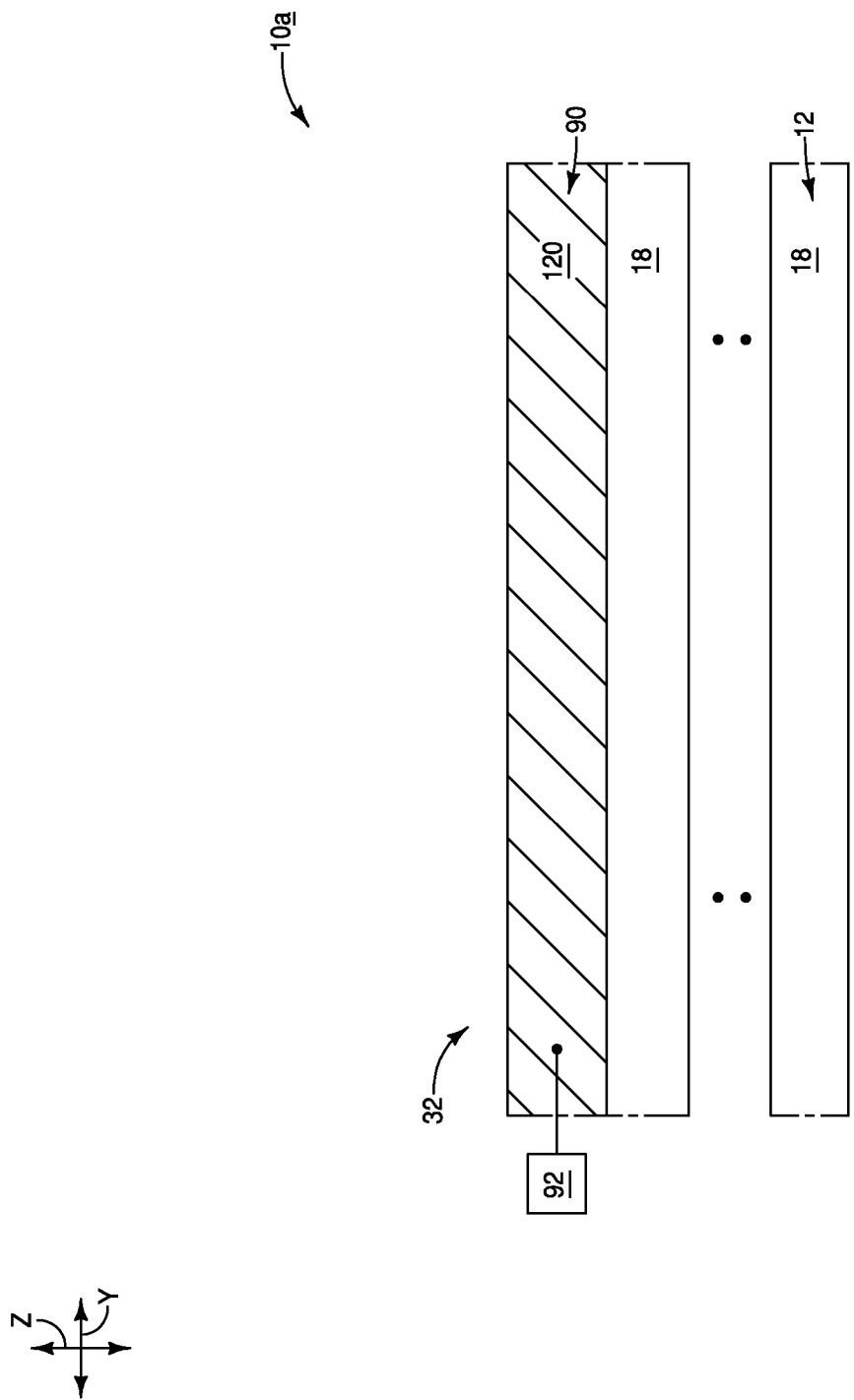

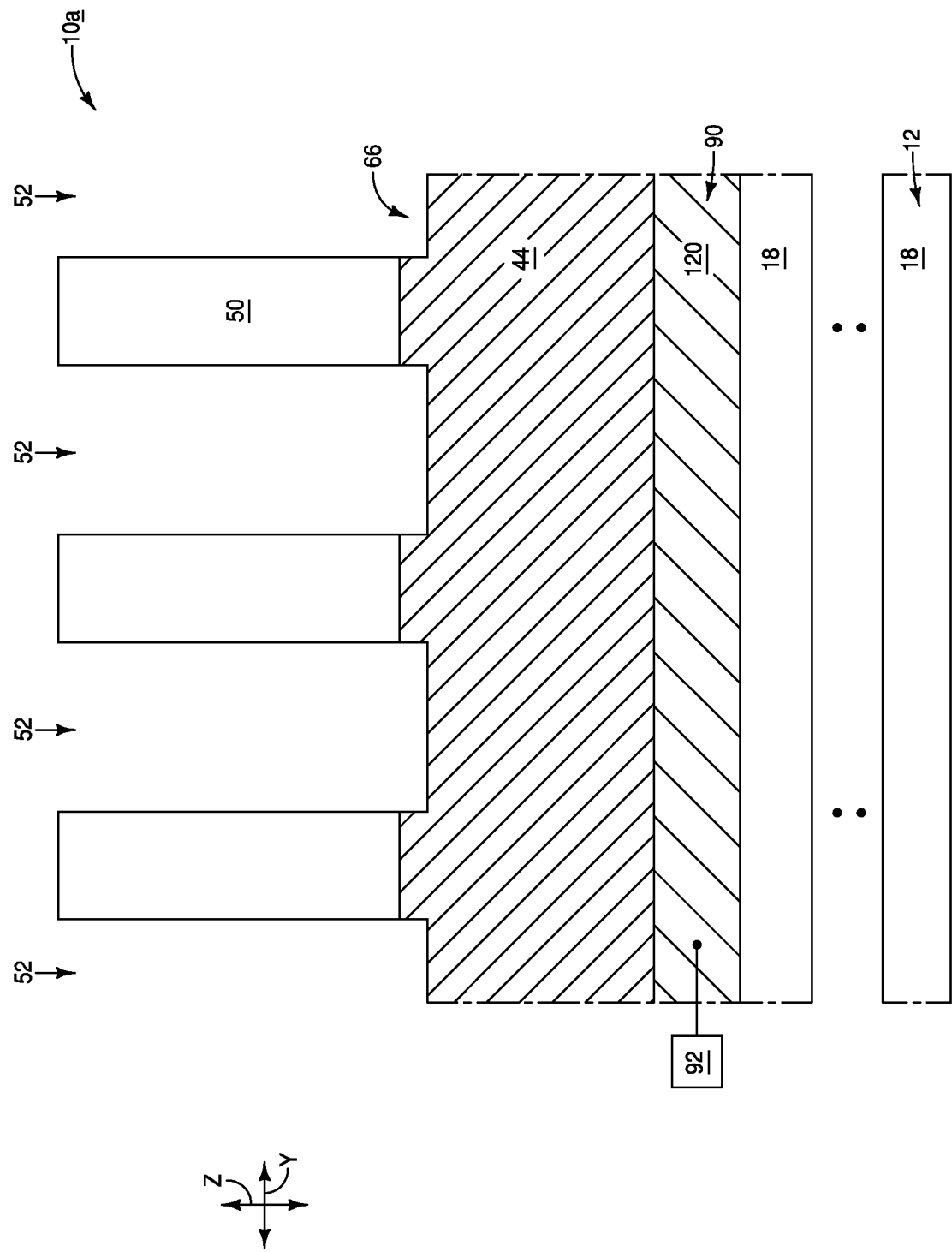

INTEGRATED ASSEMBLIES HAVING SHIELD LINES BETWEEN DIGIT LINES, AND METHODS OF FORMING INTEGRATED ASSEMBLIES

CROSS REFERENCE TO RELATED APPLICATION

This application claims priority to and the benefit of U.S. Provisional Patent Application No. 62/814,664, which was filed on Mar. 6, 2019, the entirety of which is incorporated by reference herein.

TECHNICAL FIELD

Integrated assemblies having shield lines between digit lines, and methods of forming integrated assemblies.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and with digit lines extending along columns of the array. The wordlines may be coupled with the transistors of the memory cells. Each memory cell may be uniquely addressed through a combination of one of the wordlines with one of the digit lines.

A problem which may be encountered in conventional memory architectures is that capacitive coupling (i.e., parasitic capacitance) may occur between adjacent digit lines, leading to disturbance along inactive digit lines when their neighbors are activated. The capacitive coupling becomes increasing problematic as memory architectures are scaled to increasing levels of integration. It would be desirable to alleviate or prevent such capacitive coupling.

It is also desirable to develop new methods for fabricating highly-integrated memory (e.g., DRAM), and to develop new architectures fabricated with such methods.

BRIEF DESCRIPTION OF THE DRAWINGS

FIGS. 1-1C are diagrammatic views of a region of an example construction at an example initial process stage of an example method of forming an example integrated assembly.

FIGS. 1A, 1B and 1C are diagrammatic cross-sectional views along the lines A-A, B-B and C-C of FIG. 1, respectively.

FIGS. 2B and 2C are diagrammatic cross-sectional views along the lines B-B and C-C, respectively, of FIGS. 2 and 2A.

FIGS. 3-3C are diagrammatic views of the region of the example construction of FIGS. 1-1C at an example processing stage subsequent to that of FIGS. 2-2C. FIGS. 3B and 3C are diagrammatic cross-sectional views along the lines B-B and C-C, respectively, of FIGS. 3 and 3A.

FIGS. 4B and 4C are diagrammatic cross-sectional views along the lines B-B and C-C, respectively, of FIGS. 4 and 4A.

FIGS. 5B and 5C are diagrammatic cross-sectional views along the lines B-B and C-C, respectively, of FIGS. 5 and 5A.

FIGS. 6B and 6C are diagrammatic cross-sectional views along the lines B-B and C-C, respectively, of FIGS. 6 and 6A.

FIGS. 7B and 7C are diagrammatic cross-sectional views along the lines B-B and C-C, respectively, of FIGS. 7 and 7A.

FIGS. 8B and 8C are diagrammatic cross-sectional views along the lines B-B and C-C, respectively, of FIGS. 8 and 8A.

FIGS. 9B and 9C are diagrammatic cross-sectional views along the lines B-B and C-C, respectively, of FIGS. 9 and 9A.

FIG. 10 is a view along the same cross-section as FIG. 9A.

FIG. 13 is a view along the same cross-section as FIGS. 6A and 7A.

FIGS. 14A, 14B and 14C are diagrammatic cross-sectional views along the lines A-A, B-B and C-C of FIG. 14, respectively.

FIGS. 15B and 15C are diagrammatic cross-sectional views along the lines B-B and C-C, respectively, of FIGS. 15 and 15A.

FIGS. 16-16C are diagrammatic views of the region of the example construction of FIGS. 14-14C at an example processing stage subsequent to that of FIGS. 15-15C. FIGS. 16B and 16C are diagrammatic cross-sectional views along the lines B-B and C-C, respectively, of FIGS. 16 and 16A.

FIGS. 17B and 17C are diagrammatic cross-sectional views along the lines B-B and C-C, respectively, of FIGS. 17 and 17A.

FIGS. 18B and 18C are diagrammatic cross-sectional views along the lines B-B and C-C, respectively, of FIGS. 18 and 18A.

FIGS. 19B and 19C are diagrammatic cross-sectional views along the lines B-B and C-C, respectively, of FIGS. 19 and 19A.

FIGS. 20-20C are diagrammatic views of the region of the example construction of FIGS. 14-14C at an example processing stage subsequent to that of FIGS. 19-19C. FIGS. 20B and 20C are diagrammatic cross-sectional views along the lines B-B and C-C, respectively, of FIGS. 20 and 20A.

FIGS. 21B and 21C are diagrammatic cross-sectional views along the lines B-B and C-C, respectively, of FIGS. 21 and 21A.

FIGS. 22B and 22C are diagrammatic cross-sectional views along the lines B-B and C-C, respectively, of FIGS. 22 and 22A.

FIG. 23 is a view along the same cross-section as FIG. 22B.

DETAILED DESCRIPTION OF THE
ILLUSTRATED EMBODIMENTS

Some embodiments include memory architectures (e.g., DRAM) having shield lines provided between digit lines. The shield lines may be coupled with a reference voltage (e.g., ground, Vcc/2, etc.) so that they are not electrically floating. The shield lines may alleviate capacitive coupling between neighboring digit lines. Some embodiments include methods of fabricating memory architectures. Example embodiments are described with reference to FIGS. 1-24.

Figure 1A:
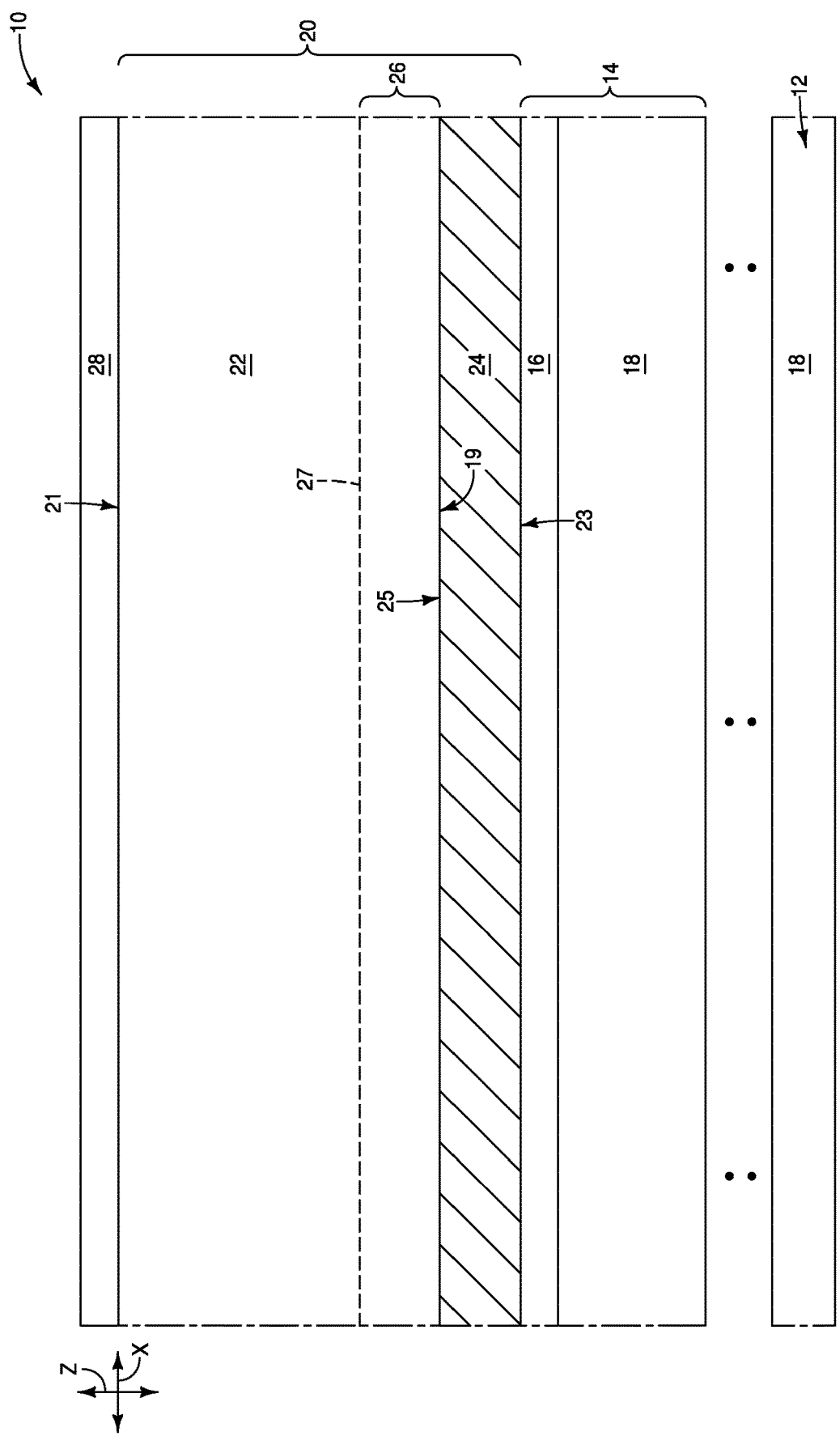
Figure 1B:
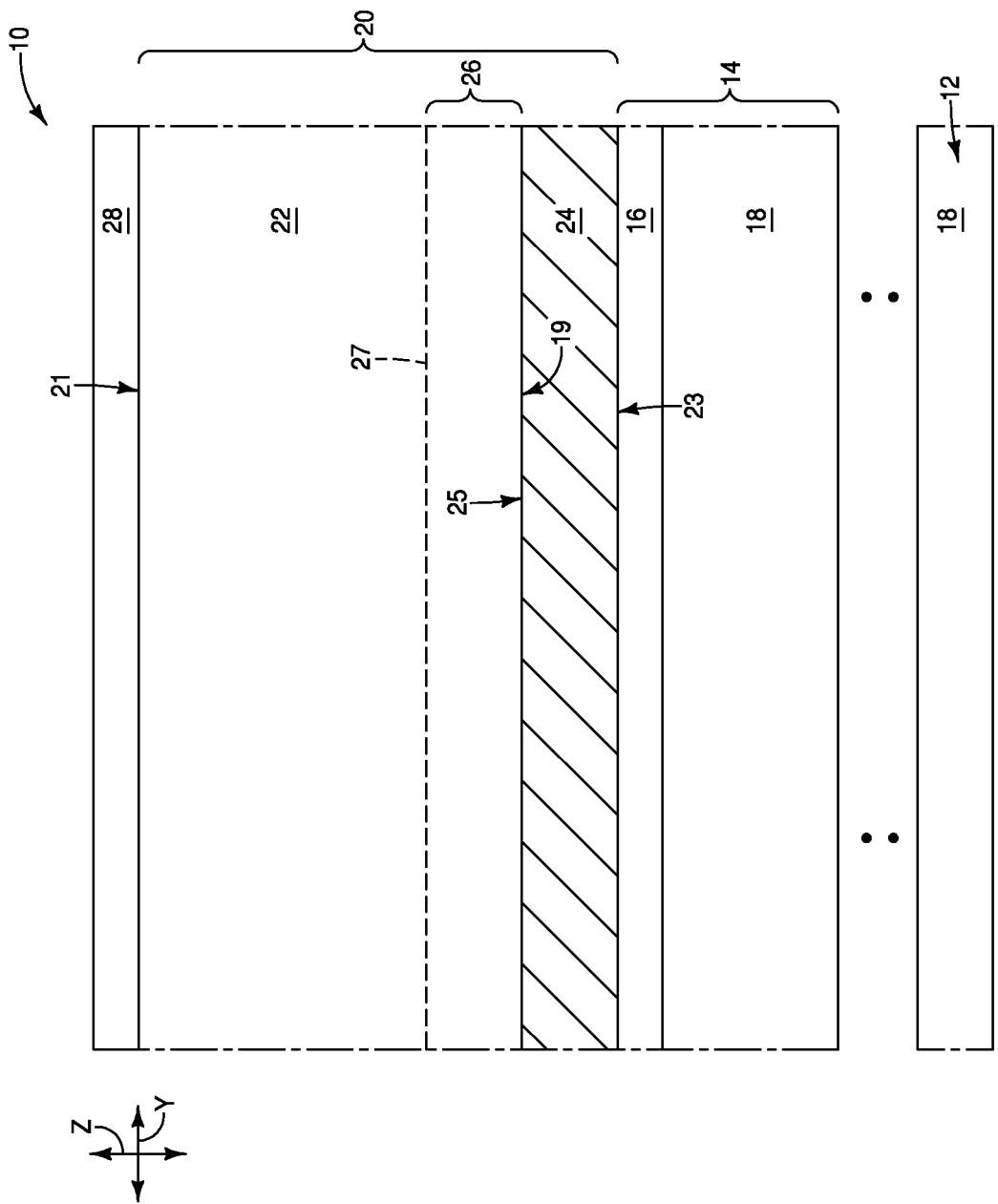
Figure 1C:
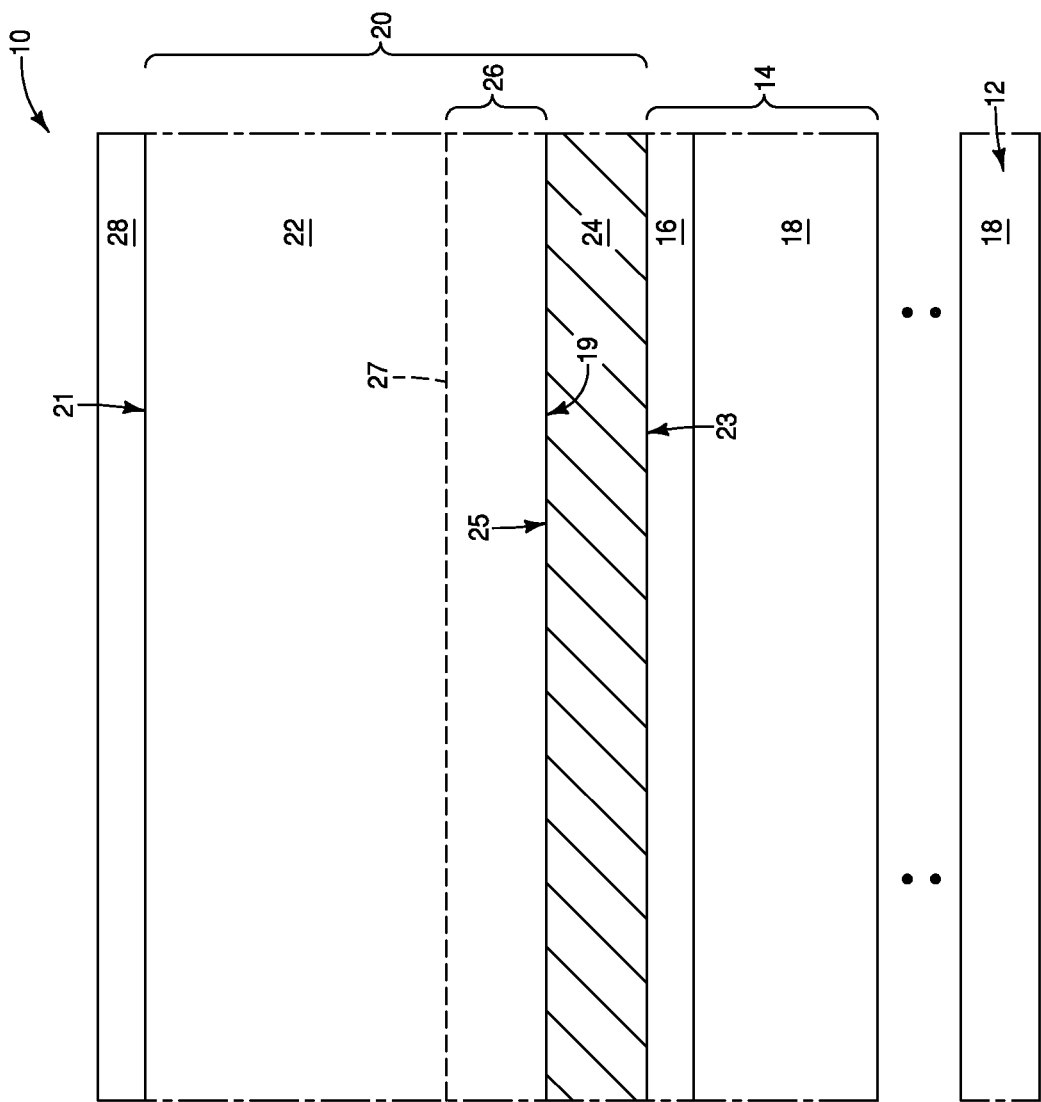

Referring to FIGS. 1-1C, an integrated assembly (construction) 10 includes a base 12. The base 12 comprises semiconductor material 18; and such semiconductor material may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A support structure 14 is over the base 12. The support structure includes insulative material 16 over the semiconductor material 18. A gap is provided between the support structure 14 and the base 12 to indicate that there may be intervening materials, components, etc., between the support structure 14 and the base 12. In some embodiments, the gap may be omitted.

The insulative material 16 may comprise any suitable composition(s); and in some embodiments may comprise, consist essentially of, or consist of silicon dioxide.

A stack 20 is formed over the support structure 14. The stack 20 includes semiconductor material 22 over digit line material 24.

The digit line material 24 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the digit line material may be a metal-containing material comprising one or more of tungsten, titanium, titanium nitride, tungsten nitride, etc.

The digit line material 24 has a bottom surface 23 directly against the insulative material 16, and has a top surface 25 in opposing relation to the bottom surface 23.

The semiconductor material 22 may comprise any suitable semiconductor composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 22 may comprise, consist essentially of, or consist of silicon (e.g., monocrystalline silicon, polycrystalline silicon, etc.).

A bottom section 26 of the semiconductor material 22 is conductively-doped and is ultimately incorporated into source/drain regions of transistors (with example transistors being described below). The bottom section 26 may be n-type doped or p-type doped depending on whether the transistors are to be n-channel devices or p-channel devices. In the shown embodiment, the bottom section 26 is directly against the top surface 25 of the digit line material 24, and accordingly is electrically coupled with the digit line material 24. An approximate upper boundary of the bottom section 26 is diagrammatically illustrated with a dashed line 27.

The semiconductor material 22 has a bottom surface 19 directly against the top surface 25 of the digit line material 24, and has a top surface 21 in opposing relation to the bottom surface 19.

A protective capping material 28 is formed over the stack 20, and is directly against the top surface 21 of the semiconductor material 22. The capping material 28 may comprise any suitable composition(s); and in some embodiments may comprise, consist essentially of, or consist of silicon nitride.

Figure 2:
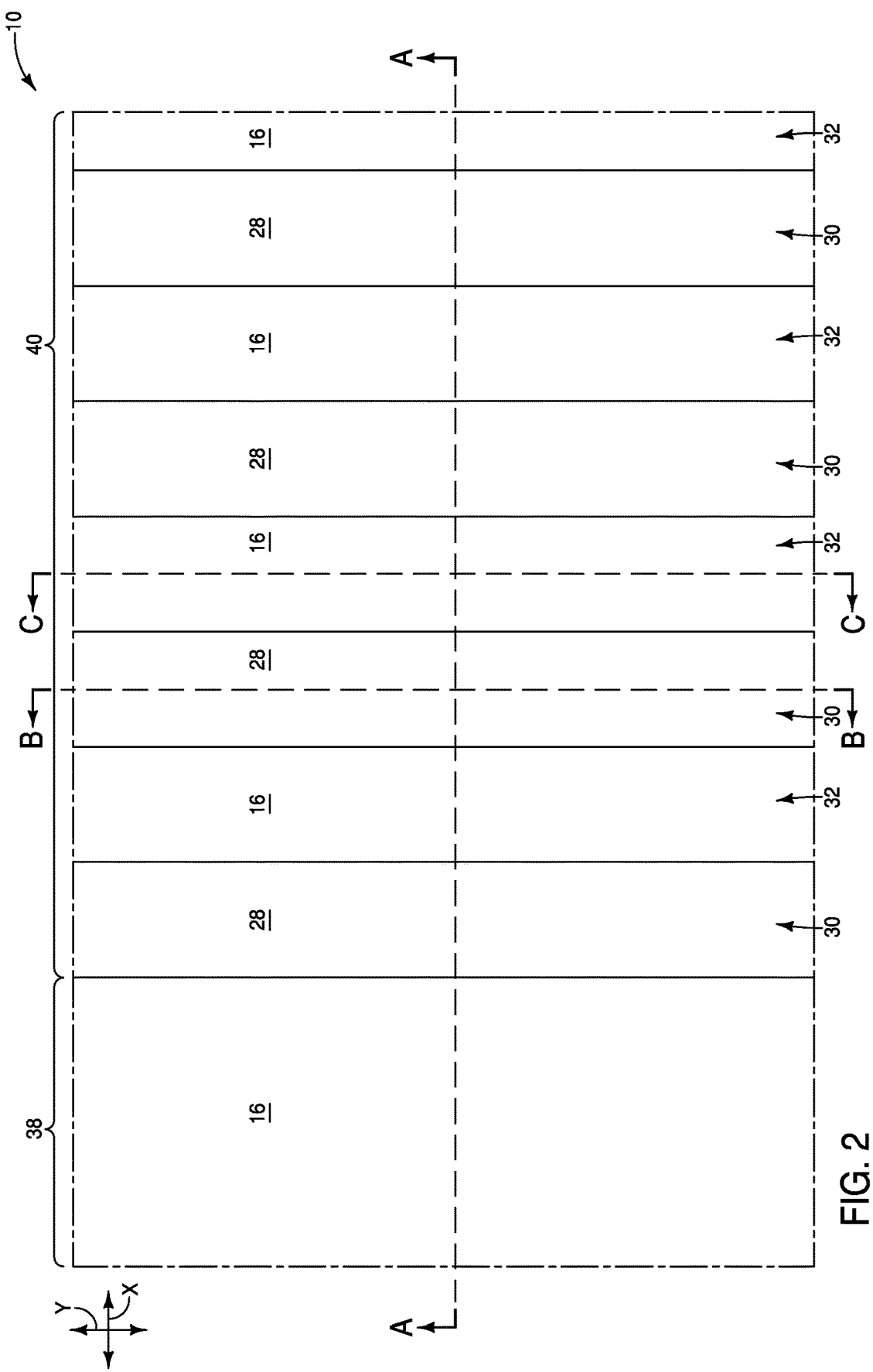
FIGS. 2-2C are diagrammatic views of the region of the example construction of FIGS. 1-1C at an example processing stage subsequent to that of FIGS. 1-1C.
Figure 2A:
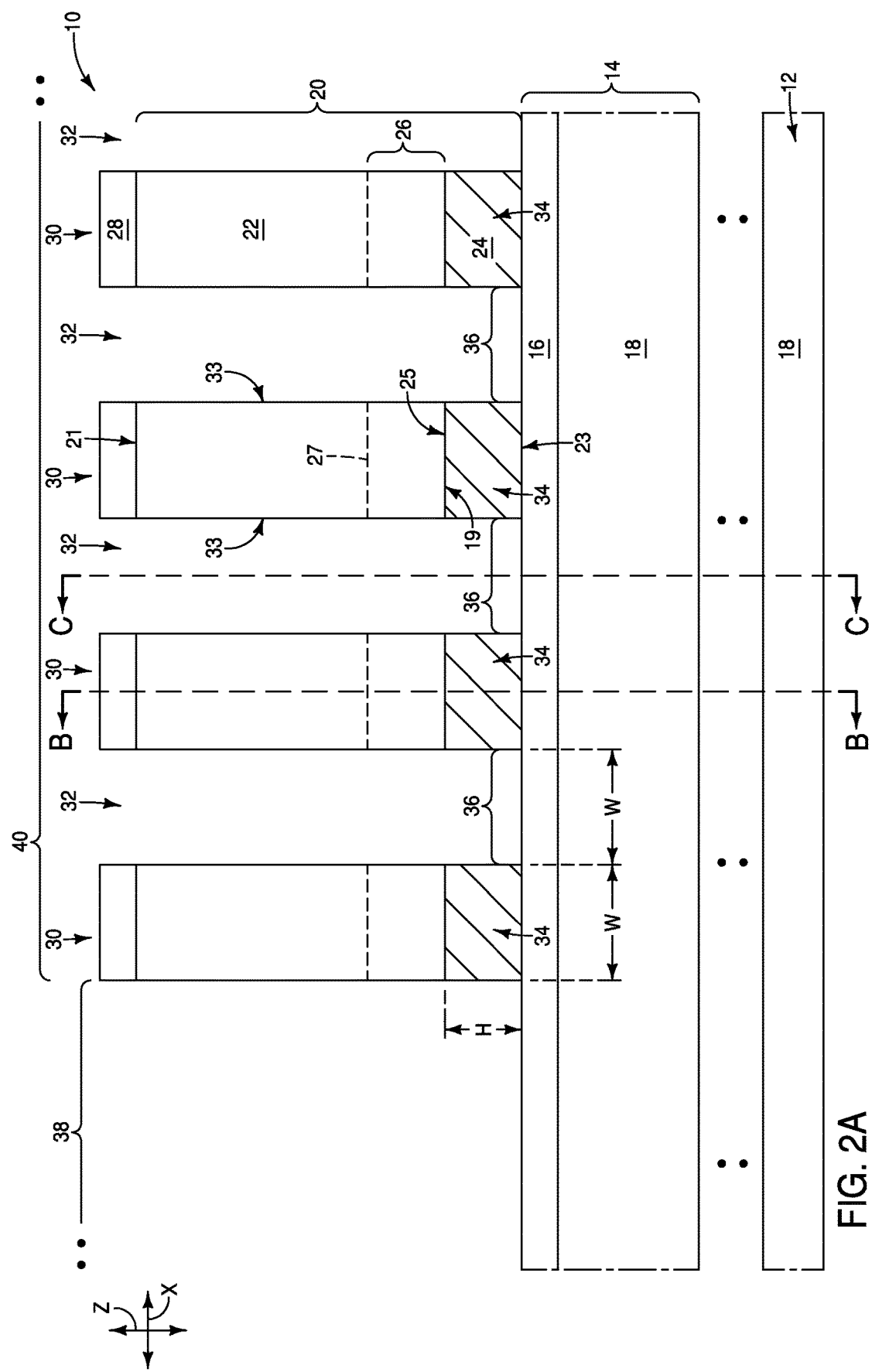
FIG. 2A is a diagrammatic cross-sectional view along the line A-A of FIG. 2.
Figure 2B:
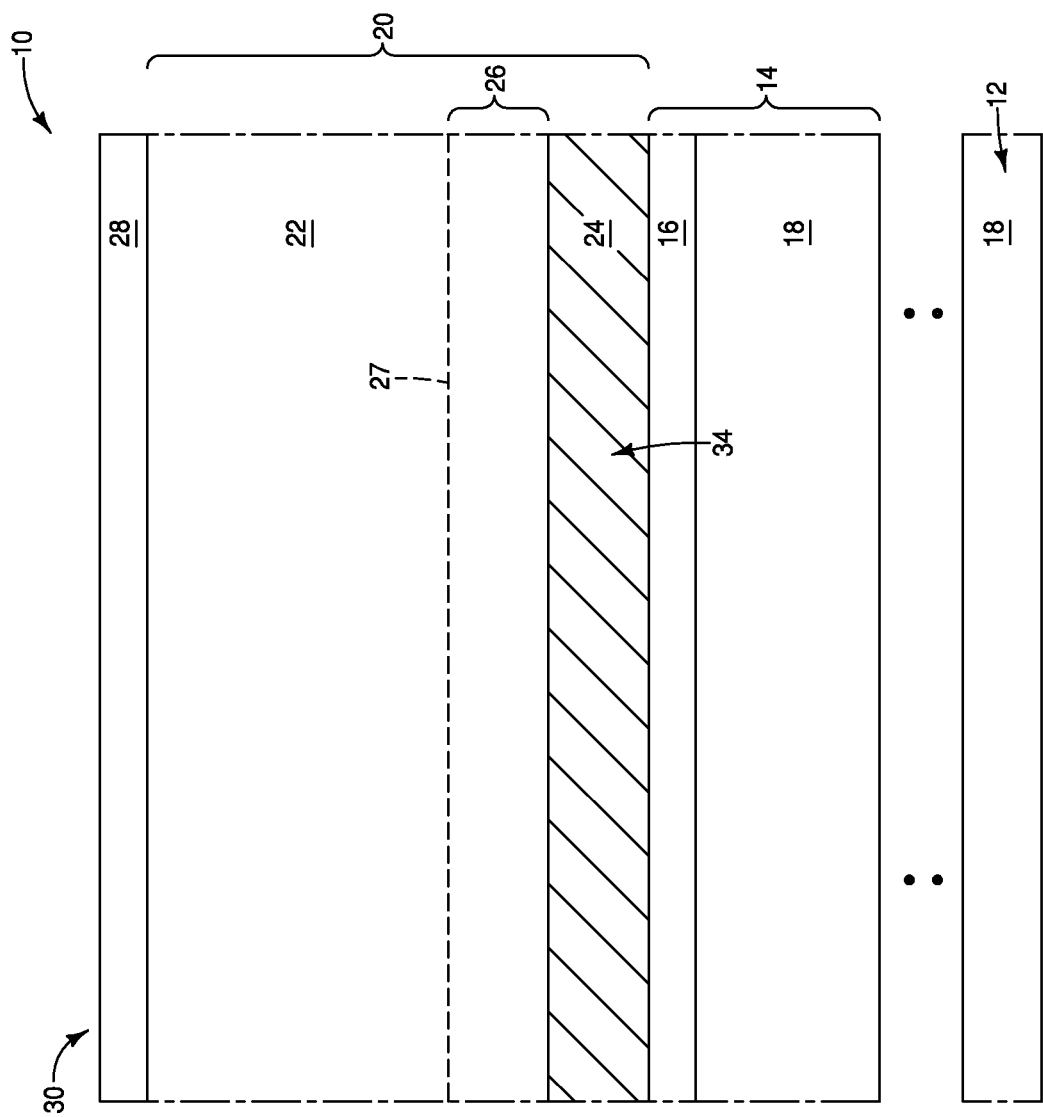
Figure 2C:
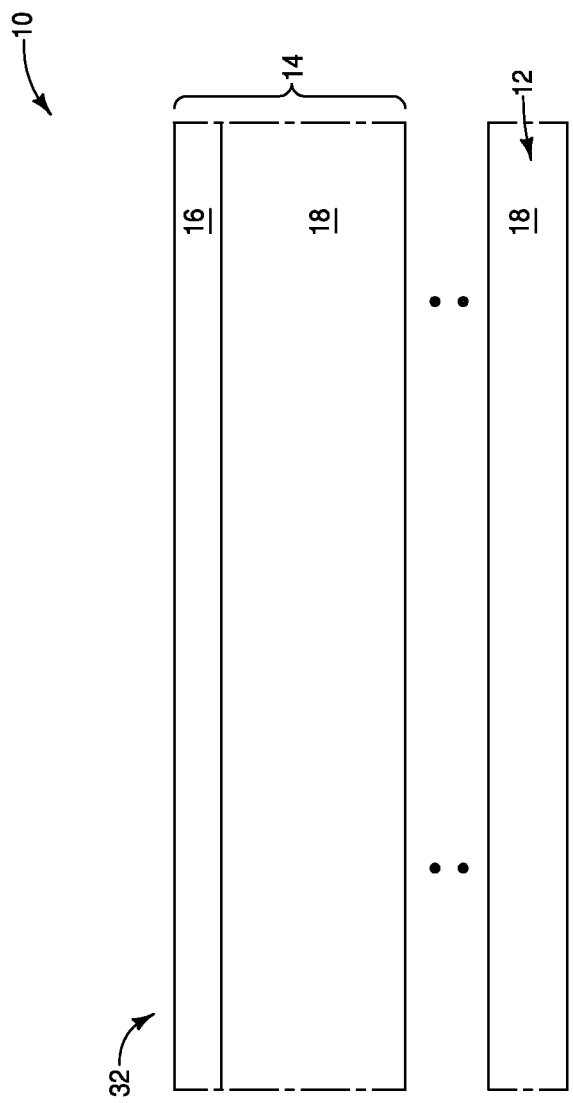

Referring to FIGS. 2-2C, the stack 20 is patterned into rails 30 which extend laterally along a first direction (i.e., a y-axis direction, with the y-axis being shown in FIGS. 2, 2B and 2C). The rails are spaced from one another by trenches 32. The trenches 32 may be referred to as first trenches to distinguish them from other trenches formed at subsequent process stages.

The rails 30 extend vertically along a z-axis direction, with the z-axis being shown in FIGS. 2A-2C. Each of the rails has a top surface corresponding to the top surface 21 of the semiconductor material 22, and has a bottom surface corresponding to the bottom surface 23 of the digit line material 24. Each of the rails has sidewall surfaces 33 extending from the top surfaces 21 to the bottom surfaces 23. The individual rails are capped by caps of the protective capping material 28.

The patterned digit line material 24 within the rails 30 is configured as digit lines 34; with such digit lines extending laterally along the first direction (i.e., the y-axis direction).

The rails 30 may be formed with any suitable processing. For instance, in some embodiments a patterned mask (e.g., a photolithographically-patterned photoresist mask) may be provided to define locations of the rails 30 and the trenches 32; one or more etches may be utilized to transfer a pattern from the patterned mask into materials under the mask to thereby form the rails 30 and trenches 32; and then the mask may be removed to leave the construction of FIGS. 2-2C.

Each of the digit lines 34 has a width W along the cross-section of FIG. 2A. Such width may be referred to as a first width. The cross-section of FIG. 2A is orthogonal to the first direction of the y-axis, and extends along an x-axis. The orthogonal relationship of the x and y axes is shown in FIG. 2.

Each of the digit lines 34 has a height H from the top of the insulative material 16 to the upper surface 25. In some embodiments, such height may be referred to as a first height.

The trenches 32 may be considered to include intervening regions 36 between the digit lines 34. In the shown embodiment, such intervening regions also have the first width W along the cross-section of FIG. 2A. In the shown embodiment, each of the trenches has a uniform width W from the bottom surfaces 23 of the digit lines 34 to the top surfaces 21 of the rails 30, and even to the top surfaces of the capping material 28. In other embodiments, the widths of the intervening regions 36 may be different than the widths of the digit lines, but the trenches may still be of uniform width from the bottom surfaces of the digit lines to the top surfaces of the rails.

FIGS. 2 and 2A show an edge region 38 along one side of the patterned rails 30. In some embodiments, the rails 30 are patterned into components of a memory array, and accordingly are within a memory array region 40. In such embodiments, the edge region 38 may be utilized to illustrate processing along a peripheral edge of the memory array region 40.

Figure 3A:
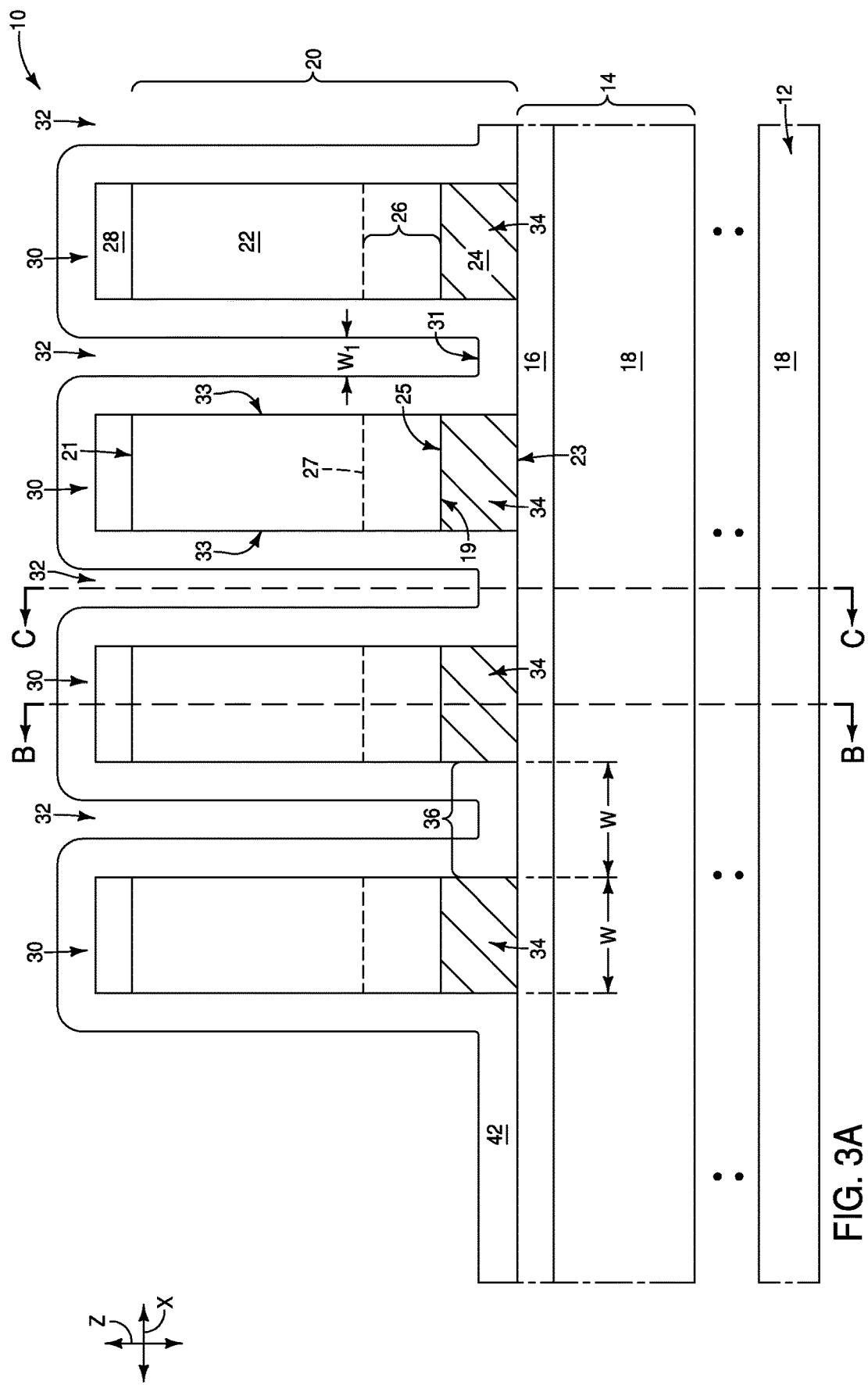
FIG. 3A is a diagrammatic cross-sectional view along the line A-A of FIG. 3.
Figure 3B:
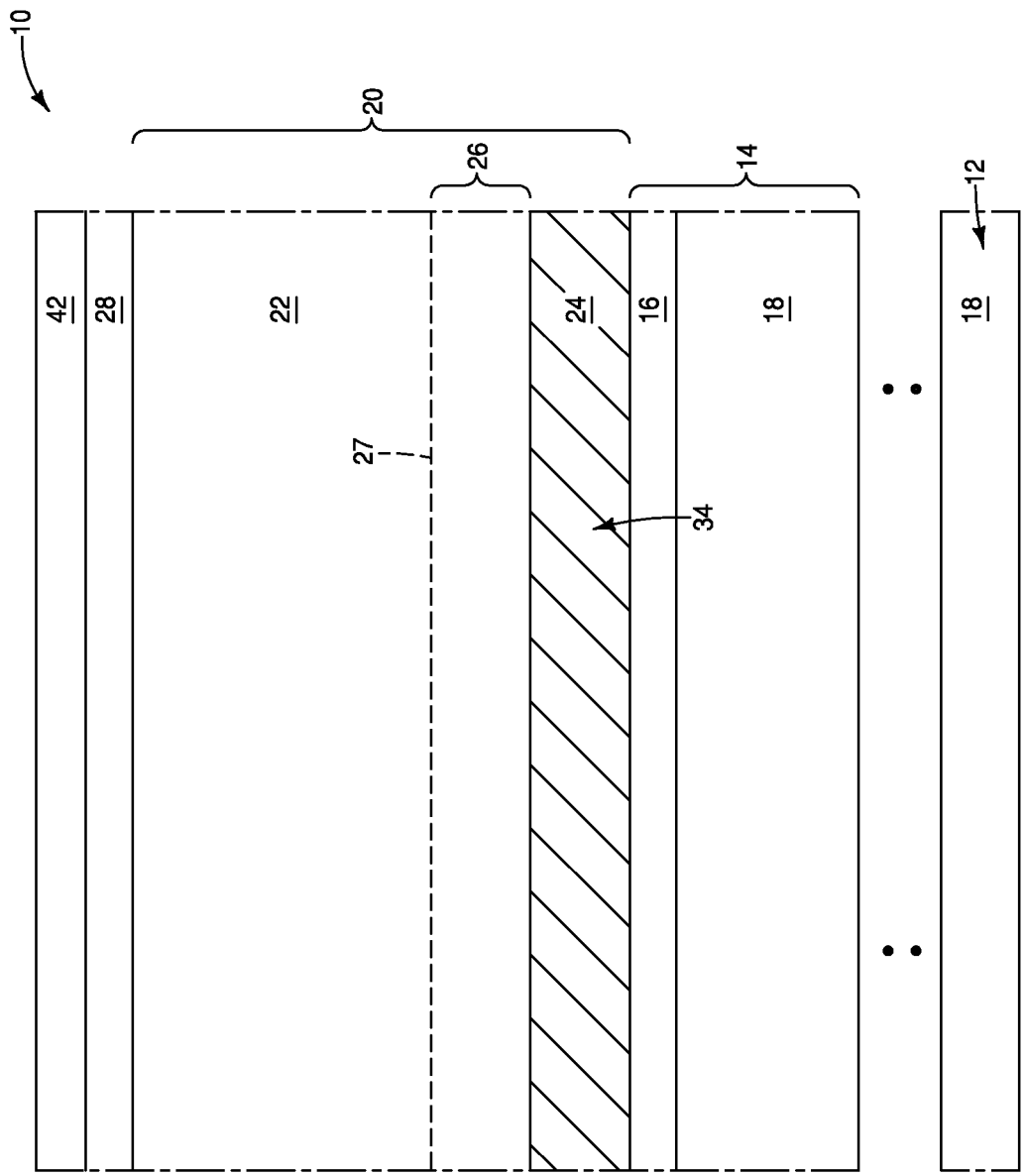
Figure 3C:
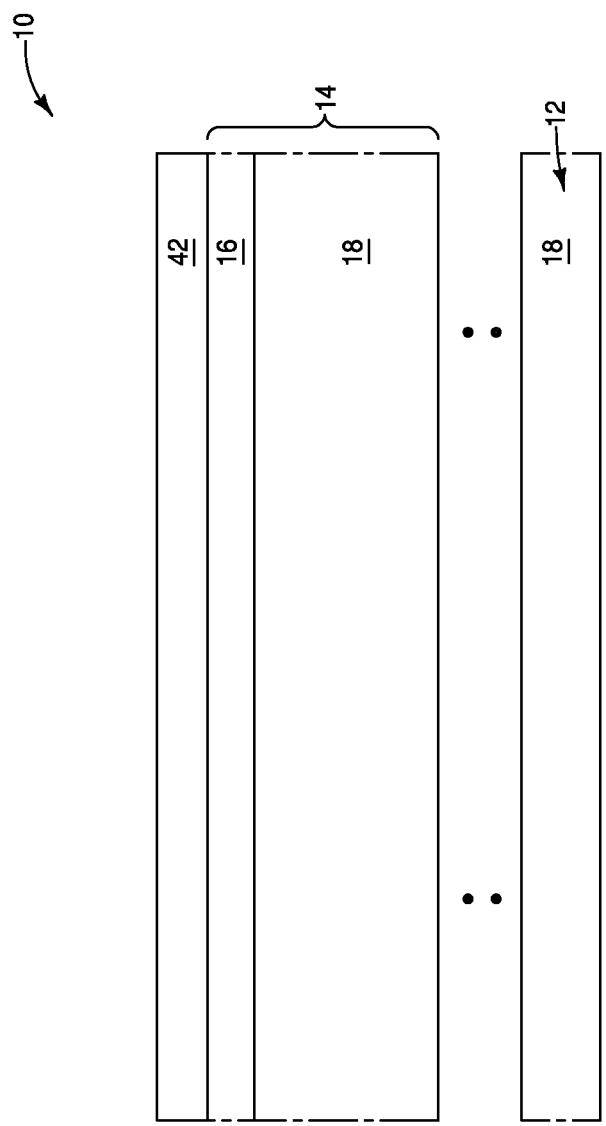

Referring to FIGS. 3-3C, insulative material 42 is formed to cover the top surfaces 21 and sidewall surfaces 33 of the rails 30. The insulative material 42 narrows the trenches 32.

The insulative material 42 may comprise any suitable composition(s); and in some embodiments may comprise silicon dioxide (e.g., silicon dioxide deposited utilizing tetraethylorthosilicate, TEOS); porous silicon oxide, carbon-doped silicon dioxide, etc. The insulative material 42 may be formed with any suitable processing, including, for example, atomic layer deposition, chemical vapor deposition, etc.

The narrowed trenches 32 have a uniform width $W_1$ from the top surfaces 21 of the semiconductor material 22 to bottom surfaces 31 of the trenches 32. In some embodiments, the width $W_1$ may be referred to as second width to distinguish it from the first width W of the digit lines 34 and intervening regions 36. In some embodiments, the second width $W_1$ may be less than or equal to about one-half of the first width W, less than or equal to about one-third of the first width W, etc.

Figure 4:
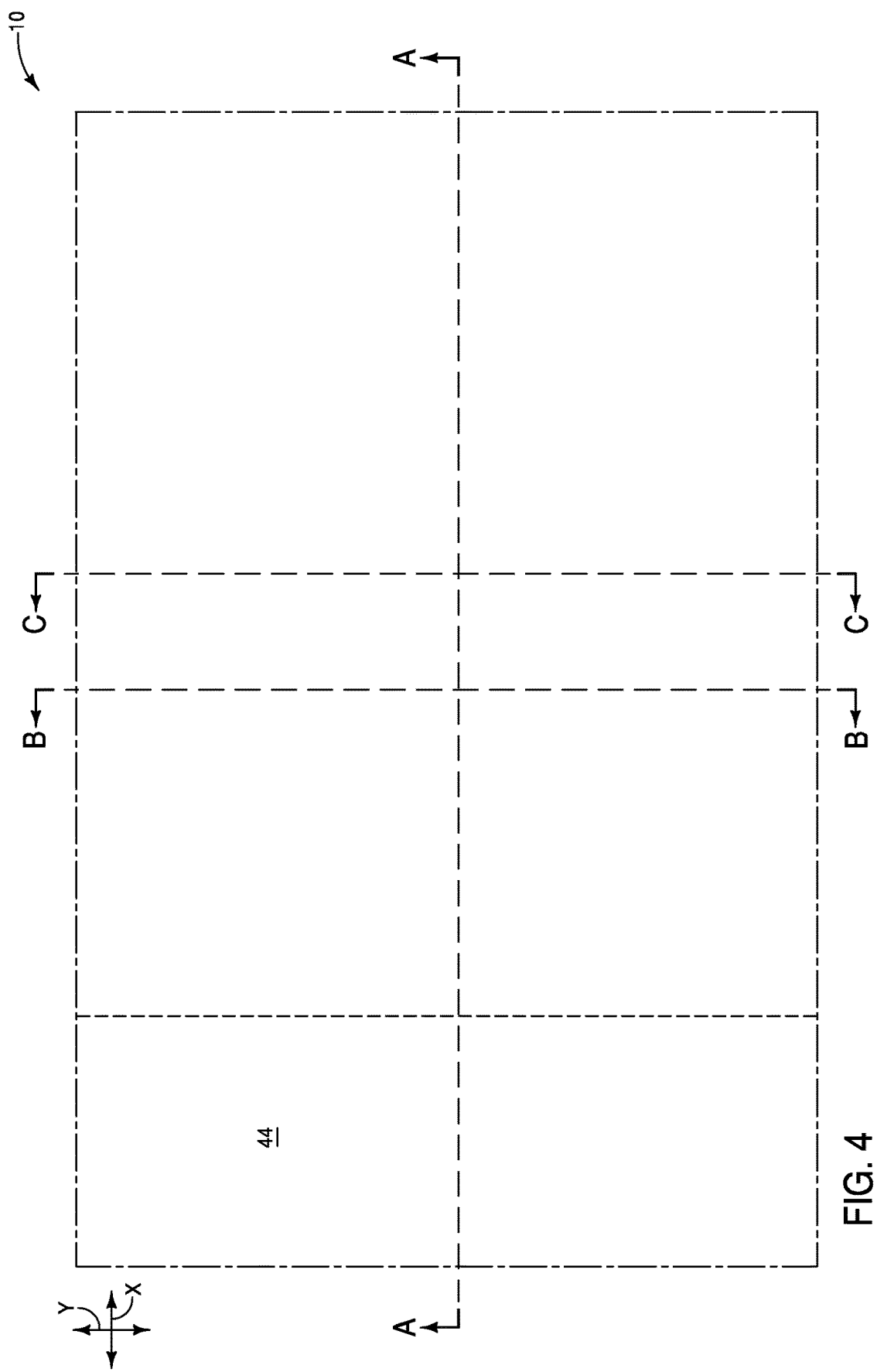
FIGS. 4-4C are diagrammatic views of the region of the example construction of FIGS. 1-1C at an example processing stage subsequent to that of FIGS. 3-3C.
Figure 4A:
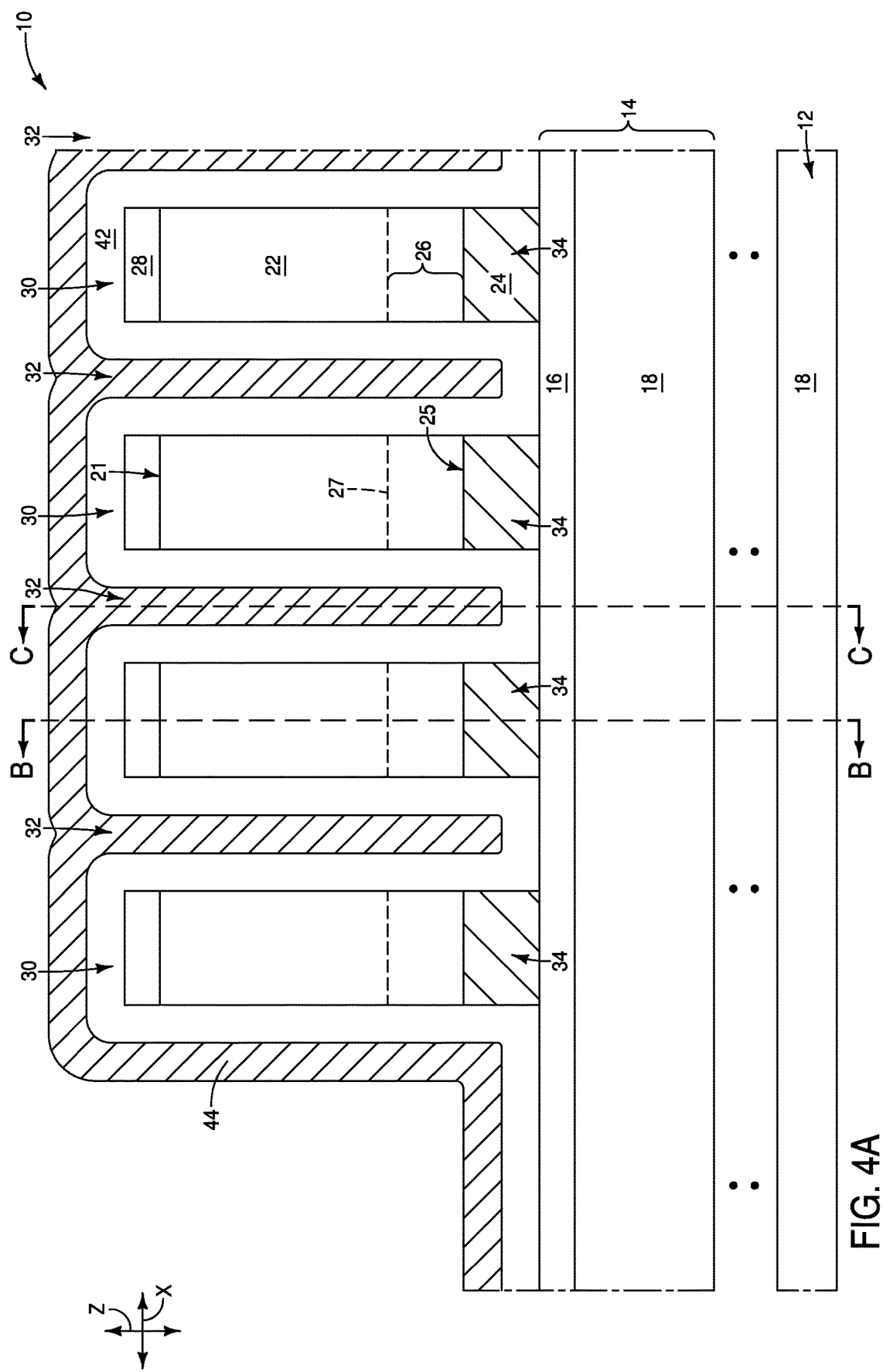
FIG. 4A is a diagrammatic cross-sectional view along the line A-A of FIG. 4.
Figure 4B:
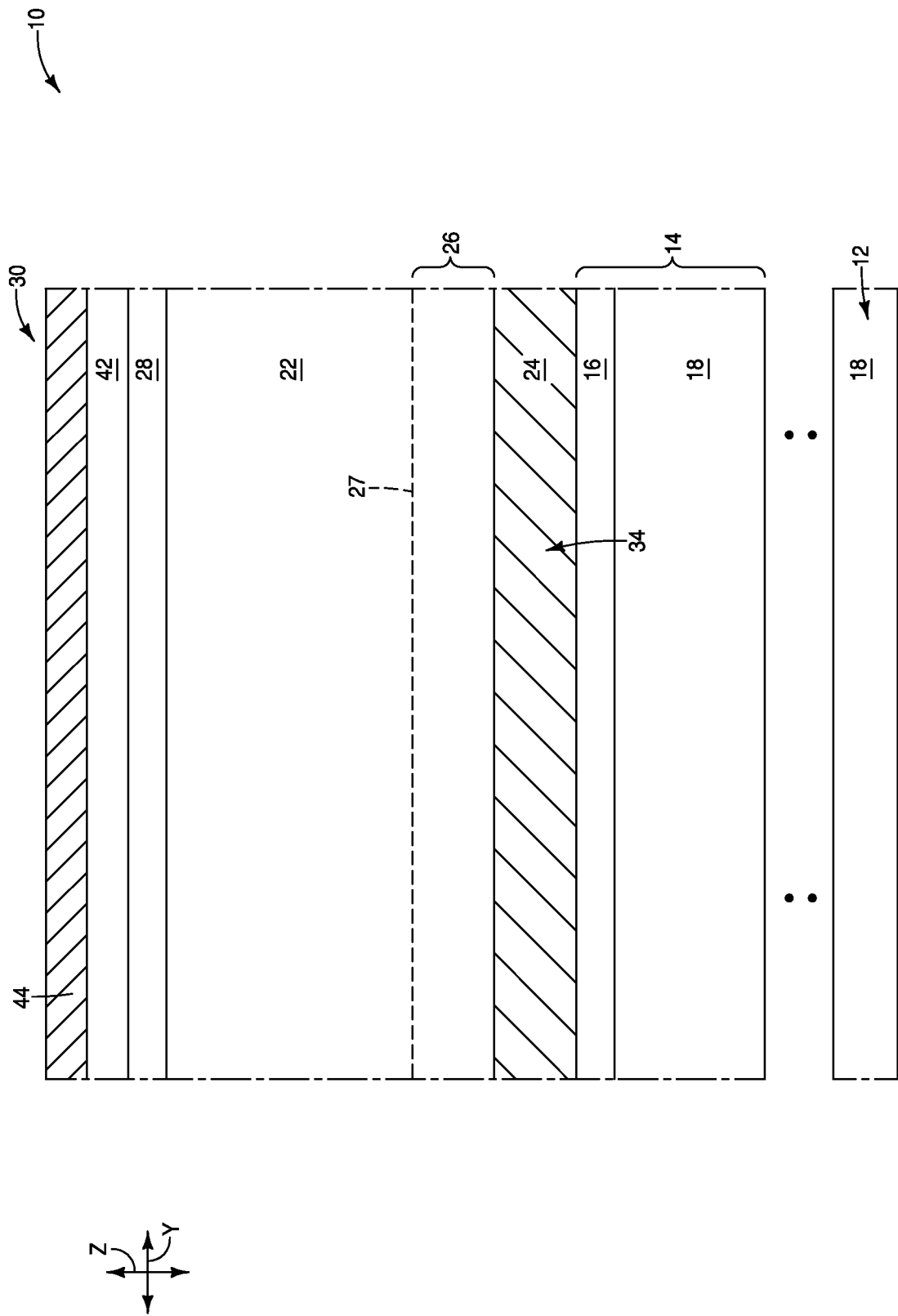
Figure 4C:
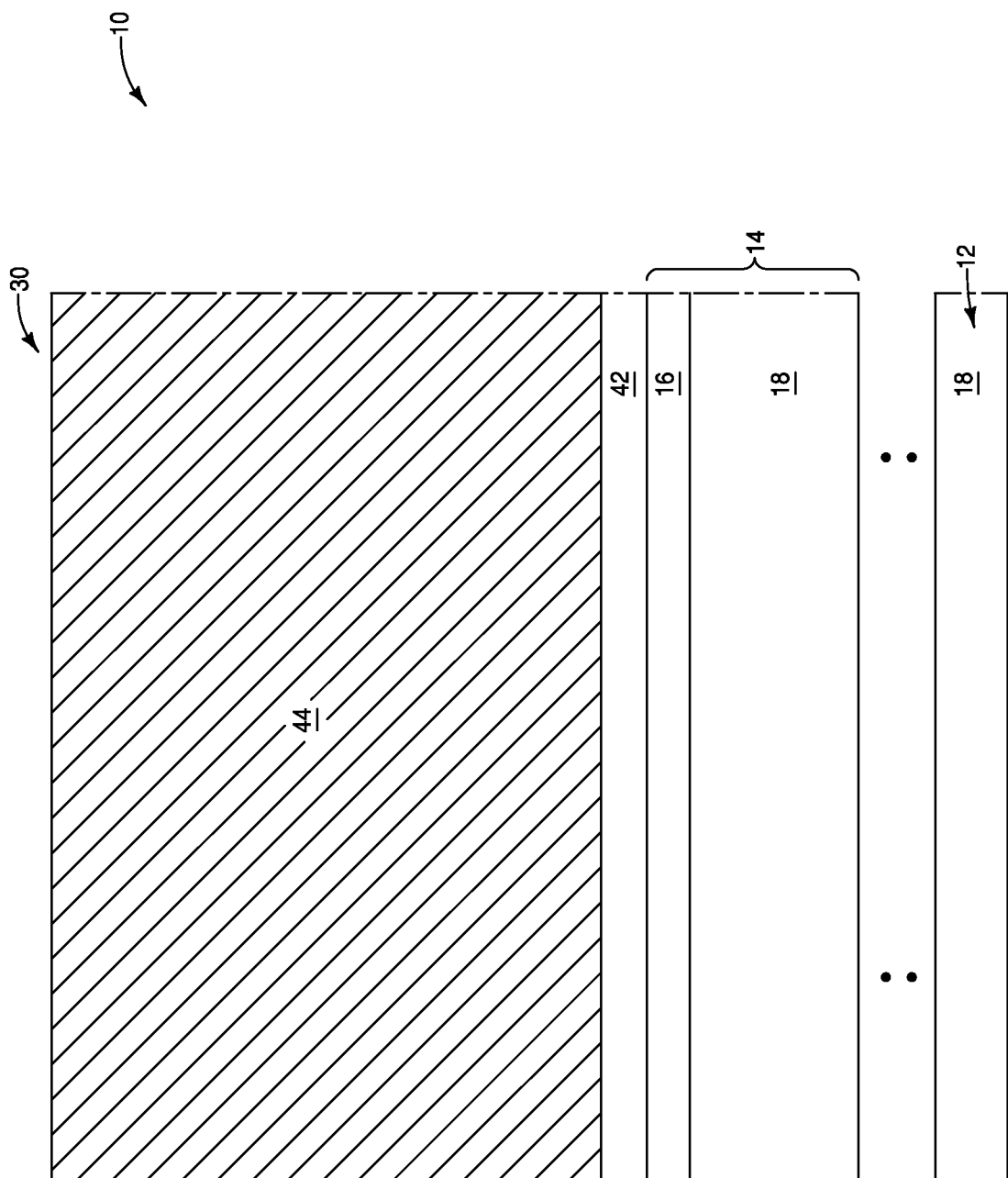

Referring to FIGS. 4-4C, conductive shield material 44 is formed within the narrowed trenches 32. The conductive shield material 44 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon (e.g., polycrystalline silicon), conductively-doped germanium, etc.). In some embodiments, the conductive shield material 44 may be referred to as a second conductive material to distinguish it from the first conductive material 24 utilized as the digit line material. The shield material 44 may comprise a same composition as the digit line material 24 in some embodiments, or may comprise a different composition than the digit line material 24. In some embodiments, the shield material 44 may comprise one or more metals and/or metal-containing materials; and may, for example, comprise one or more of titanium nitride, tantalum nitride, tungsten, tantalum, ruthenium, etc.

In the illustrated embodiment, the conductive shield material 44 fills the narrowed trenches 32. In some embodiments, the shield material 44 may be considered to substantially fill the narrowed trenches 32; with the term "substantially fill" meaning that the shield material 44 fills the trenches to at least a level of the top surfaces 21 of the semiconductor material 22 within the rails 30.

Figure 5:
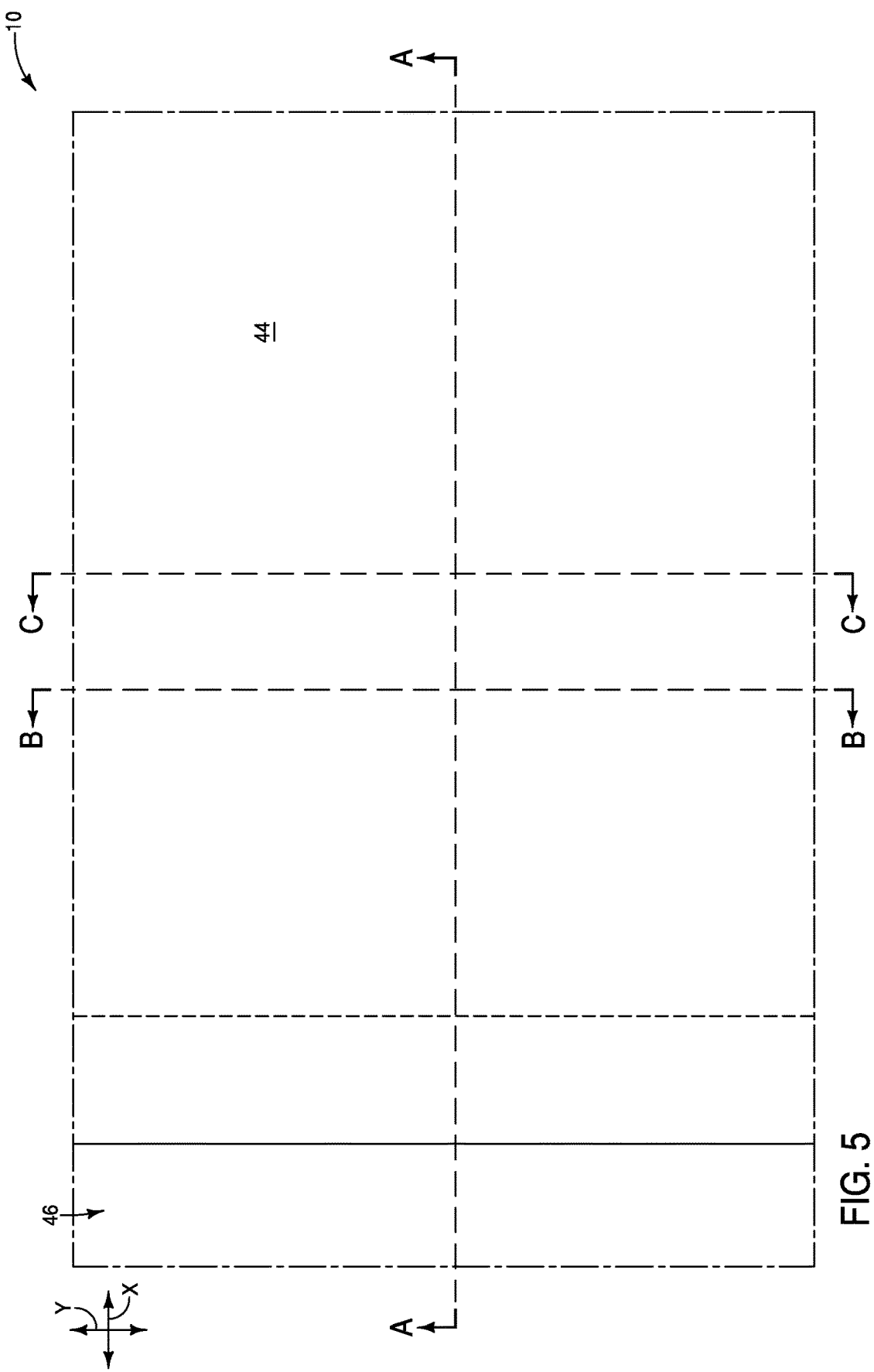
FIGS. 5-5C are diagrammatic views of the region of the example construction of FIGS. 1-1C at an example processing stage subsequent to that of FIGS. 4-4C.
Figure 5A:
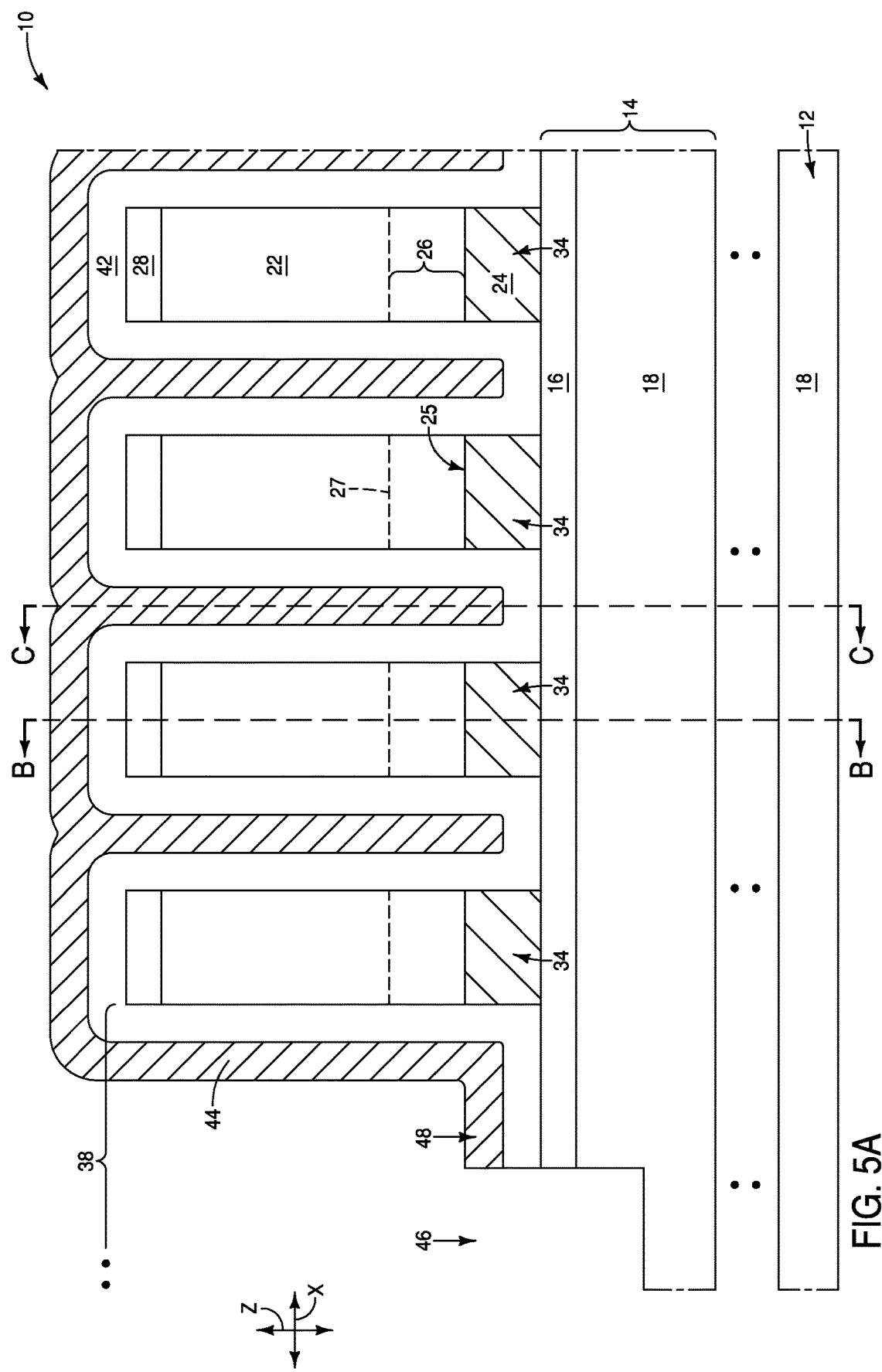
FIG. 5A is a diagrammatic cross-sectional view along the line A-A of FIG. 5.
Figure 5B:
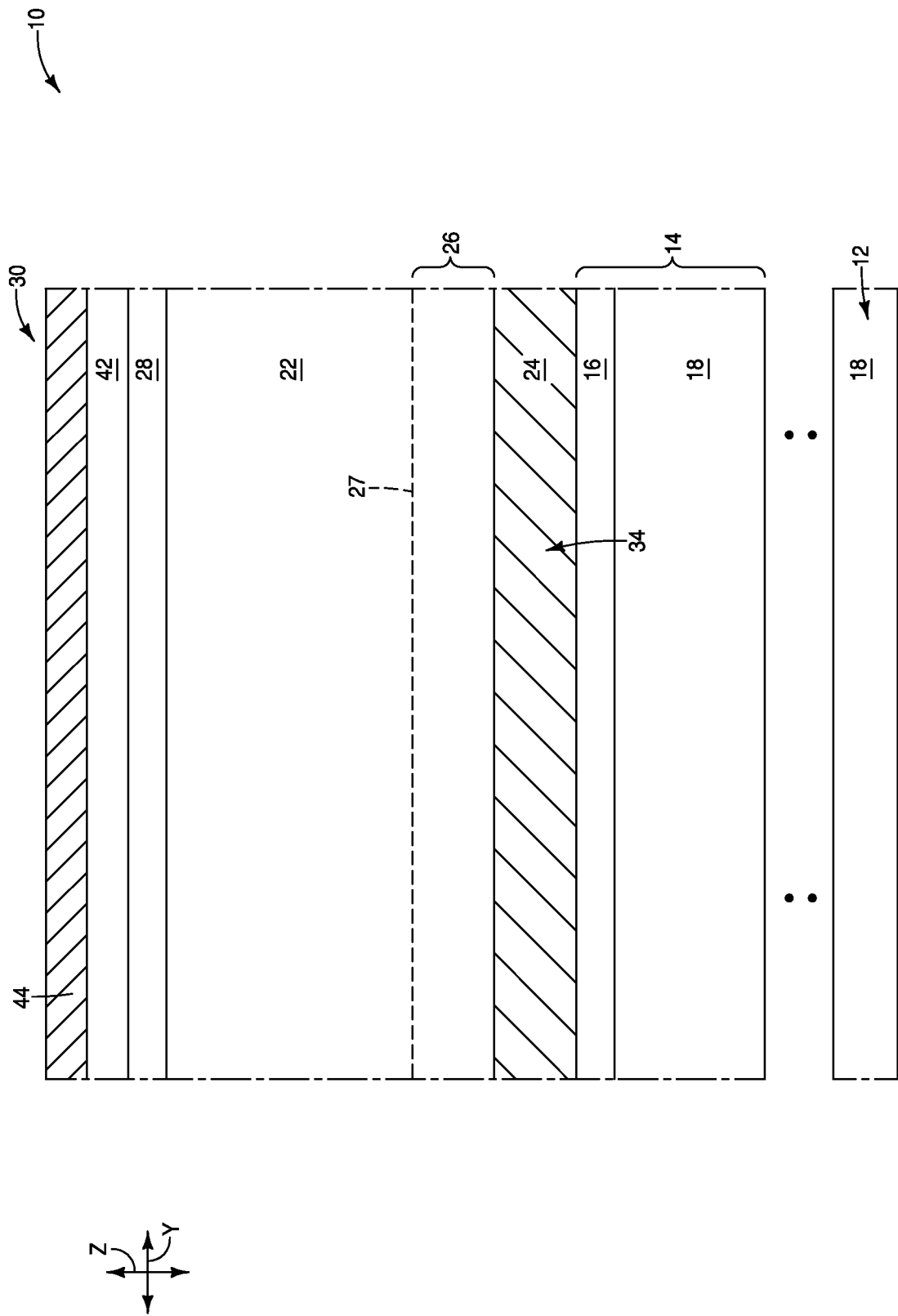
Figure 5C:
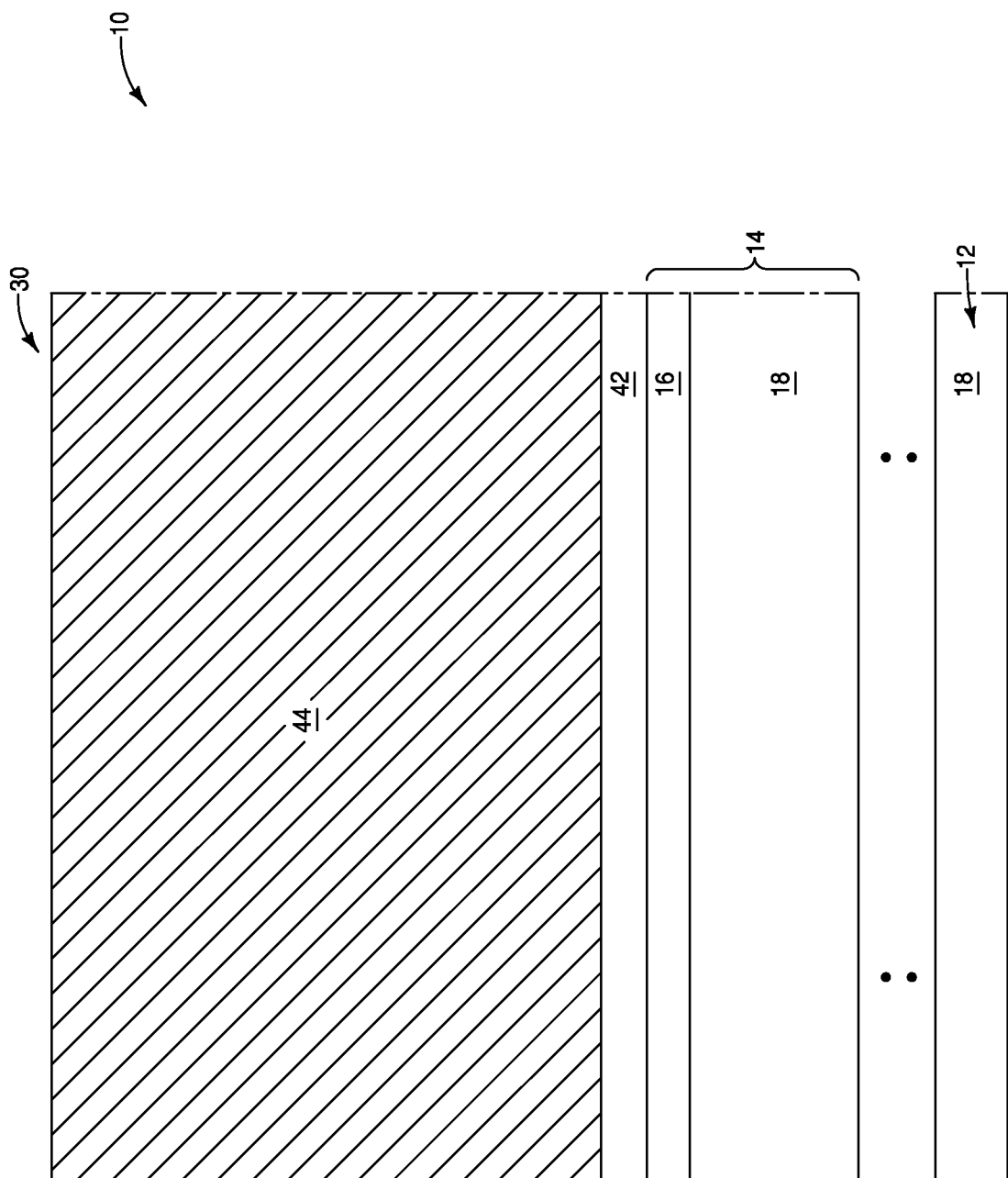

Referring to FIGS. 5-5C, an optional chop-cut is utilized to punch through the shield material 44 along the edge region 38 and thereby form a recessed region 46. The shield material 48 adjacent the recessed region 46 may be considered to include a horizontally-extending ledge region 48.

Figure 6:
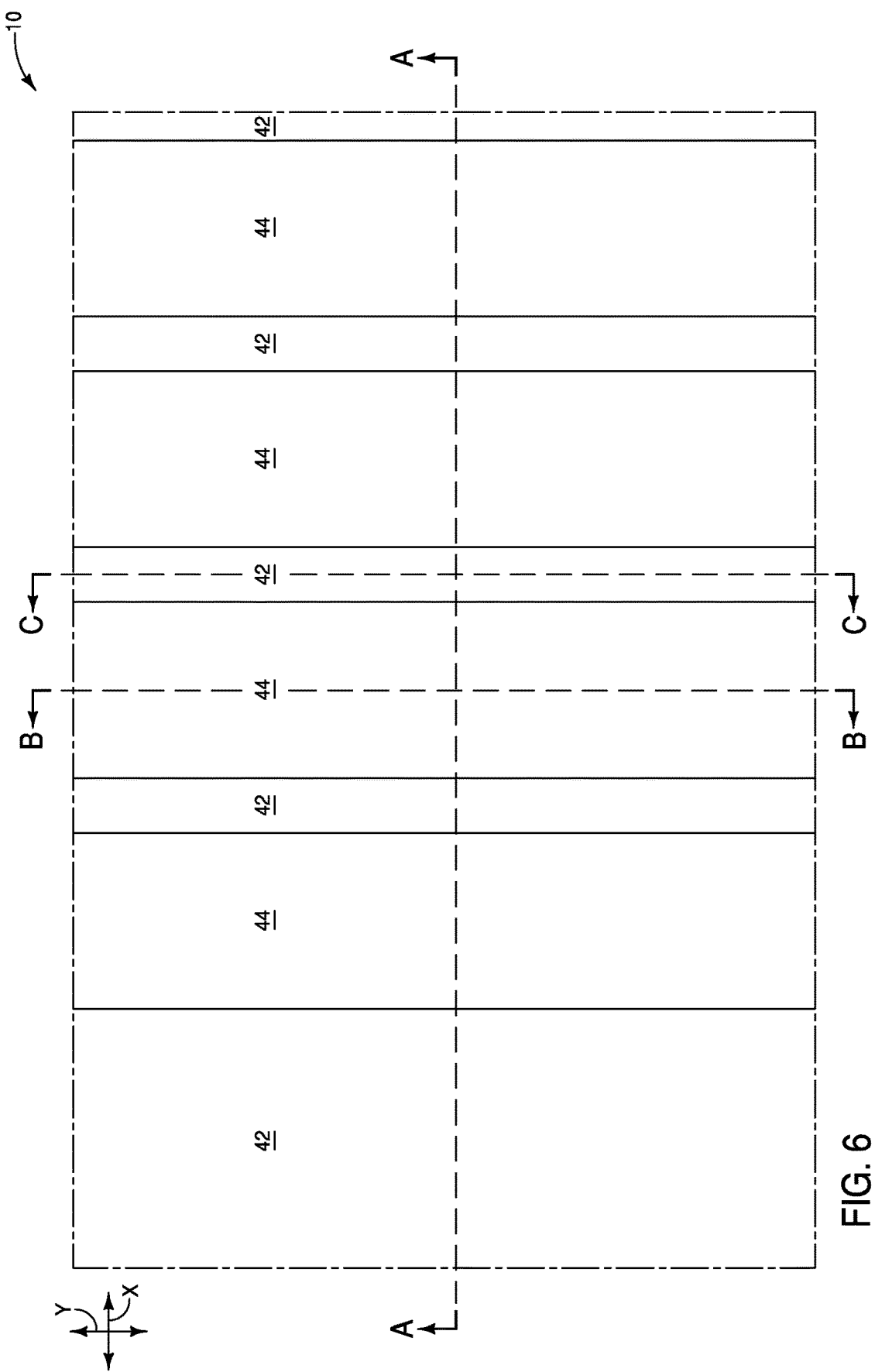
FIGS. 6-6C are diagrammatic views of the region of the example construction of FIGS. 1-1C at an example processing stage subsequent to that of FIGS. 5-5C.
Figure 6A:
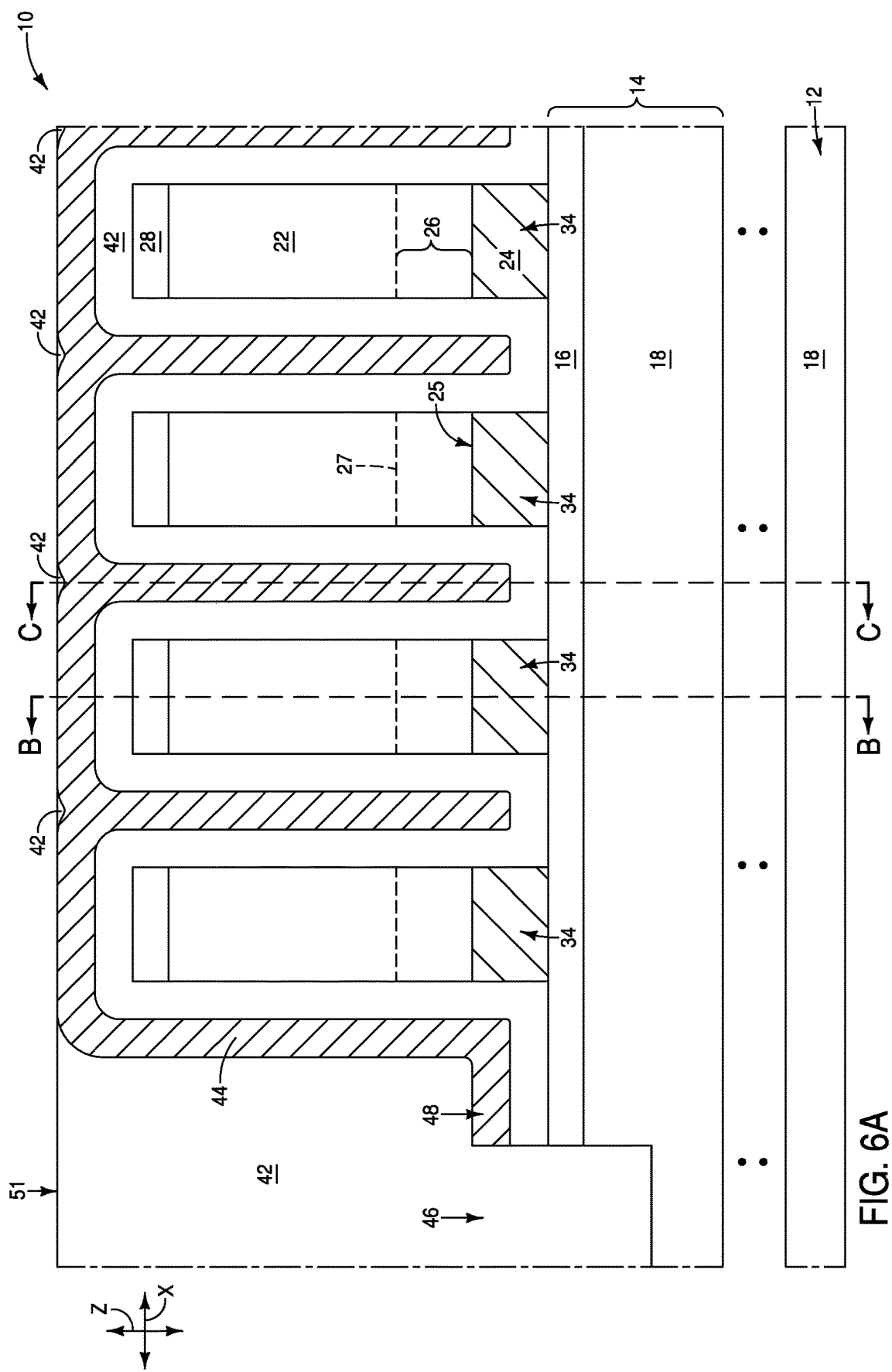
FIG. 6A is a diagrammatic cross-sectional view along the line A-A of FIG. 6.
Figure 6B:
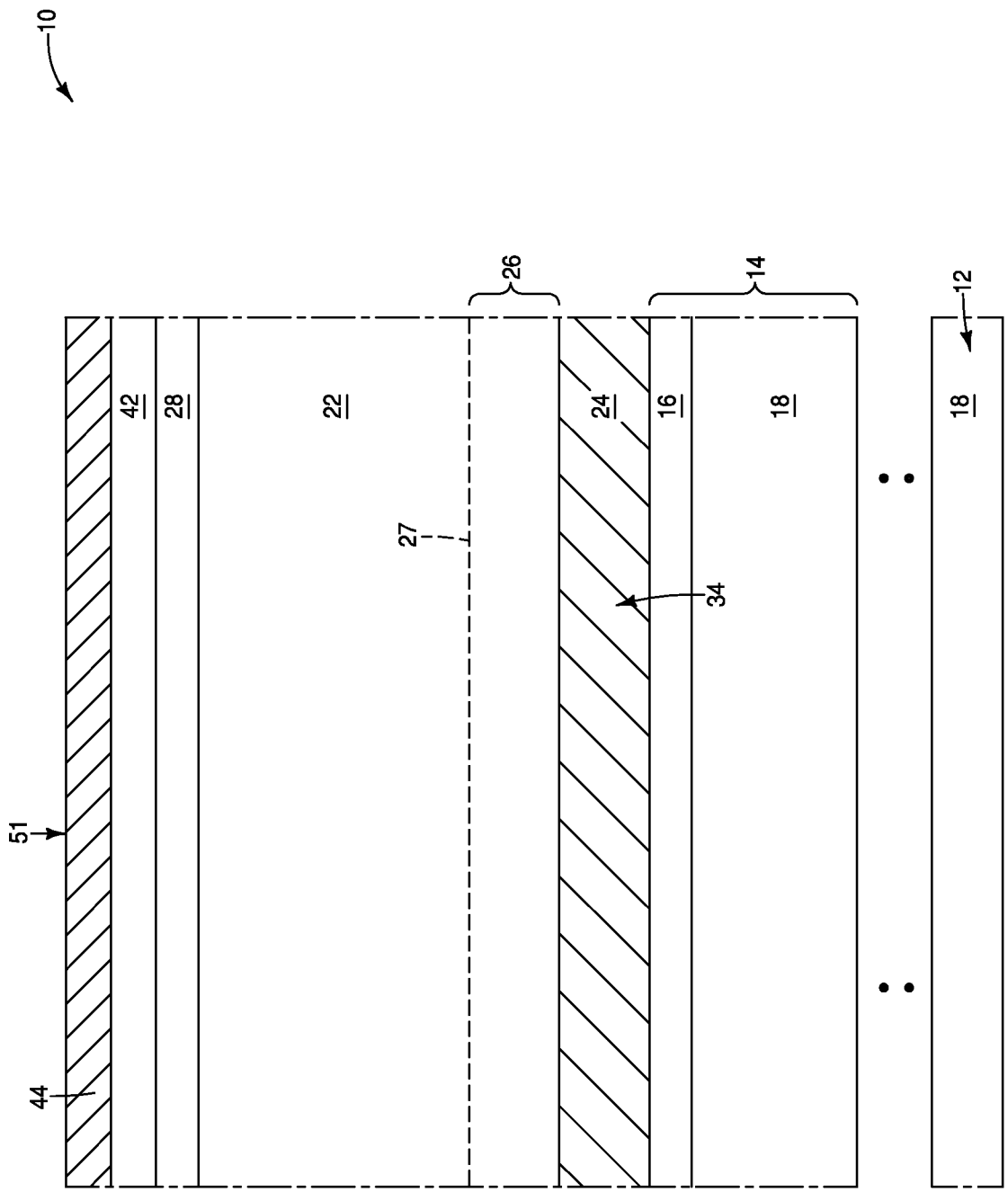
Figure 6C:
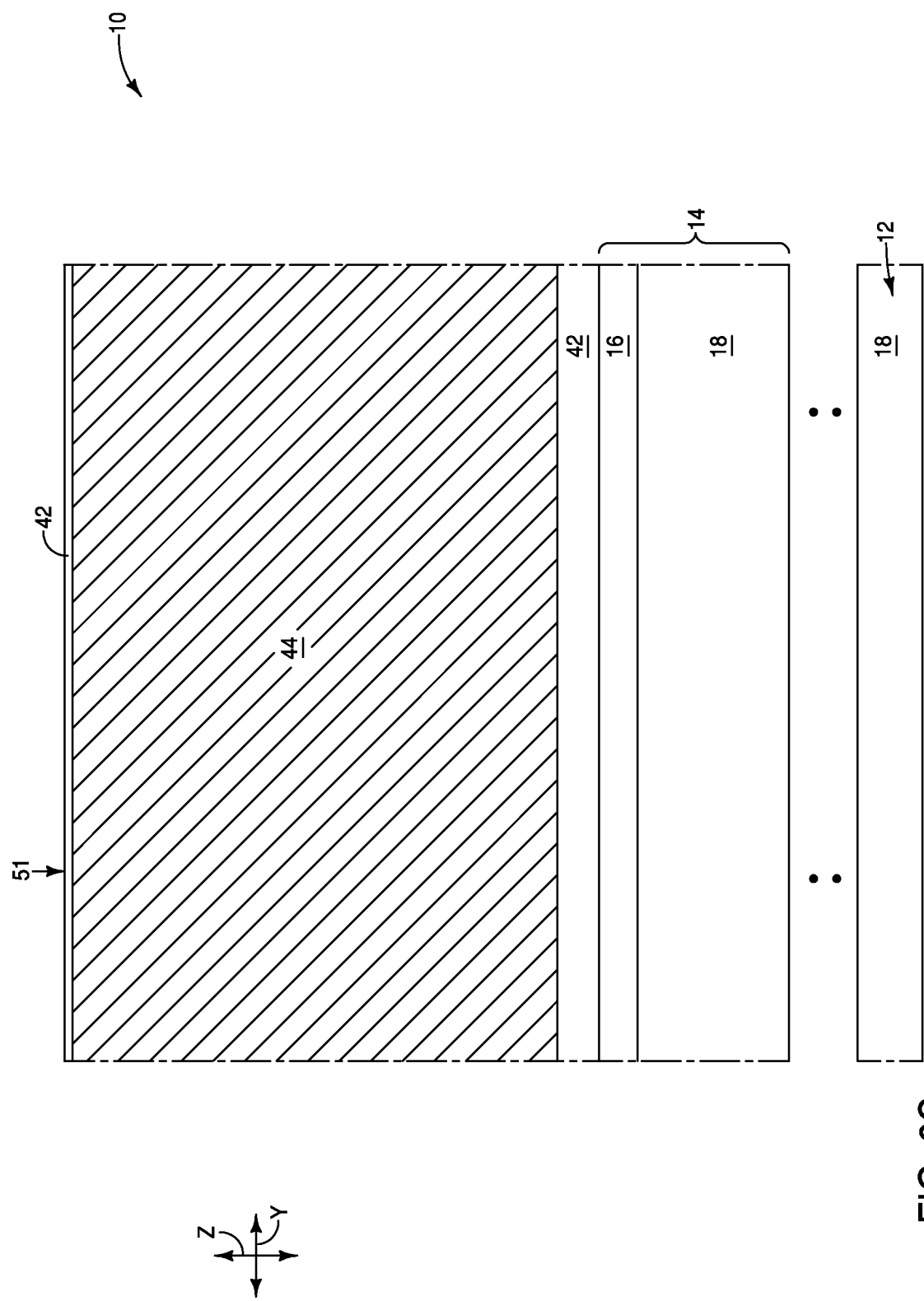

Referring to FIGS. 6-6C, additional insulative material 42 is formed over the shield material 44 and within the recessed region 46. The additional insulative material 42 may comprise any suitable composition(s); and in some embodiments may comprise silicon dioxide. The silicon dioxide may be formed with a spin-on-dielectric (SOD) process. In the shown embodiment, a planarized upper surface 51 extends across the materials 44 and 42. Such planarized upper surface may be formed with an suitable processing; such as, for example, chemical-mechanical processing (CMP).

Figure 7:
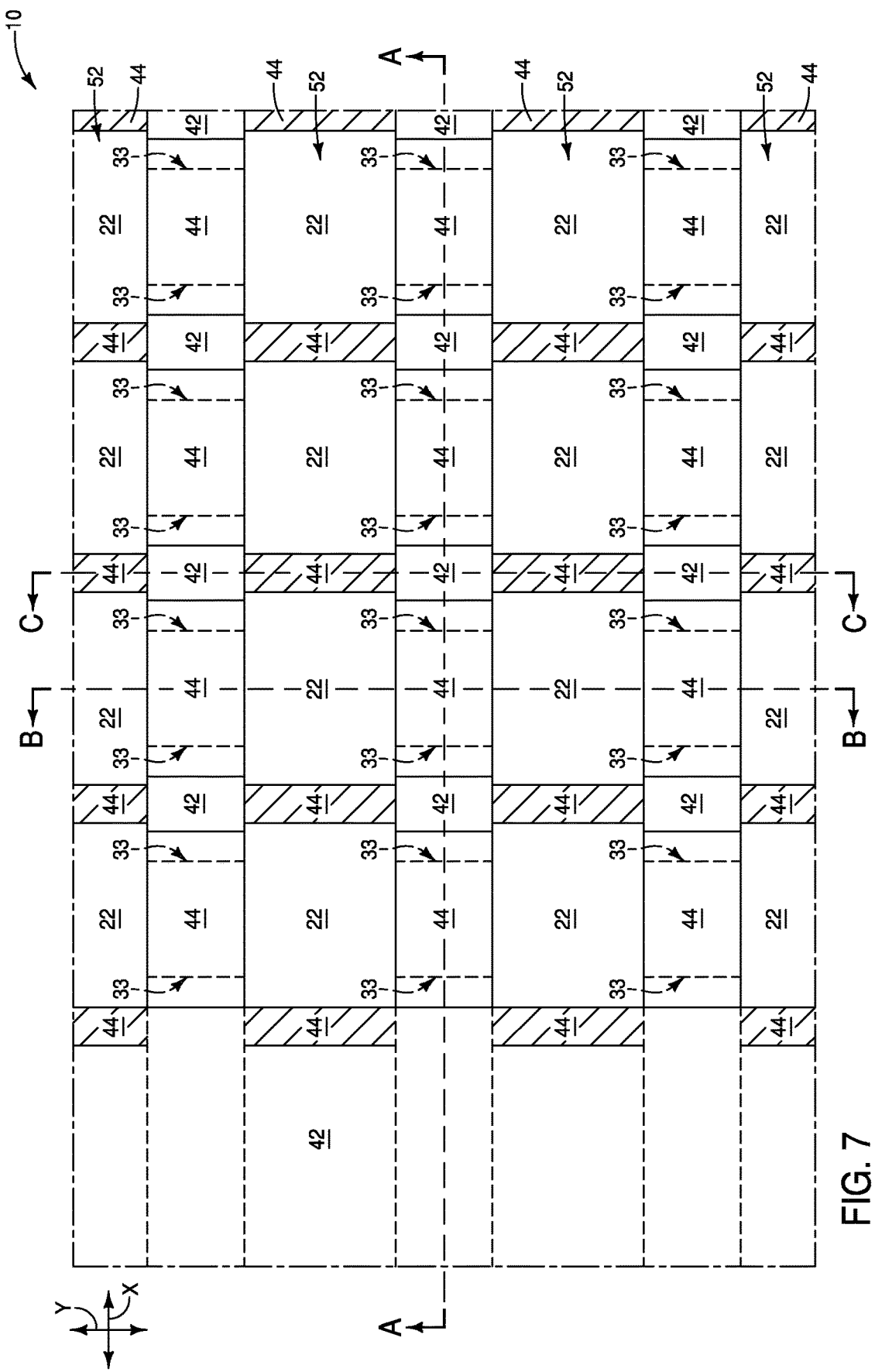
FIGS. 7-7C are diagrammatic views of the region of the example construction of FIGS. 1-1C at an example processing stage subsequent to that of FIGS. 6-6C.
Figure 7A:
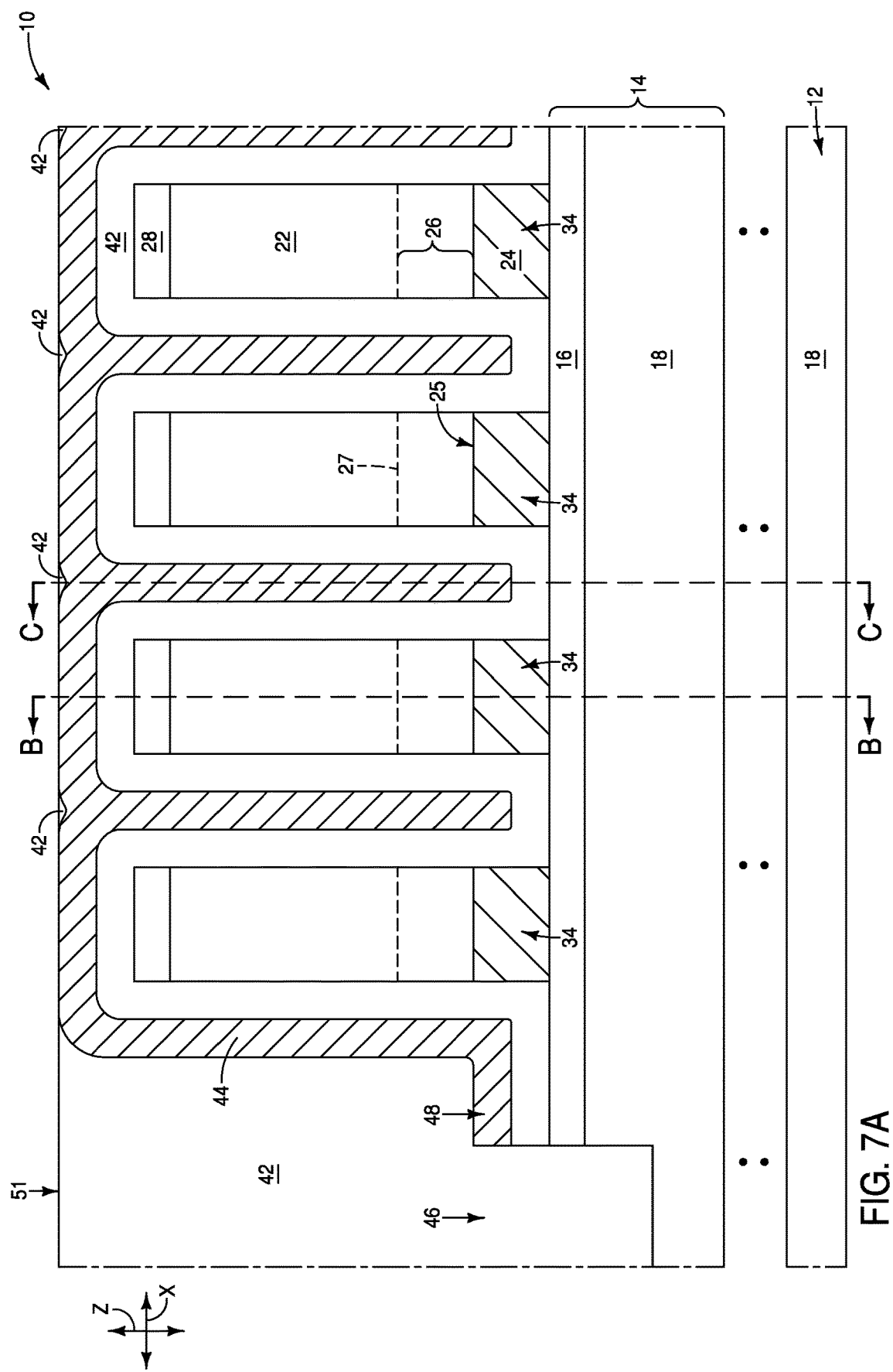
FIG. 7A is a diagrammatic cross-sectional view along the line A-A of FIG. 7.
Figure 7B:
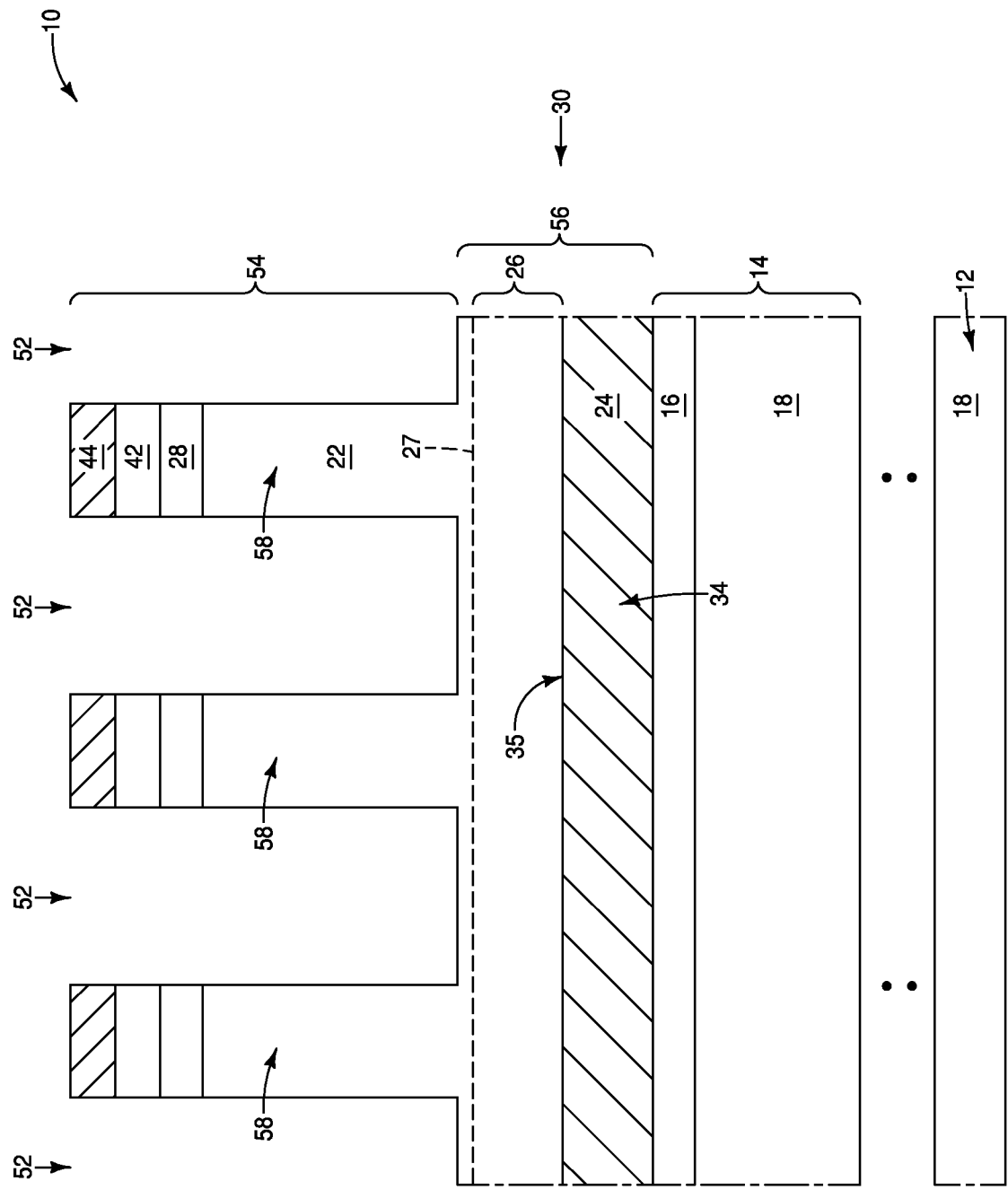
Figure 7C:
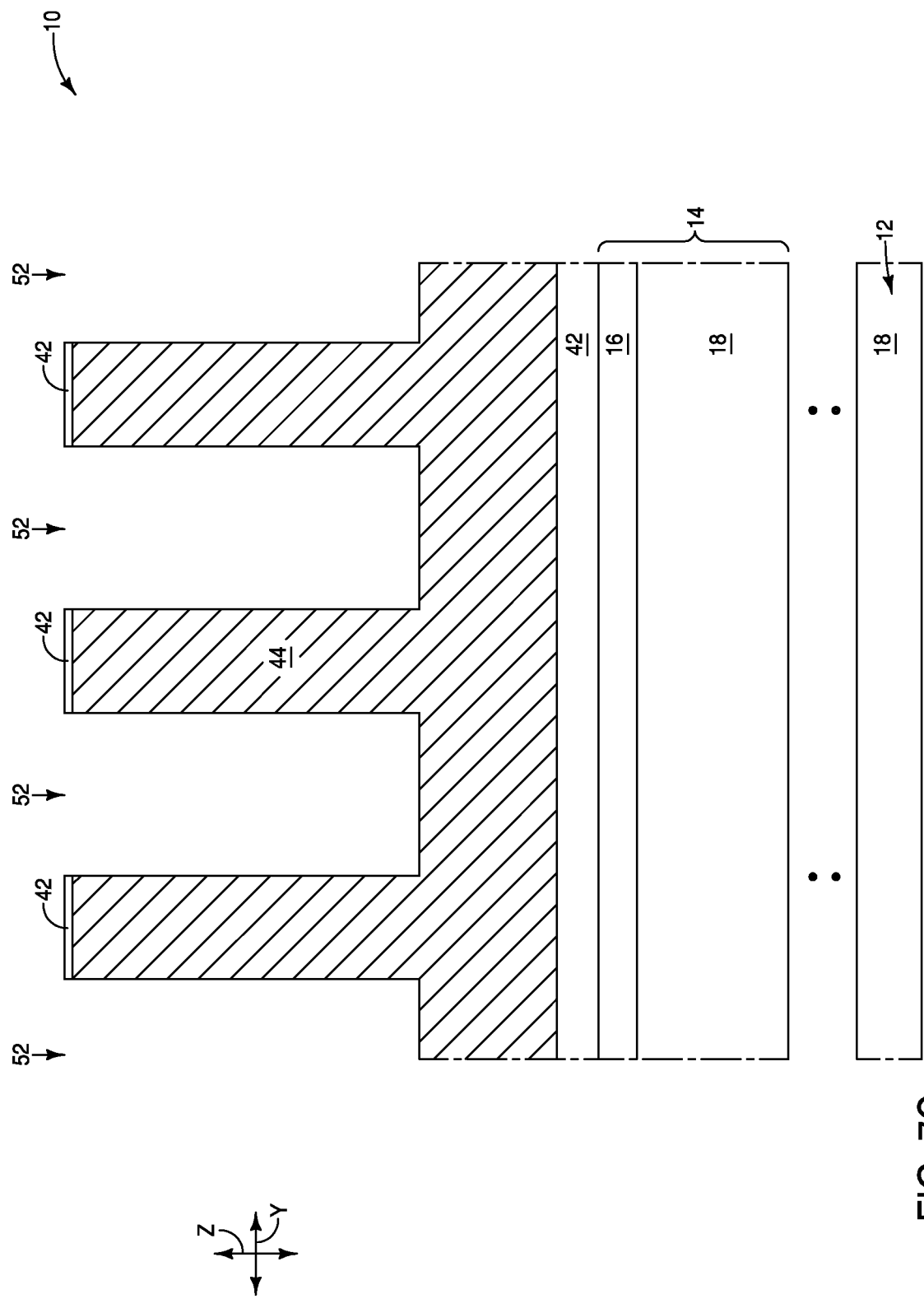

Referring to FIGS. 7-7C, second trenches 52 are formed to extend along a second direction (i.e., the x-axis direction). The second direction of the second trenches 52 crosses the first direction (i.e., the y-axis direction); and accordingly crosses the direction of the first trenches 32 (shown in FIGS. 2-2C). In the shown embodiment, the second direction of the second trenches 52 is substantially orthogonal to the first direction of the first trenches 32.

The second trenches 52 pattern upper regions 54 of the rails 30, and do not pattern lower regions 56 of the rails (as shown in FIG. 7B); and the digit lines 34 remain within the unpatterned lower regions 56 of the rails. The second trenches 52 also extend into the conductive shield material 44 (as shown in FIG. 7C).

The patterned upper regions 54 include vertically-extending pillars 58 of the semiconductor material 22, with such pillars being over the digit lines 34.

The pillars 58 have the sidewall surfaces 33 patterned with the first trenches 30 (with such sidewall surfaces 33 being described above with reference to FIGS. 2-2C). The sidewall surfaces 33 are indicated diagrammatically with dashed lines in the top view of FIG. 7.

Figure 8:
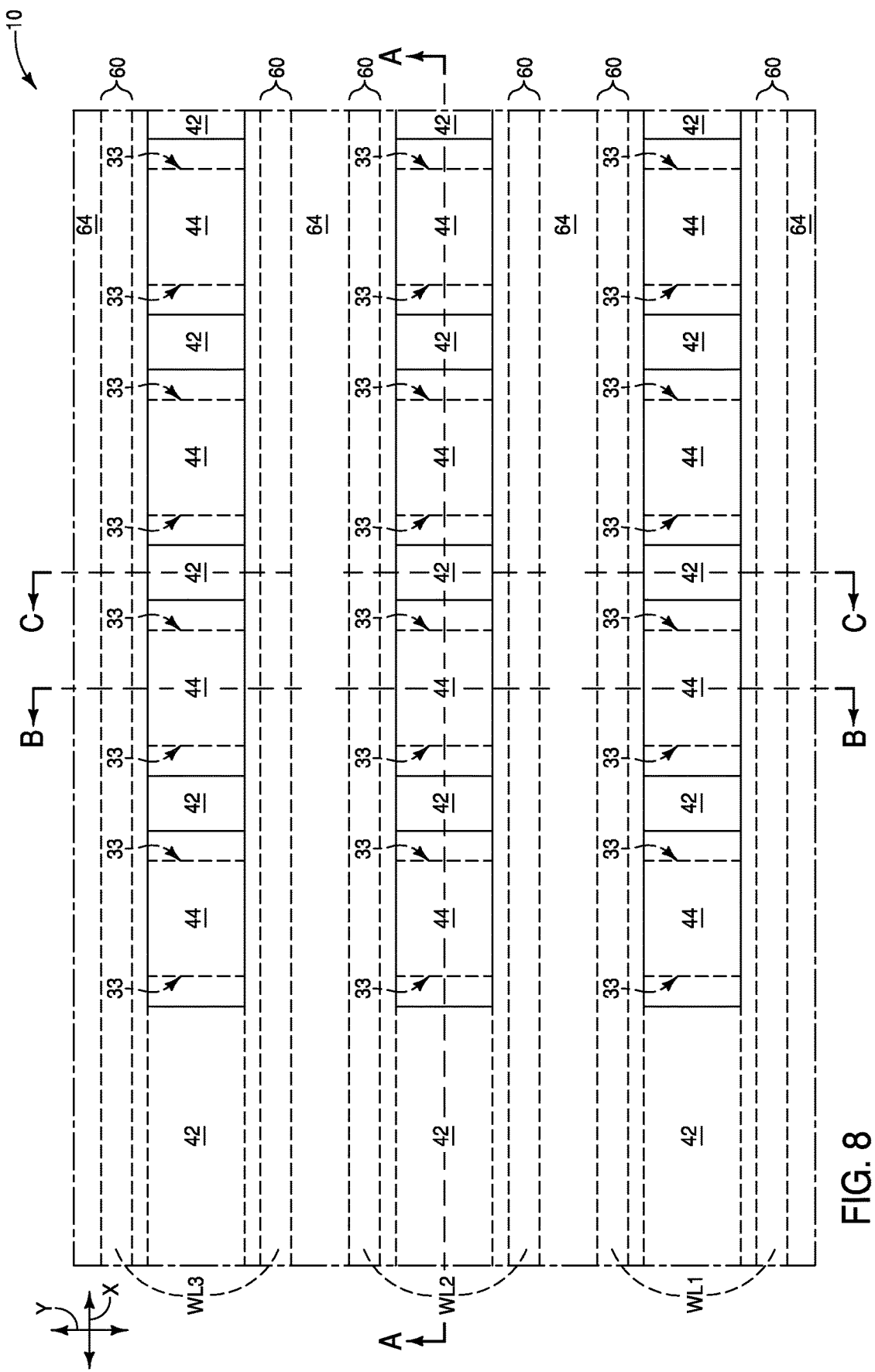
FIGS. 8-8C are diagrammatic views of the region of the example construction of FIGS. 1-1C at an example processing stage subsequent to that of FIGS. 7-7C.
Figure 8A:
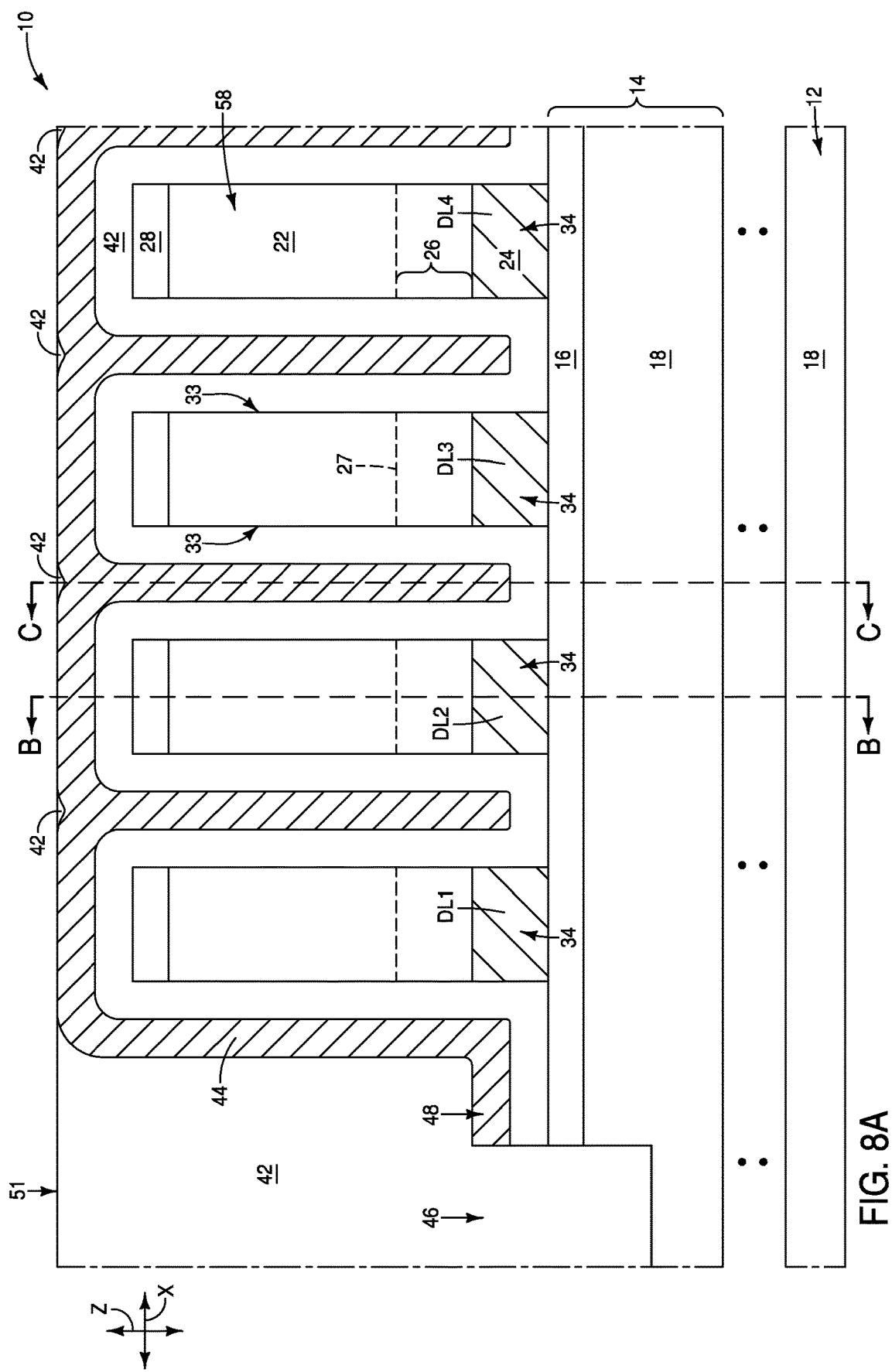
FIG. 8A is a diagrammatic cross-sectional view along the line A-A of FIG. 8.
Figure 8B:
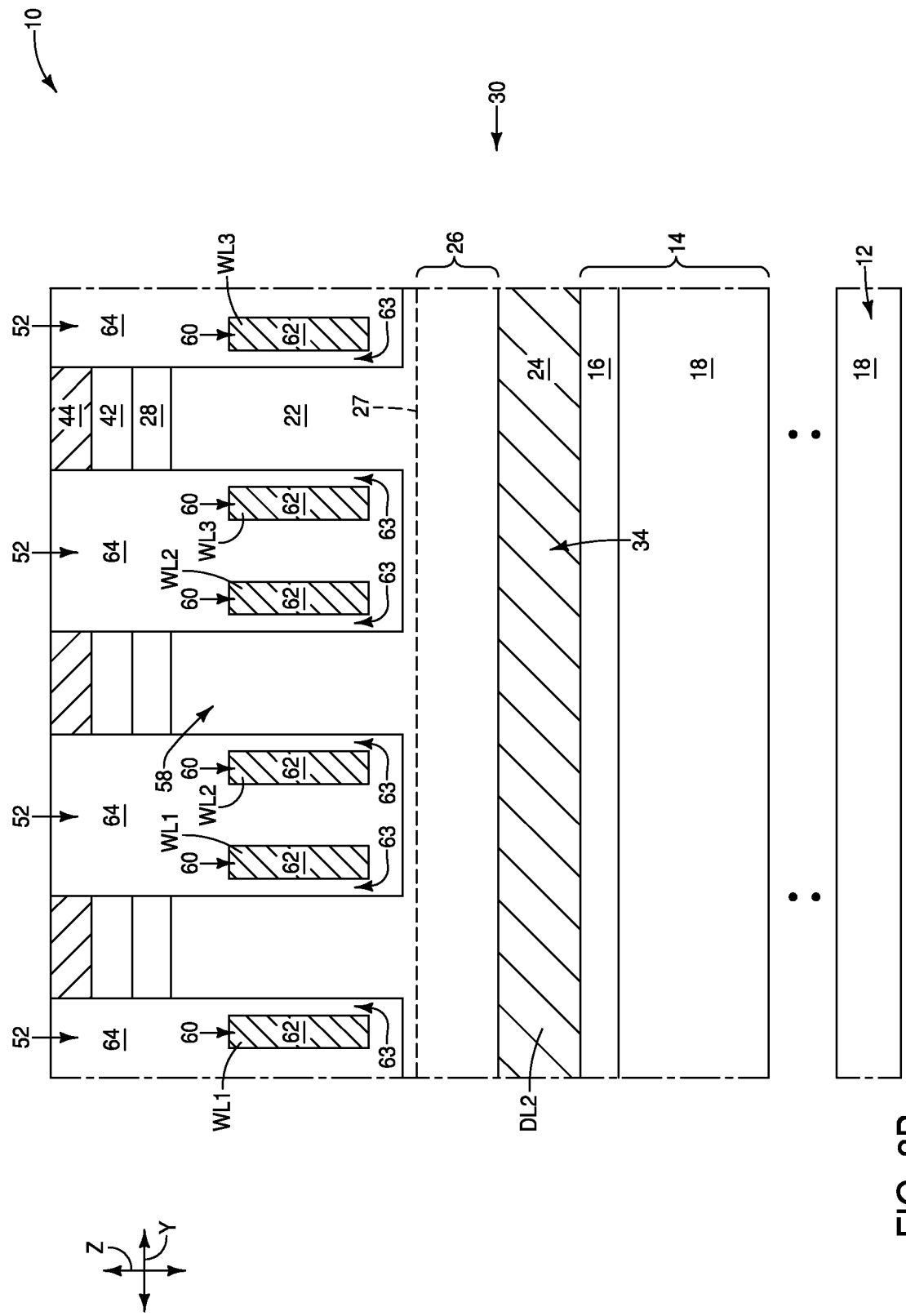
Figure 8C:
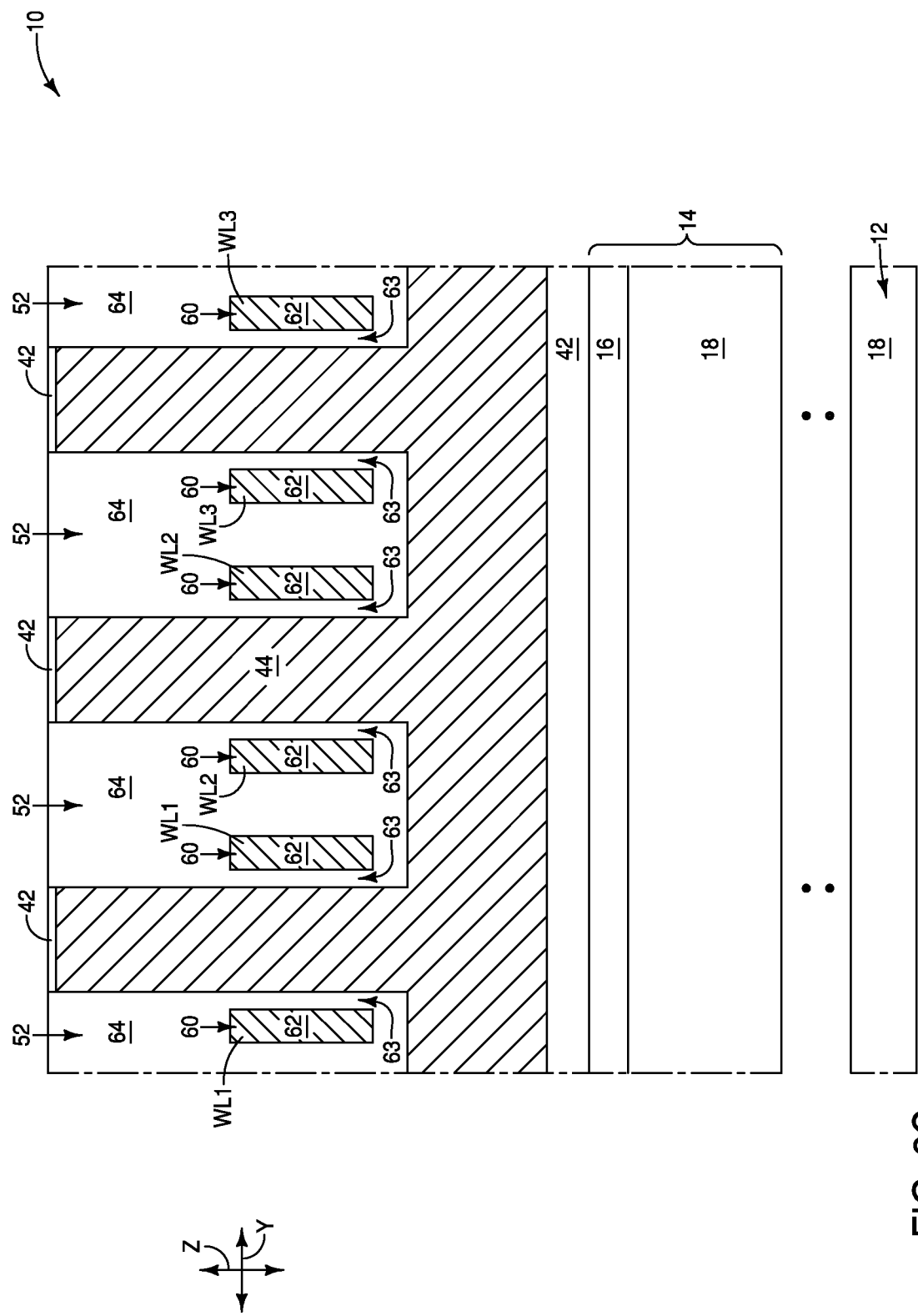

Referring to FIGS. 8-8C, wordlines 60 are formed within the second trenches 52. The wordlines comprise conductive wordline material 62. The conductive wordline material 62 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive wordline material 62 may be considered to be a third conductive material so that it may be distinguished from the second conductive material 44 of the shield lines and the first conductive material 24 of the digit lines. The first, second and third conductive materials may be the same composition as one another; and in some embodiments will comprise a same metal-containing composition (e.g., a composition comprising one or more of tungsten, titanium, tantalum, ruthenium, tungsten nitride, tantalum nitride, titanium nitride, etc.). Alternatively, at least one of the first, second and third conductive materials may be a different composition relative to at least one other of the first, second and third conductive materials.

In the shown embodiment, insulative material 64 is provided within the second trenches 52, and the wordlines 60 are embedded within such insulative material. The insulative material 64 may comprise any suitable composition(s); and in some embodiments may comprise one or both of silicon dioxide and silicon nitride.

Regions of the insulative material 64 between the wordlines 60 and the semiconductor material 22 correspond to gate dielectric material (or gate insulative material) 63. The gate dielectric material may comprise any suitable composition(s); and in some embodiments may comprise, consist essentially of, or consist of silicon dioxide.

The wordlines 60 are diagrammatically illustrated in the top view of FIG. 8 to assist the reader in understanding the orientation of the wordlines relative to the other structures within the assembly 10.

In the illustrated embodiment, the wordlines 60 are shown to correspond to wordlines WL1, WL2 and WL3. Such wordlines are examples of wordlines that may extend along the rows of a memory array. Also, the digit lines 34 are indicated to correspond to digit lines DL1, DL2, DL3 and DL4. Such digit lines are examples of digit lines that may extend along the columns of the memory array.

Figure 9:
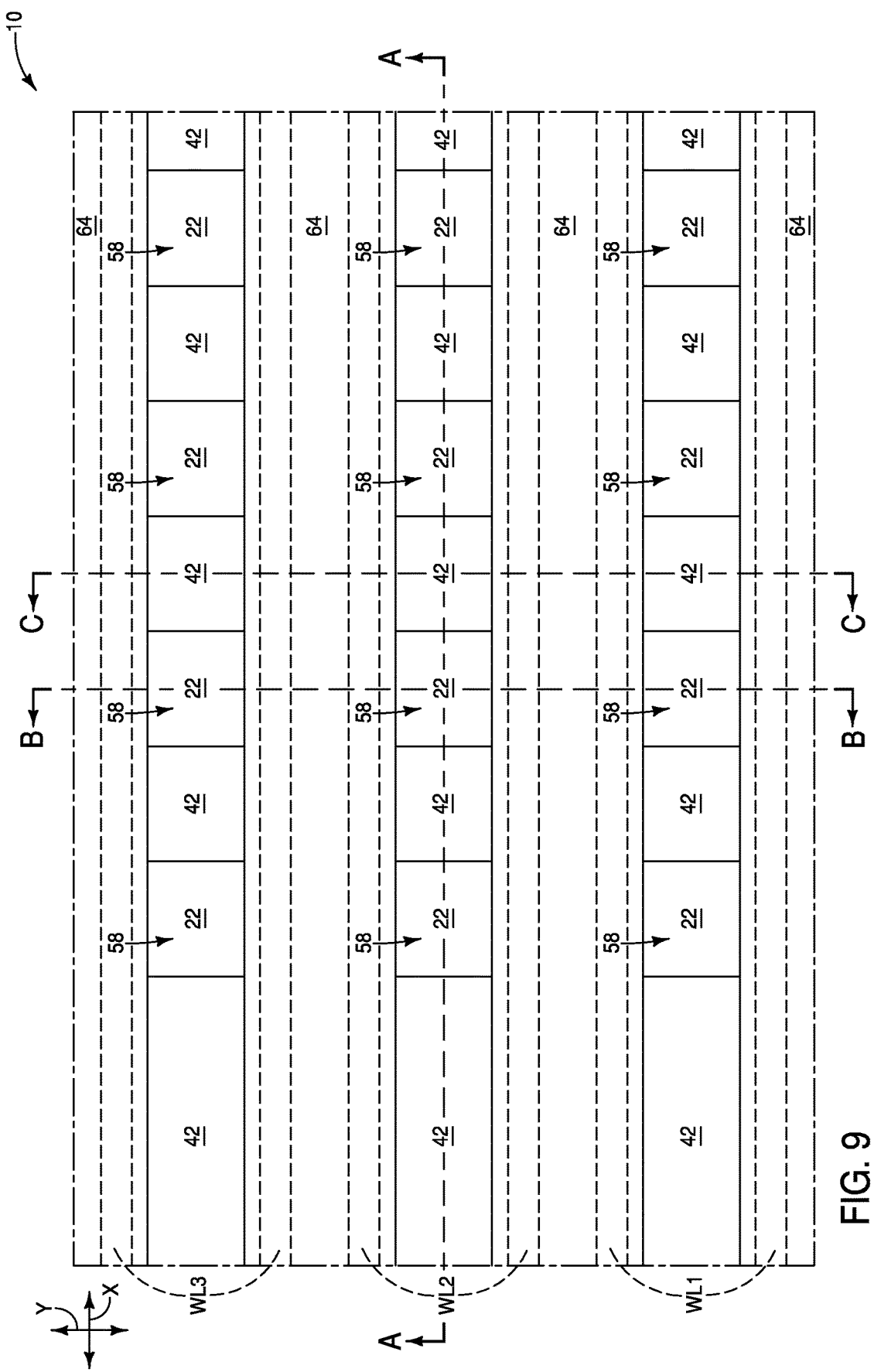
FIGS. 9-9C are diagrammatic views of the region of the example construction of FIGS. 1-1C at an example processing stage subsequent to that of FIGS. 8-8C.
Figure 9A:
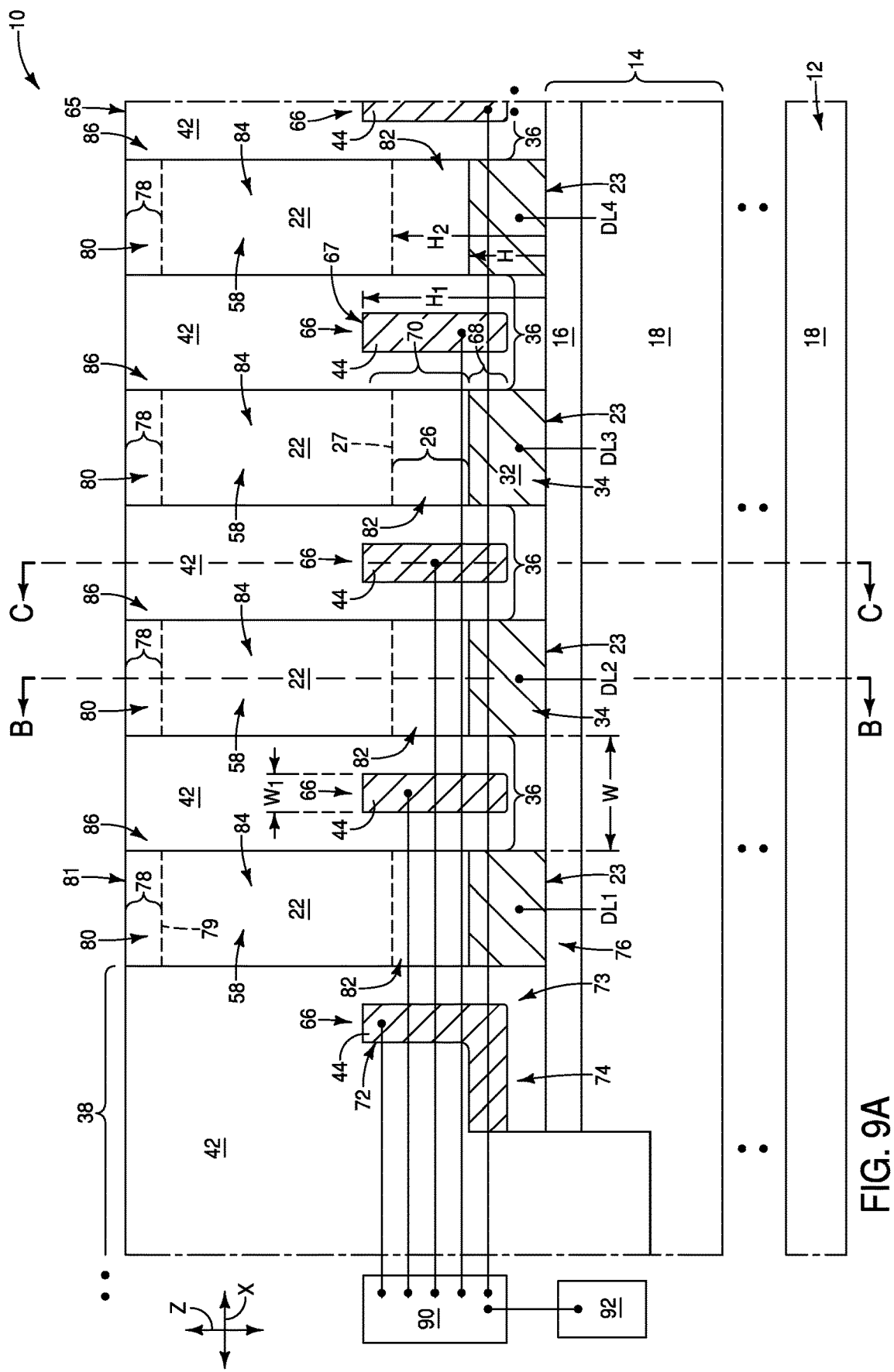
FIG. 9A is a diagrammatic cross-sectional view along the line A-A of FIG. 9.
Figure 9B:
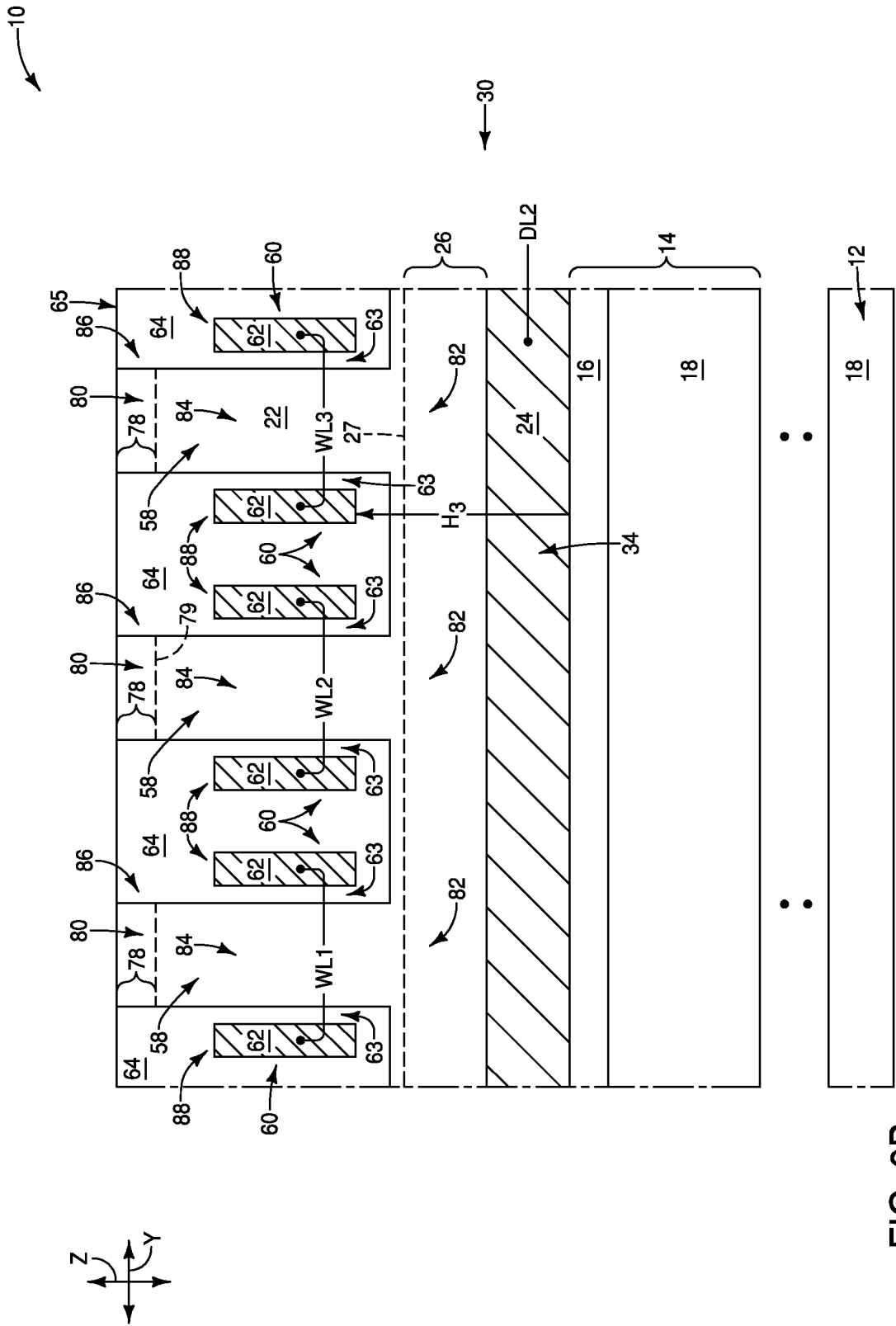
Figure 9C:
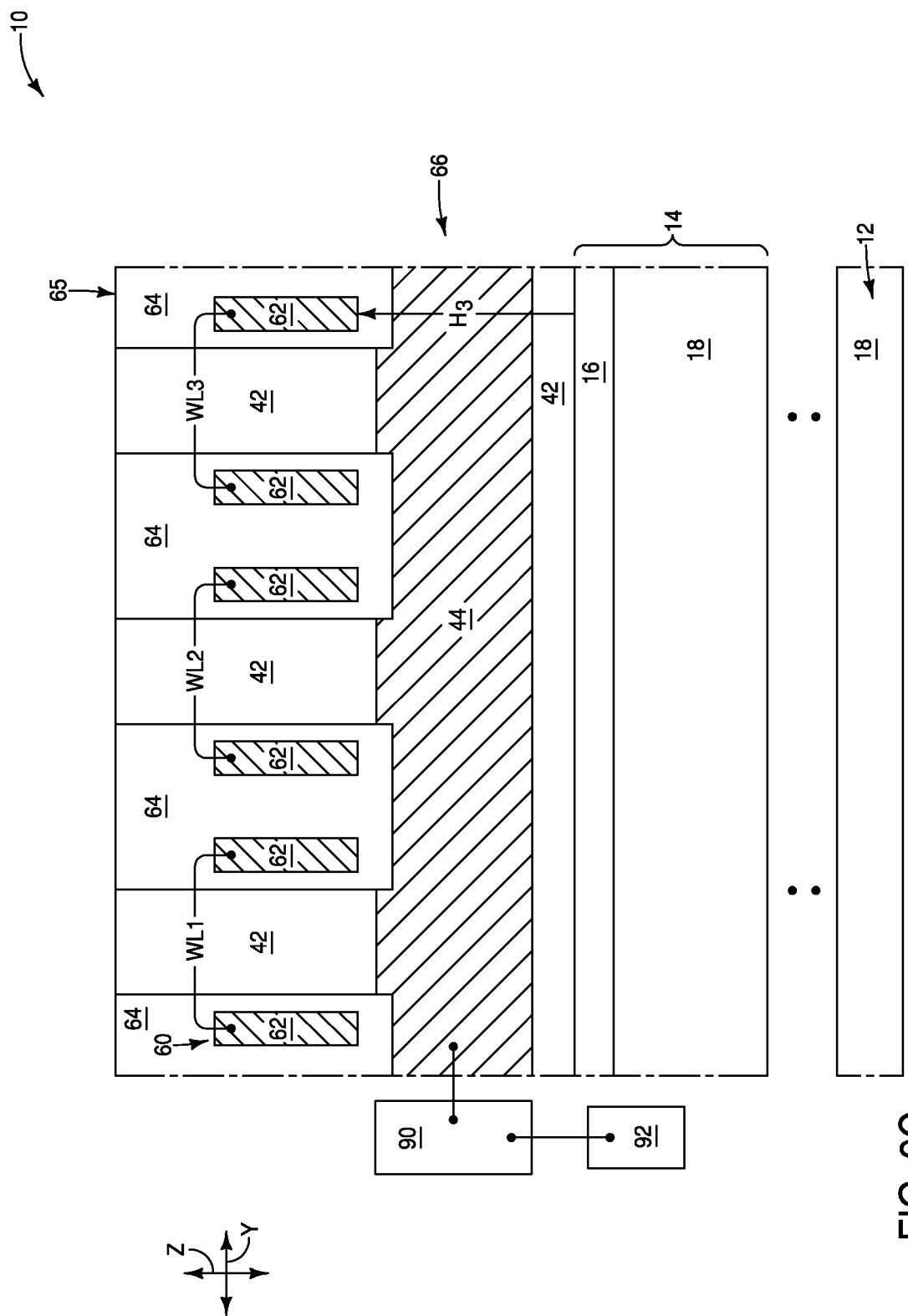

Referring to FIGS. 9-9C, the shield material 44 is recessed (i.e., reduced in height) to form conductive shield lines 66; with the conductive shield lines extending along the first direction of the y-axis. In the shown embodiment, the conductive shield lines vertically overlap upper segment (regions) 68 of the digit lines (e.g., DL1) and lower segments (regions) 70 of the semiconductor material 22. In some embodiments, the lower segments 70 may correspond to segments along the unpatterned portions 56 of the rails 30 (shown in FIG. 7B). In some embodiments, the lower regions 70 may include the entirety of the doped bottom segment 26 of the semiconductor material 22. In some embodiments, the digit lines (e.g., DL4) may be considered to extend to the first height H above the upper surface of the insulative material 16, and the shield lines 66 may be considered to comprise top surfaces 67 which are at a second height $H_1$ above the upper surface of the insulative material 16. The second height $H_1$ may be greater than or equal to the first height H. The doped regions 26 may be considered to extend to a third height $H_2$, and the second height $H_1$ may also be greater than or equal to the third height $H_2$. Additionally, each of the wordlines (e.g., WL3) may be considered to have a bottom surface at a fourth height $H_3$ (shown in FIG. 9C), and the second height $H_1$ (FIG. 9A) may be less than the fourth height $H_3$.

Notably, the shield line 66 within the edge region 38 has a different configuration then the shield lines 66 within the intervening regions 36. Specifically, the shield lines 66 within the intervening regions 36 are configured as vertically-extending plates, whereas the shield line 66 within the edge region 38 is configured as an angle plate. Specifically, the shield line 66 within the edge region 38 has a vertically-extending region 72, a horizontally-extending region 74, and an elbow region 73 connecting the vertically-extending region with the horizontally-extending region. In some embodiments, the digit line DL1 may be considered to be an edge digit line along the edge of a memory array, and to define an edge column 76. The edge column 76 has an intervening region 36 on one side, and has the edge region 38 on another side in opposing relation to said one side. The shield line 66 having the angle-plate-configuration extends along the edge column 76.

The shield lines 66 within the intervening regions 36 have horizontal widths corresponding to the width $W_1$ described above with reference to FIG. 3A.

Insulative material 42 is formed over the recessed shield lines 66.

Construction 10 is subjected to planarization (e.g., CMP) to form a planarized upper surface 65 extending across the insulative materials 42 and 64, and across the semiconductor material 22.

Top sections 78 of the semiconductor material pillars 58 are doped. The top sections 78 may be doped with the same type dopant as is utilized in the bottom section 26. Approximate lower boundaries of the doped sections 78 are diagrammatically illustrated with dashed lines 79. The doped top sections 78 form upper source/drain regions 80 of transistors 86, and the doped bottom sections 26 form lower source/drain regions 82 of the transistors. Transistor channel regions 84 are within the semiconductor pillars 58 and extend vertically between the lower source/drain regions 82 and the upper source/drain regions 80. The channel regions may be intrinsically doped, or lightly doped, to achieve a desired threshold voltage. The wordlines (e.g., WL3) are adjacent to the channel regions 84, and are spaced from the channel regions by the gate dielectric material 63. The wordlines comprise gates of the transistors 86 and may be utilized to gatedly couple the source/drain regions 80 and 82 of individual transistors to one another through the channel regions 84. FIG. 9B shows gates 88 along the wordlines 60, with such gates corresponding to regions of the wordlines adjacent the channel regions 84. In some embodiments, the gates 88 may be considered to correspond to gate regions of the wordlines 60.

In the embodiment of FIGS. 1-9, the bottom sections 26 of the semiconductor material 22 are doped prior to forming the wordlines 60 (specifically, are shown to be doped at the processing stage of FIG. 1), and the top sections 78 of the semiconductor material 22 are doped after forming the wordlines 60 (specifically, are doped at the processing stage of FIG. 9). In other embodiments the top and bottom sections 26 and 78 may be doped at other process stages. For instance, both the top and bottom sections 26 and 78 may be doped at the process stage of FIG. 1.

The shield lines 66 may be utilized to alleviate, and even prevent, undesired parasitic capacitance between adjacent digit lines (e.g., parasitic capacitance between the digit lines DL1 and DL2). The shield lines 66 are shown to be coupled with a reference structure 90 (i.e., a reference voltage source, reference voltage node, etc.), which in turn is coupled with circuitry 92 configured to provide a reference voltage to the reference structure; and in some embodiments configured to hold the reference structure 90 at the reference voltage. The reference voltage is thus provided to the shield lines 66. The reference voltage may be any suitable reference voltage; and in some embodiments may be ground, Vcc/2, etc. It may be advantageous to hold the shield lines at a reference voltage, rather than enabling the shield lines to electrically float, in that such may enable the shield lines to better alleviate undesired parasitic capacitance between adjacent digit lines. The reference structure 90 may be a conductive plate (e.g., a metal-containing plate), or any other suitable conductive structure. In some embodiments, the reference structure 90 may be omitted and the shield lines 66 may be simply coupled to circuitry configured to induce a desired reference voltage along the shield lines.

The intervening regions 36 comprise the first width W from the bottom surfaces 23 of the digit lines 34 to top surfaces 81 of the upper source/drain regions 80.

Figure 10:
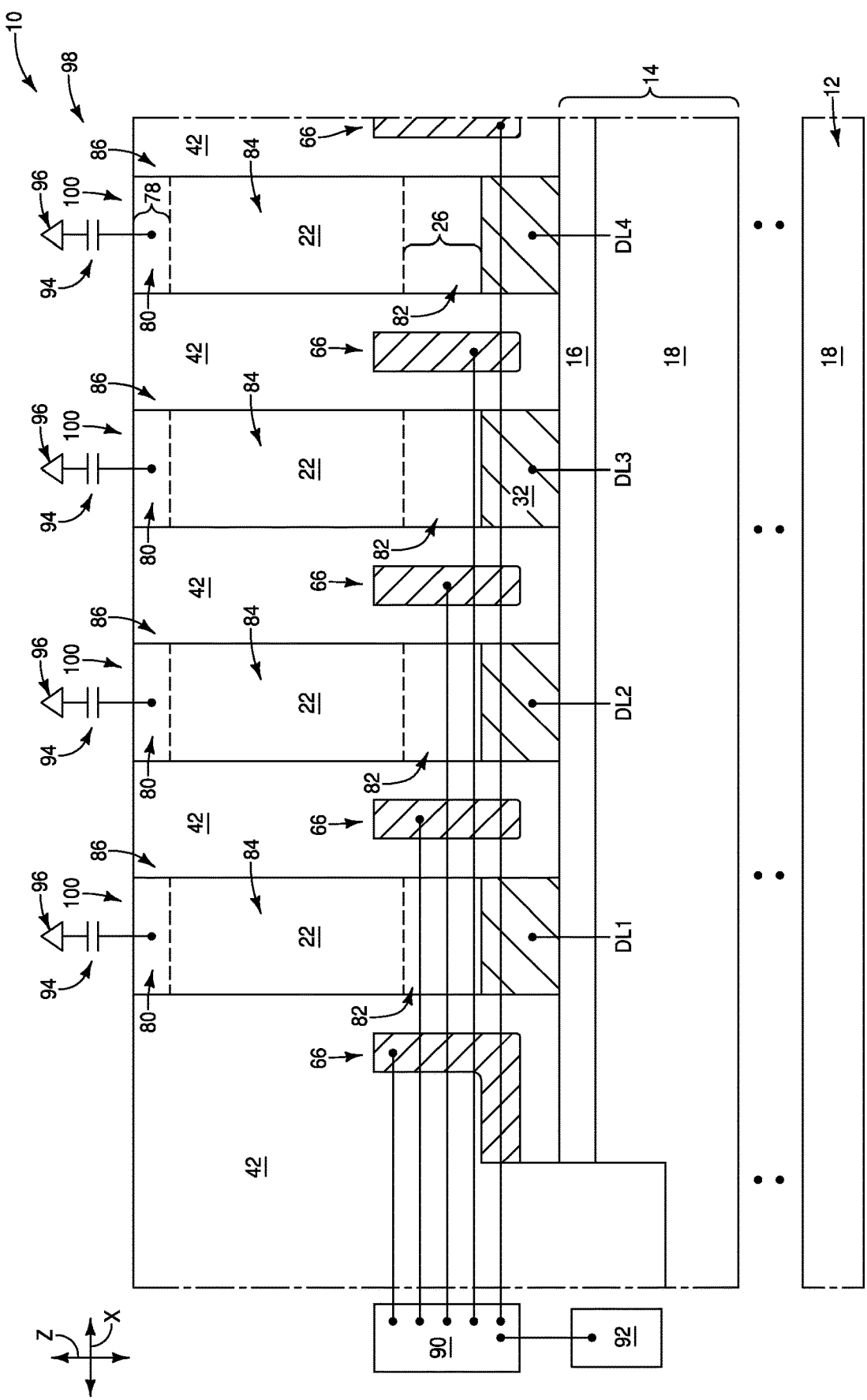
FIG. 10 is a diagrammatic view of the region of the example construction of FIG. 9A at an example processing stage subsequent to that of FIG. 9A.

Referring to FIG. 10, storage elements 94 are formed to be conductively coupled with the upper source/drain regions 80. The storage elements may be any suitable devices having at least two detectable states; and in some embodiments may be, for example, capacitors, resistive-memory devices, conductive-bridging devices, phase-change-memory (PCM) devices, programmable metallization cells (PMCs), etc. In the shown embodiment, the storage elements 94 are capacitors. Each capacitor has a node coupled with a reference voltage 96. Such reference voltage may be any suitable reference voltage, and may be the same as the reference voltage utilized at the shield lines 66, or may be different from such reference voltage. In some embodiments, the reference voltage 96 may be ground or Vcc/2.

Figure 11:
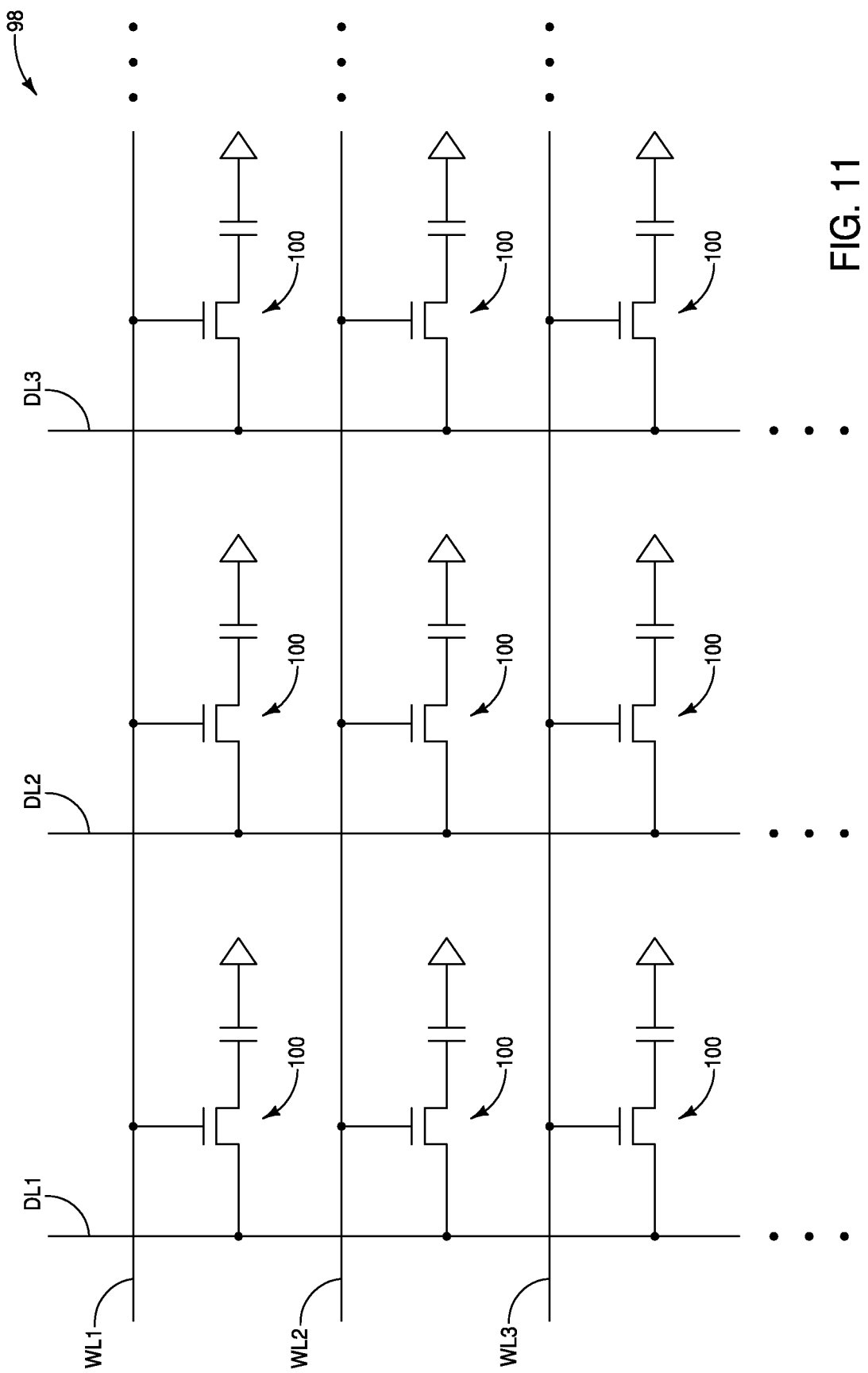
FIG. 11 is a diagrammatic schematic view of a region of an example memory array.

The storage elements 94 and transistors 86 may be incorporated into memory cells 100 of a memory array 98. In some embodiments, the transistors 86 may be referred to as access transistors of the memory cells. FIG. 11 schematically illustrates a portion of the memory array 98, and shows such memory array comprising digit lines DL1, DL2 and DL3, together with the wordlines WL1, WL2 and WL3. Each of the memory cells 100 within the memory array is uniquely addressed through a combination of one of the wordlines and one of the digit lines. The memory array may include any suitable number of memory cells 100; and in some embodiments may comprise hundreds, millions, tens of millions, etc., of memory cells.

Figure 12:
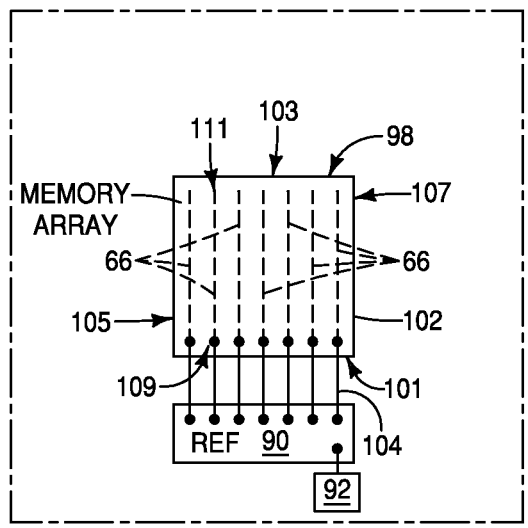
FIGS. 12-12B are diagrammatic top views of regions of example integrated assemblies.

The reference structure 90 of FIG. 10 may be placed in any suitable location relative to the memory array 98. FIGS. 12-12E show example arrangements of the memory array 98 and the reference structure 90. Each of FIGS. 12-12E shows the memory array 98 (labeled MEMORY ARRAY) diagrammatically illustrated as a square or other suitable polygon. FIGS. 12-12B diagrammatically illustrate the conductive shield lines 66 with dashed lines crossing the memory array.

The memory array 98 of FIGS. 12-12B may be considered to have a peripheral boundary 102, and to have peripheral edges 101, 103, 105 and 107 along the peripheral boundary. In some embodiments, the edges 101 and 103 may be referred to as first and second peripheral edges of the memory array, and may be considered to be in opposing relation relative to one another. Each of the shield lines 66 has a first end 109 along the first peripheral edge 101, and has a second end 111 along the second peripheral edge 103. The first and second ends 109 and 111 may be considered to be in opposing relation to one another.

FIG. 12 shows an embodiment in which the first ends 109 of the shield lines 66 are electrically coupled with the reference structure 90 (labeled REF in FIG. 12) through interconnects 104.

Figure 12A:
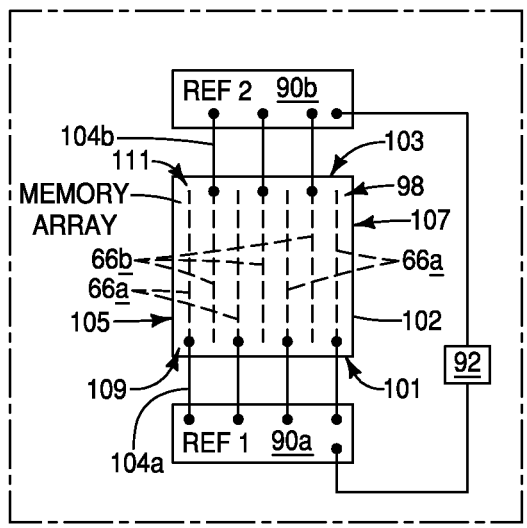
FIGS. 12C and 12D are diagrammatic cross-sectional side views along the line C-C of FIG. 12B, and illustrate a pair of example integrated assemblies.
FIG. 12E is a diagrammatic cross-sectional side view illustrating another example integrated assembly.
Figure 12B:
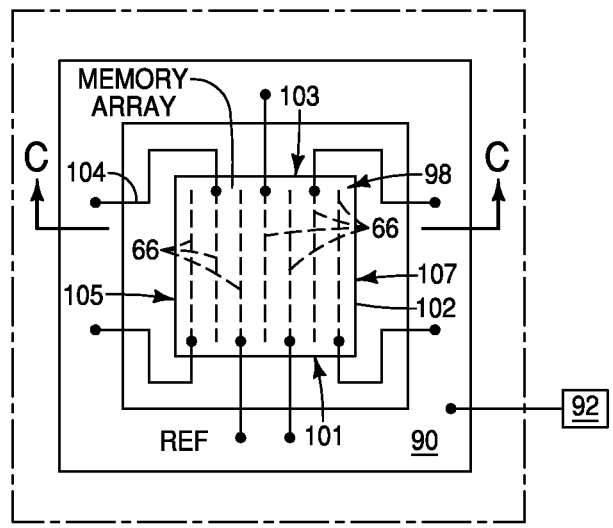

FIG. 12A shows an embodiment in which a first reference structure 90a (REF 1) is provided adjacent the first peripheral edge 101 of the memory array 98, and a second reference structure 90b (REF 2) is provided adjacent the second peripheral edge 103 of the memory array. In the illustrated embodiment, the first reference structure 90a is laterally offset from the first peripheral edge 101, and the second reference structure 90b is laterally offset from the second peripheral edge 103. The reference structures 90a and 90b are both coupled to common circuitry 92 configured to provide desired reference voltages on the structures 90a and 90b (i.e., the reference voltage nodes 90a and 90b, the reference voltage sources 90a and 90b, etc.). The shield lines 66 are divided amongst a first set 66a and a second set 66b. The first set has the first ends 109 coupled with the first reference structure 90a through first interconnects 104a, and the second set has the second ends 111 coupled with the second reference structure 90b through second interconnects 104b.

The use of two reference structures 90a and 90b in the embodiment of FIG. 12A may enable the connections between the reference structures and the shield lines 66 to be better spread than can be accomplished with the single reference structure of FIG. 12. Such may simplify the formation of the connections between the shield lines and the reference structures, and may enable desired spacing between adjacent interconnects to avoid parasitic capacitance between neighboring interconnects.

FIG. 12B shows an embodiment in which the reference structure 90 (REF) peripherally surrounds the memory array 98. Such may enable the connections to the shield lines to be spread uniformly around the memory array, which may further alleviate parasitic capacitance between neighboring interconnects 104.

Figure 12C:
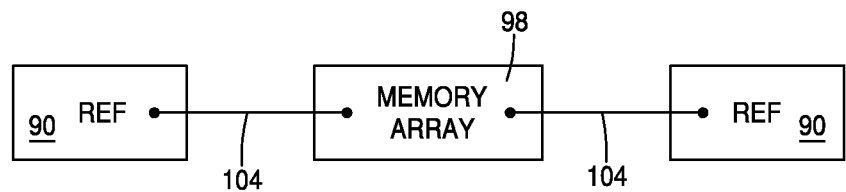
Figure 12D:
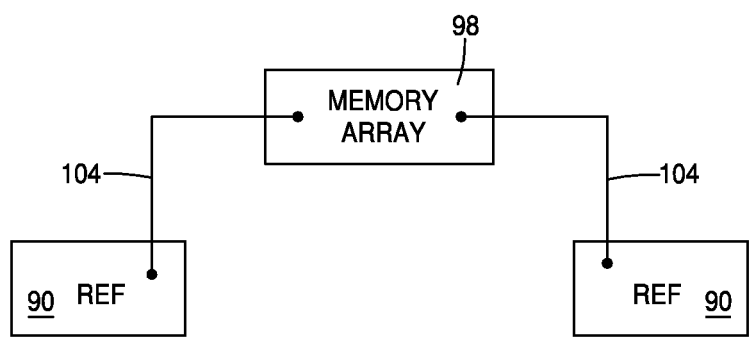
Figure 12E:
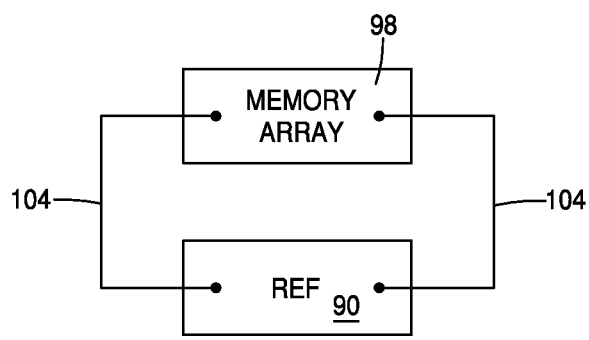

The reference structures may be provided to be along a same plane as the memory array, or may be vertically offset relative to the memory array. For instance, FIGS. 12C and 12D show cross-sections along the line C-C of FIG. 12B illustrating example embodiments in which the reference structure 90 is along a same horizontal plane as the memory array 98 (FIG. 12C), or is vertically offset relative to the memory 98 (FIG. 12D).

FIG. 12E shows another embodiment in which a reference structure 90 is vertically offset from a memory array 98; but in the embodiment of FIG. 12E the reference structure is not laterally offset relative to the memory array, and is instead directly under the memory array.

Figure 13:
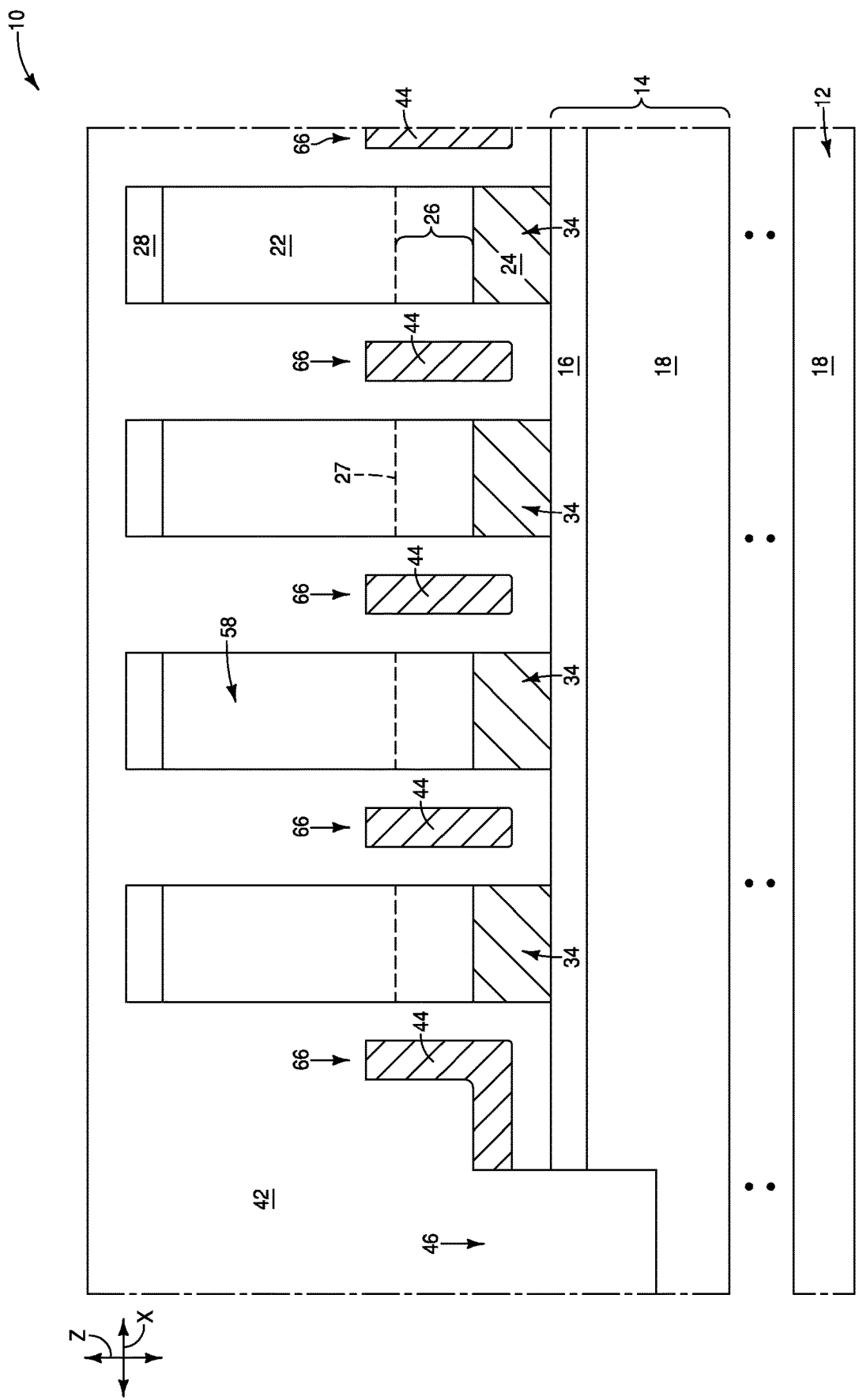
FIG. 13 is a diagrammatic view of the region of the example construction of FIG. 6A at an example processing stage subsequent to that of FIG. 6A, and alternative to the construction shown in FIG. 7A.

The embodiment of FIGS. 1-10 reduces the height of the conductive shield material 44 after forming the wordlines 60. Specifically, the wordlines 64 are formed at the processing stage of FIG. 8, and the height of the shield material is reduced at the processing stage of FIG. 9 in order to form the conductive shield lines 66. In other embodiments, the height of the conductive shield material may be reduced prior to forming the wordlines. For instance, FIG. 13 shows construction 10 at a process stage alternative to that of FIG. 7A, and shows the shield line material 44 reduced in height to form the conductive shield lines 66. The construction 10 of FIG. 13 may be subsequently processed with methodology analogous to that of FIGS. 8-10 to form the memory array 98 described with reference to FIG. 10.

The processing of FIGS. 1-10 utilizes interconnects extending from the ends of the shield lines 66 to couple the shield lines with one or more reference structures. In other embodiments, a reference structure may be provided under the shield lines and directly against bottom surfaces of the shield lines. FIGS. 14-23 illustrate an example embodiment in which shield lines are formed to have bottom surfaces directly against a reference structure.

Figure 14:
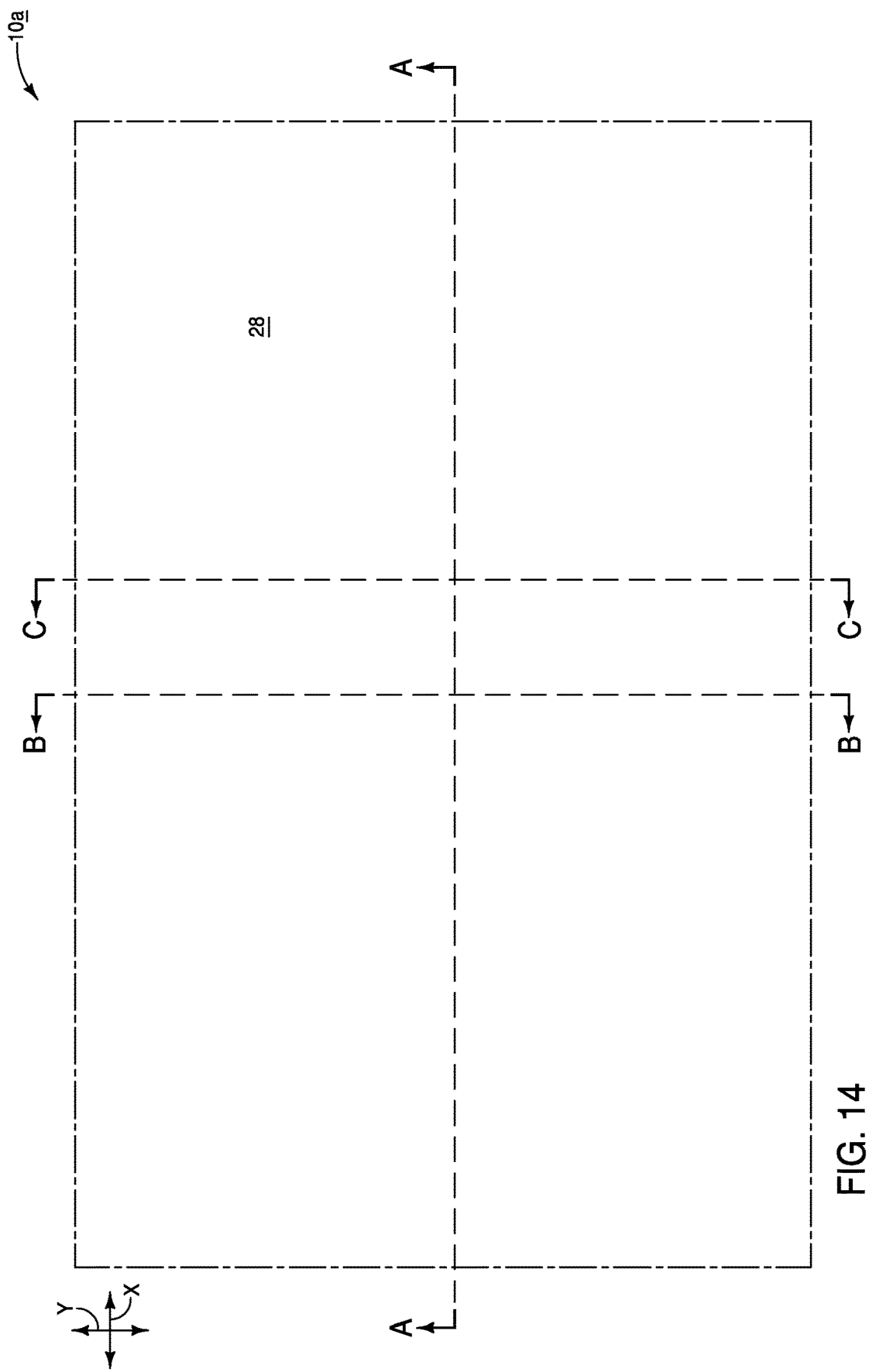
FIGS. 14-14C are diagrammatic views of a region of an example construction at an example initial process stage of an example method of forming an example integrated assembly.
Figure 14A:
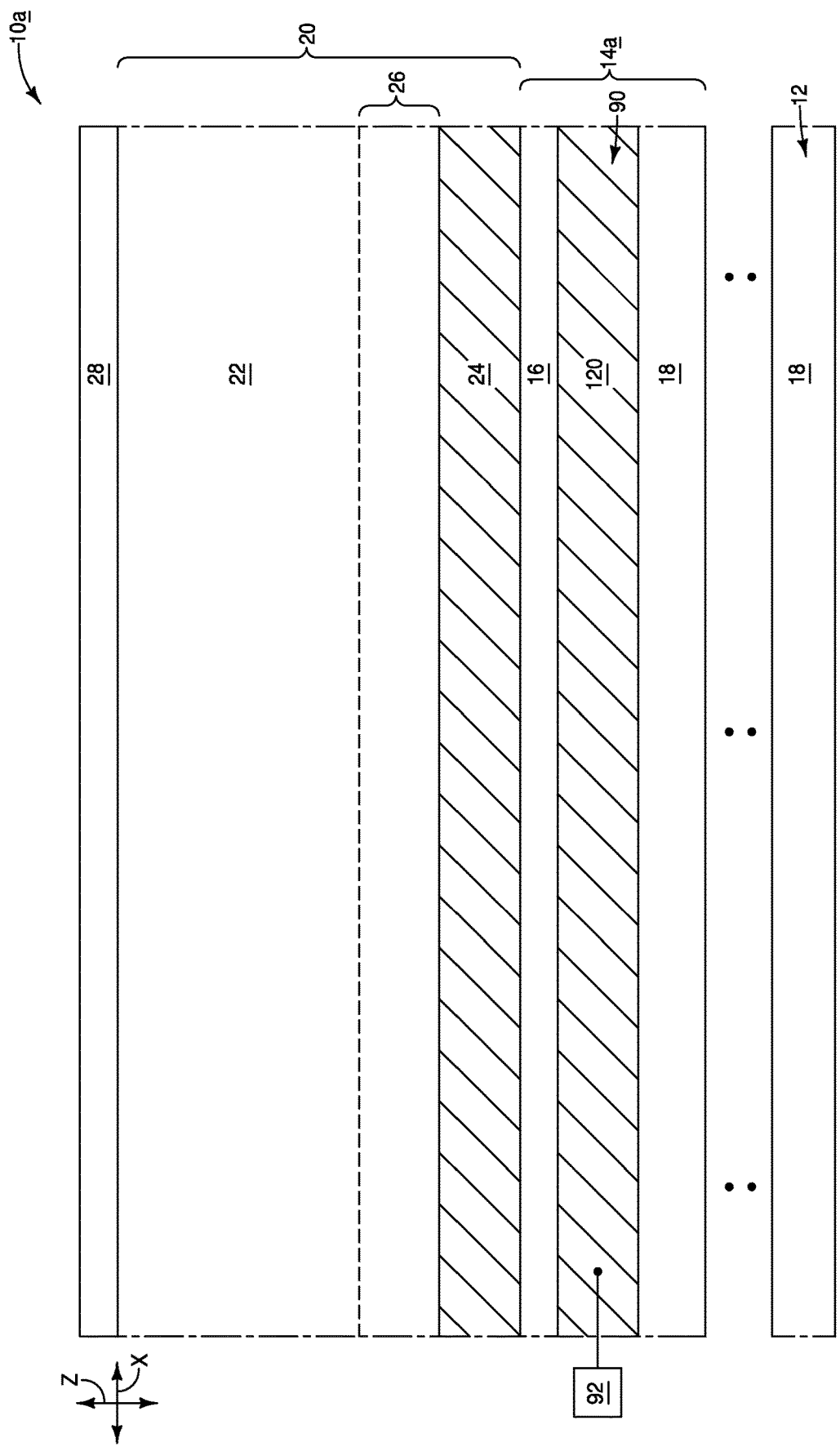
Figure 14B:
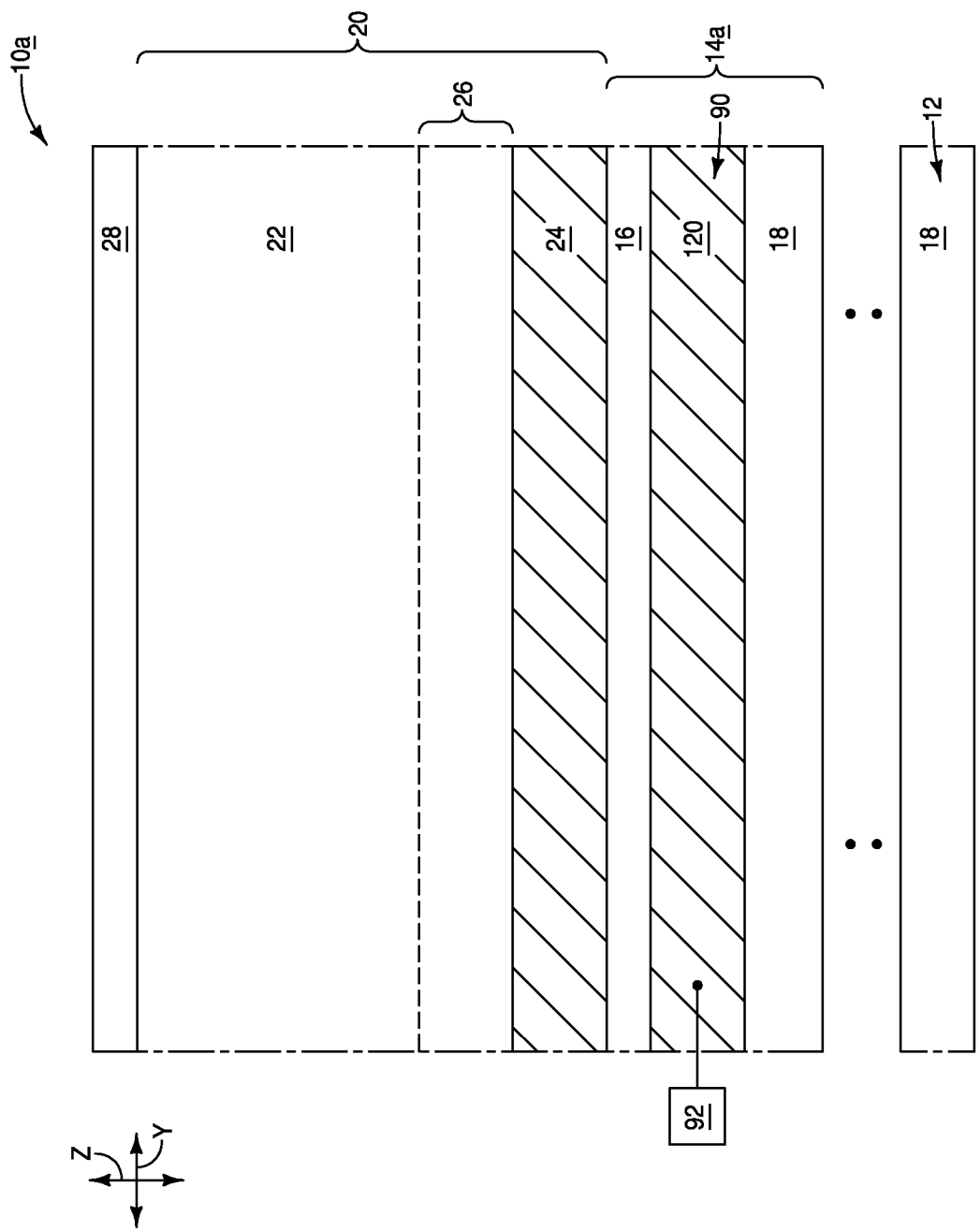
Figure 14C:
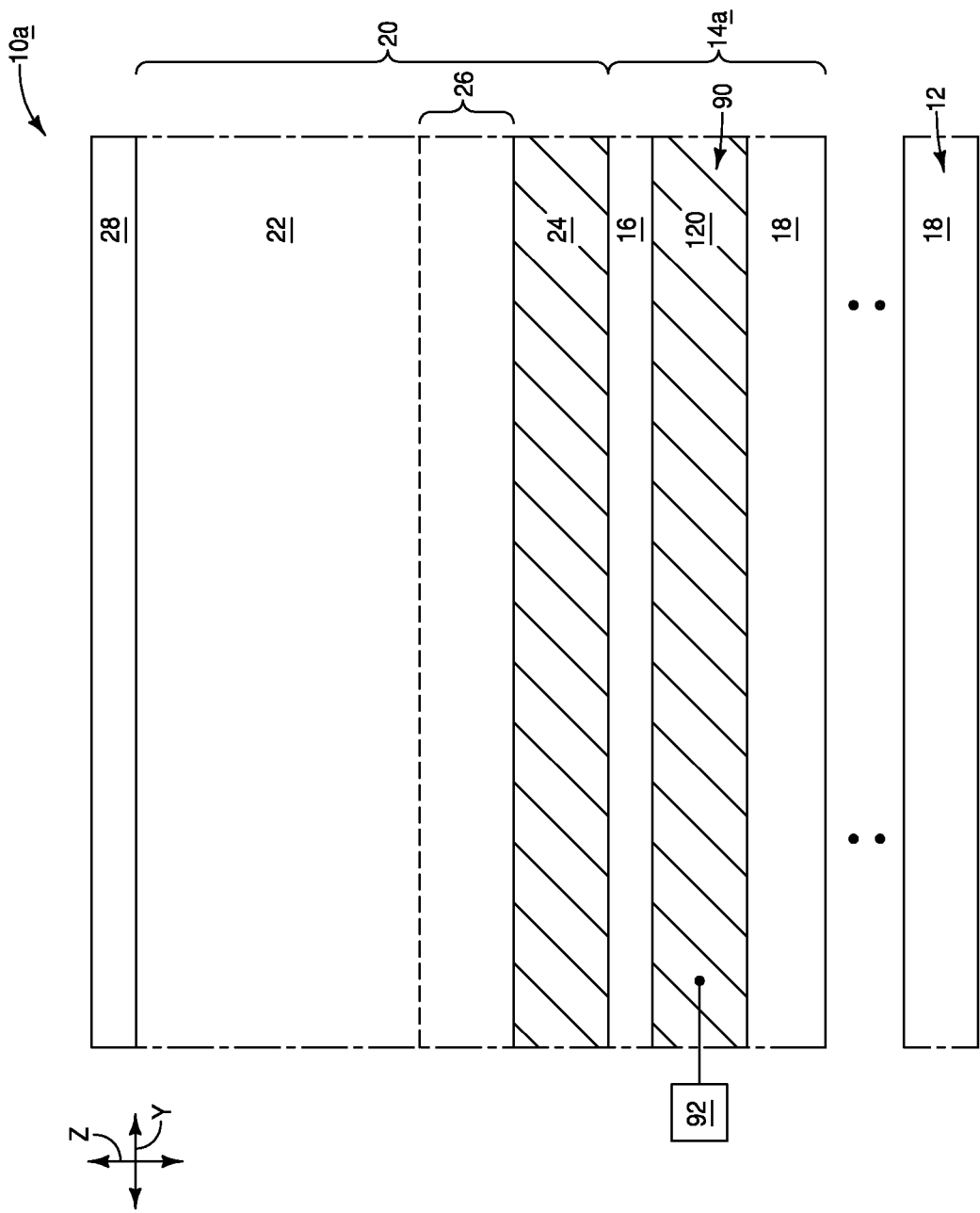

Referring to FIGS. 14-14C, an integrated assembly (construction) 10a includes a support structure 14a over the base 12. The support structure includes the insulative material 16 and the semiconductor material 18, and further includes a reference structure 90 between the materials 16 and 18. The reference structure 90 comprises conductive material 120. The conductive material 120 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the reference structure 90 comprises metal-containing material; such as, for example, one or more of titanium, tantalum, titanium nitride, tantalum nitride, ruthenium, tungsten, etc. In the shown embodiment, the reference structure may be considered to be configured as a horizontally-extending expanse.

The stack 20 is formed over the support structure 14a. The stack 20 includes the semiconductor material 22 over the digit line material 24. The bottom section 26 of the semiconductor material 22 is conductively-doped. The protective capping material 28 is over the stack 20.

The reference structure 90 is shown to be coupled with the circuitry 92 configured to hold the reference structure at a desired voltage (e.g., ground, Vcc/2, etc.). Although such coupling of the reference structure 90 to the circuitry 92 is shown at the process stage of FIGS. 14-14C, in other embodiments the coupling may be provided at a later process stage.

Figure 15:
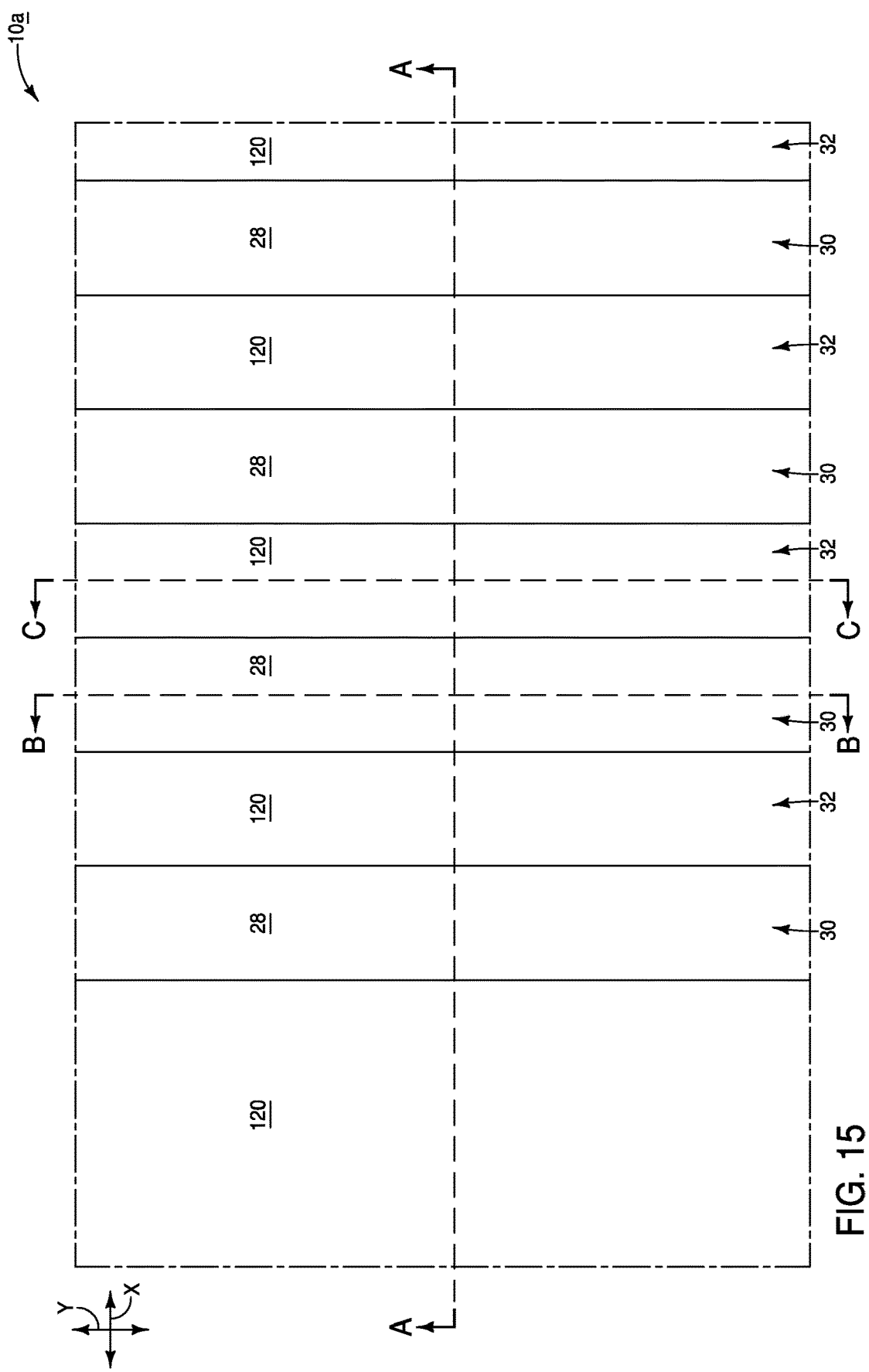
FIGS. 15-15C are diagrammatic views of the region of the example construction of FIGS. 14-14C at an example processing stage subsequent to that of FIGS. 14-14C.
Figure 15A:
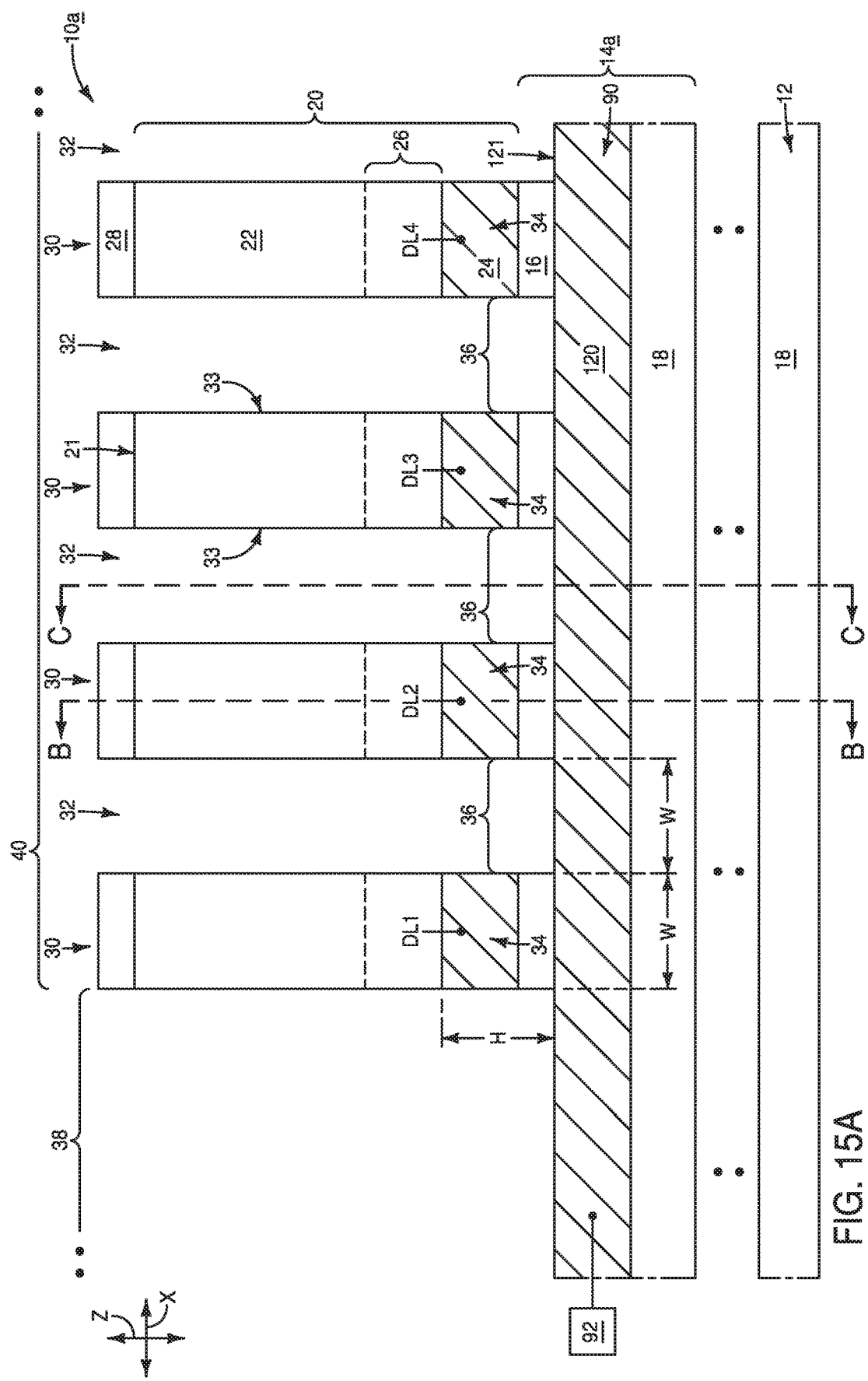
FIG. 15A is a diagrammatic cross-sectional view along the line A-A of FIG. 15.
Figure 15B:
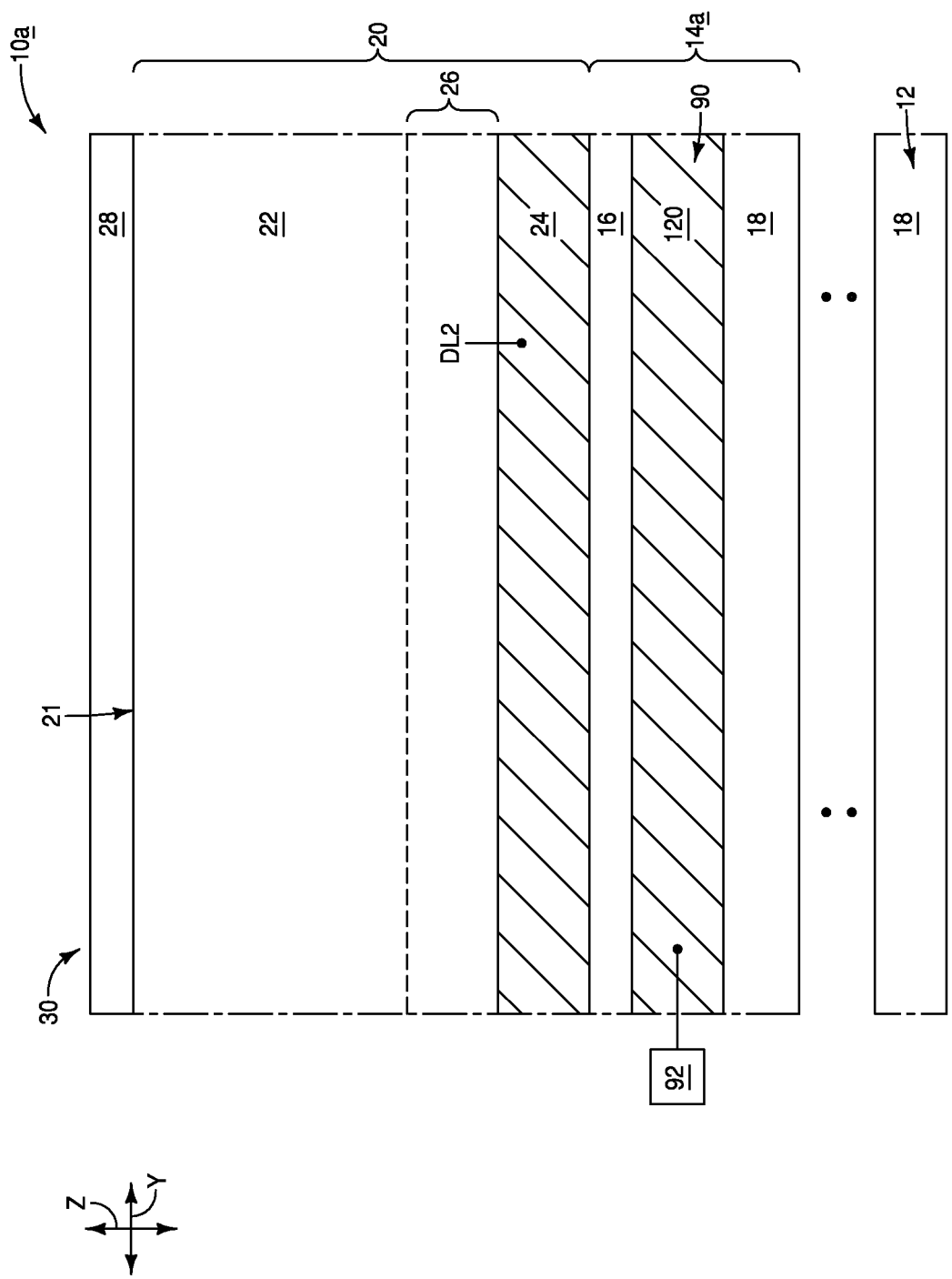
Figure 15C:
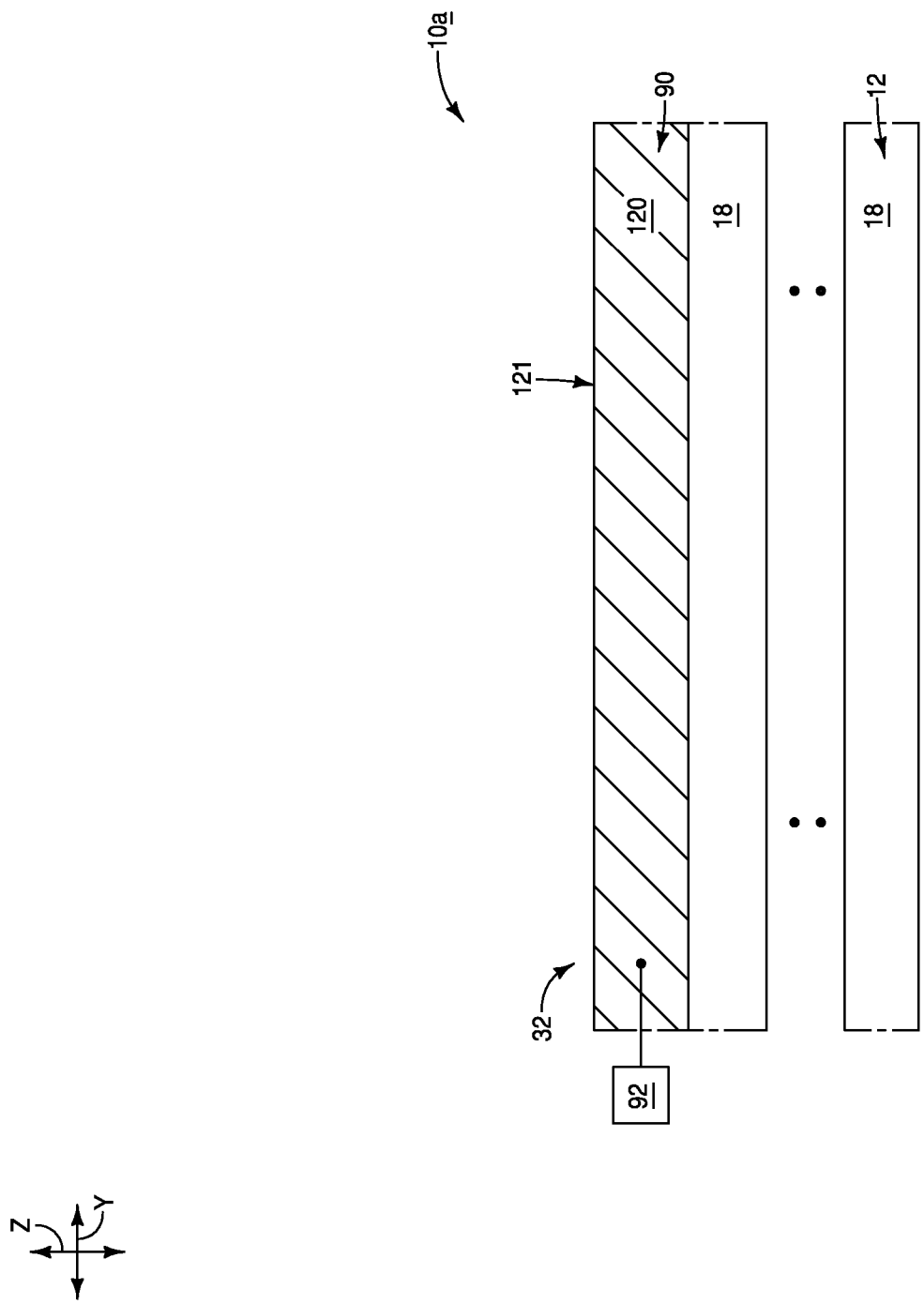

Referring to FIGS. 15-15C, the stack 20 is patterned into rails 30 which extend laterally along the first direction (y-axis direction). The rails are spaced from one another by the first trenches 32. The rails 30 extend vertically along the z-axis direction. Each of the rails has a top surface corresponding to the top surface 21 of the semiconductor material 22, and has the sidewall surfaces 33.

The patterning of the rails 30 punches through the insulative material 16 to expose an upper surface 121 of the reference structure 90 along the bottoms of the trenches 32.

The patterned digit line material 24 within the rails 30 is configured as the digit lines 34; which are labeled as digit lines DL1-DL4.

The rails 30 may be formed with any suitable processing, including, for example, process analogous to that described above with reference to FIGS. 2-2C.

The digit lines 34 have the first width W along the cross-section of FIG. 15A, and extend to the first height H.

The trenches 32 include the intervening regions 36 between the digit lines 34, and such such intervening regions also have the first width W. In the shown embodiment, each of the trenches has a uniform width W from the top surface 121 of the reference structure 90 to top surfaces of the capping material 28.

The edge region 38 is shown along one side of the patterned rails 30. The edge region of the embodiment of FIGS. 15-15C is analogous to the edge region described above relative to the embodiment of FIGS. 2-2C.

Figure 16:
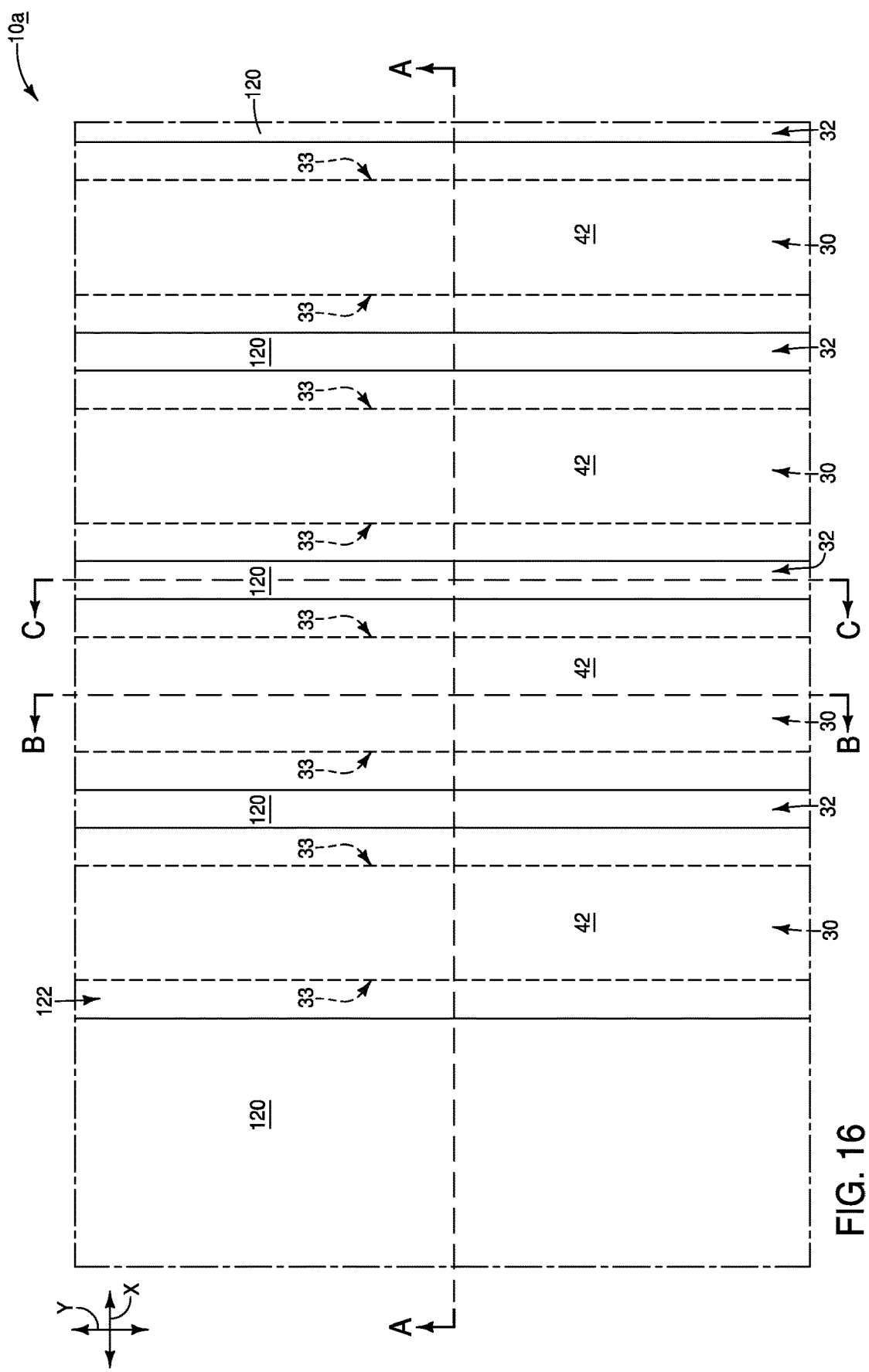

Referring to FIGS. 16-16C, insulative material 42 is formed over the rails 30, and is patterned into insulative shells 122. The insulative shells cover the top surfaces 21 of the rails and the sidewall surfaces 33 of the rails. The insulative shells 122 narrow the trenches 32, and the upper surface 121 of the reference structure 90 is exposed along bottoms of the narrowed trenches.

The narrowed trenches 32 have the uniform second width $W_1$ from the upper surface 121 of the reference structure 90 to the top surfaces 21 of the semiconductor material 22. In some embodiments, the second width $W_1$ may be less than or equal to about one-half of the first width W, less than or equal to about one-third of the first width W, etc.

Figure 17:
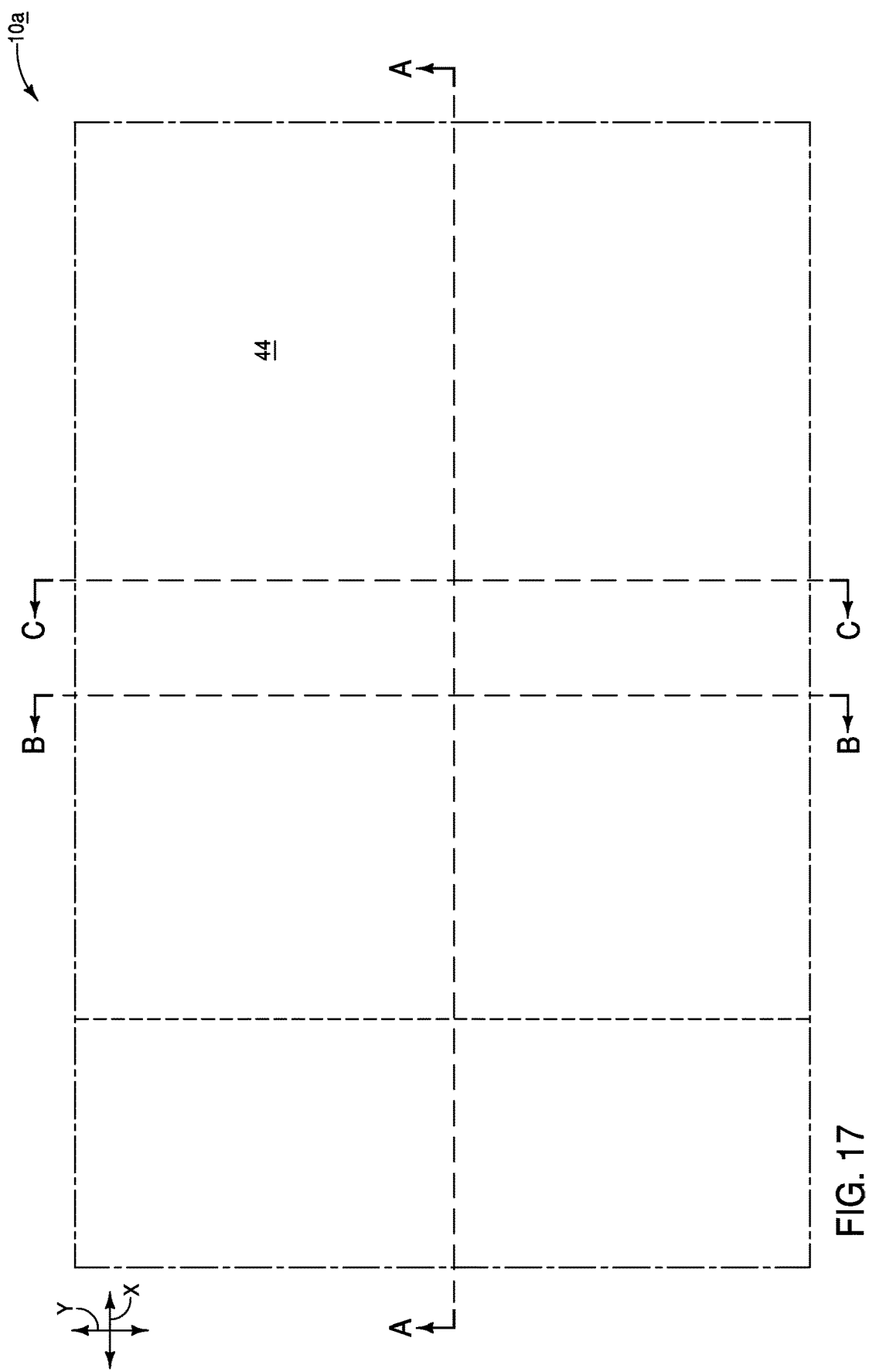
FIGS. 17-17C are diagrammatic views of the region of the example construction of FIGS. 14-14C at an example processing stage subsequent to that of FIGS. 16-16C.
Figure 17A:
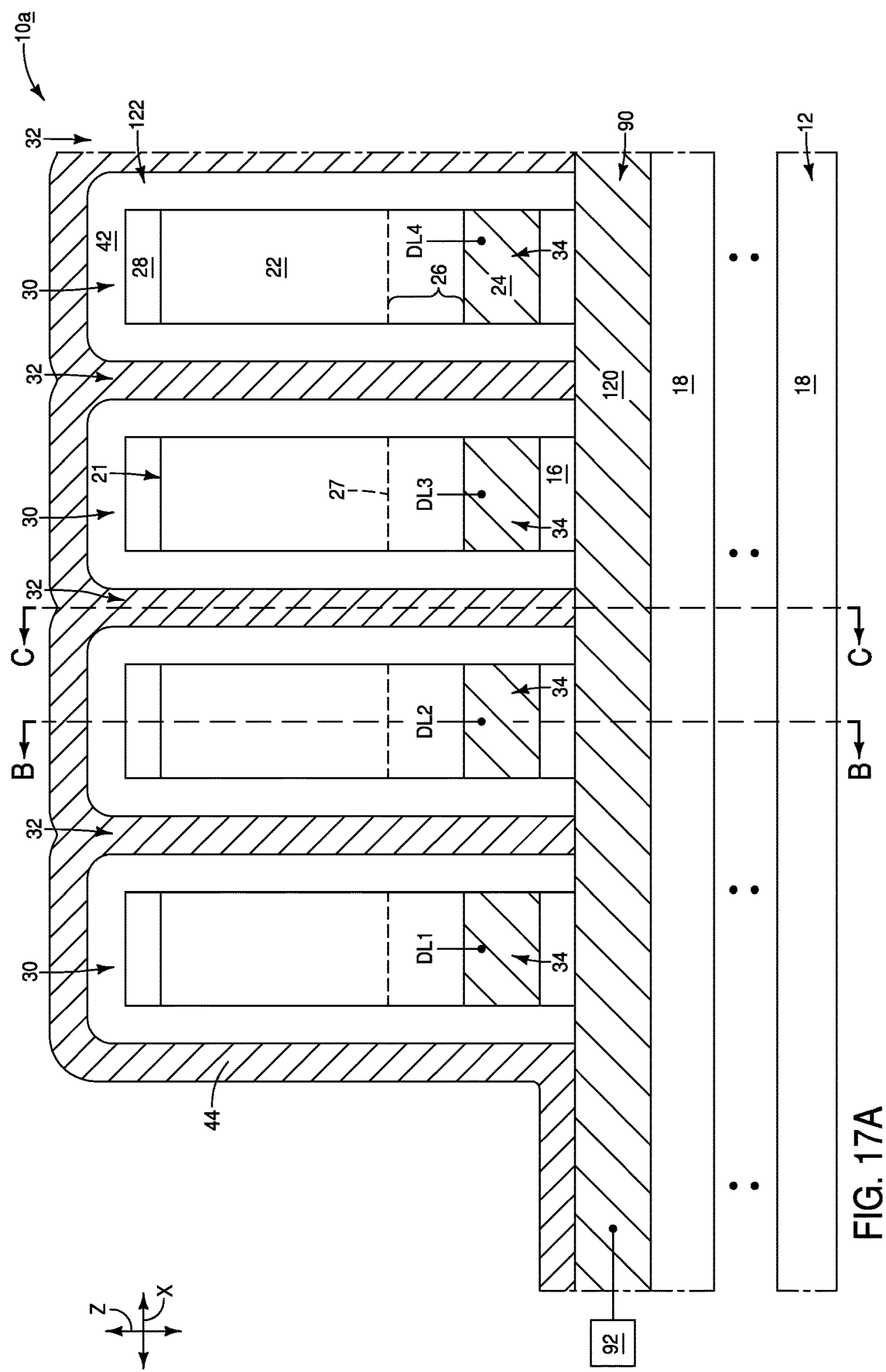
FIG. 17A is a diagrammatic cross-sectional view along the line A-A of FIG. 17.
Figure 17B:
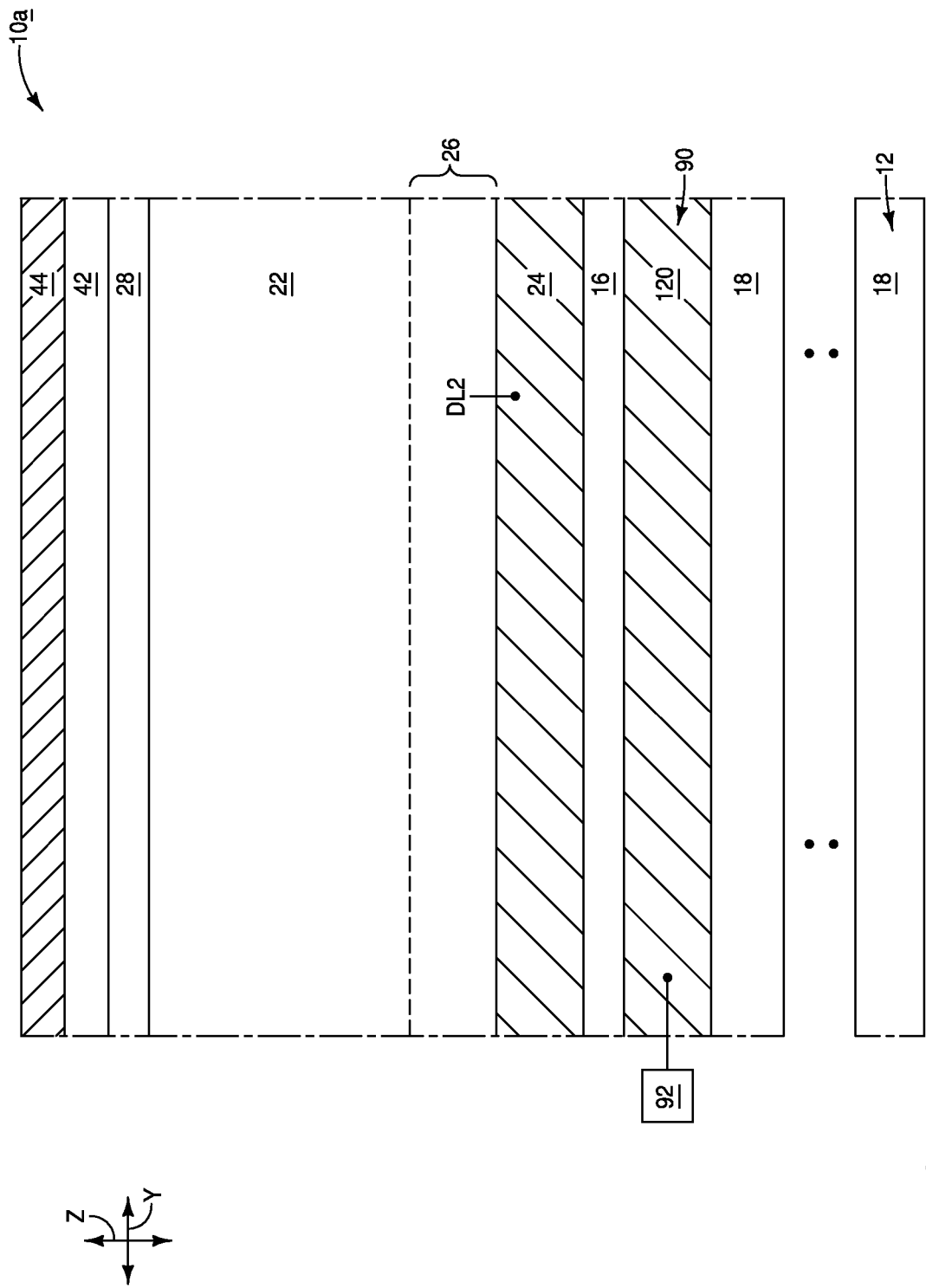
Figure 17C:
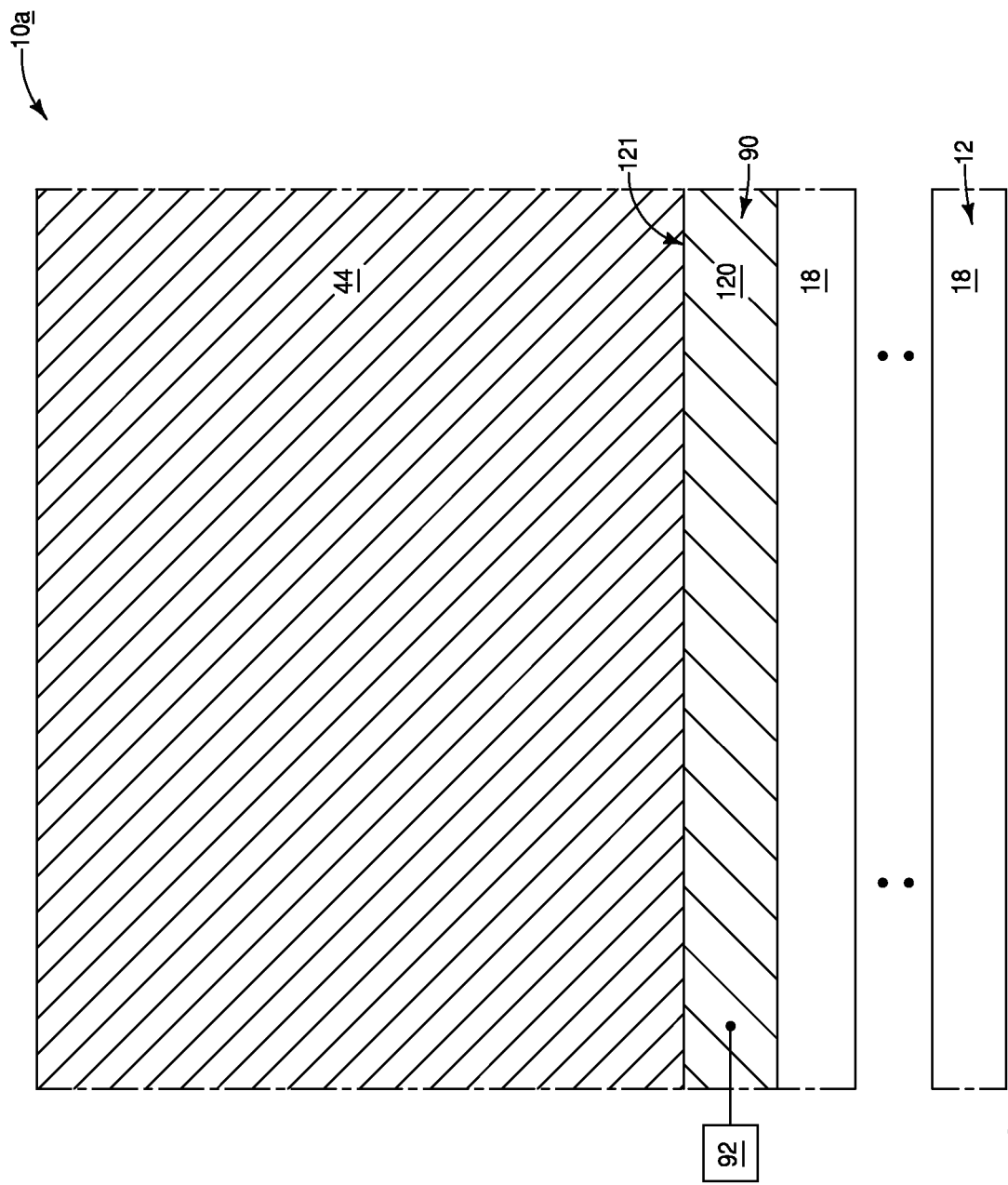

Referring to FIGS. 17-17C, the conductive shield material 44 is formed within the narrowed trenches 32 and directly against the exposed upper surface 121 of the reference structure 90 at the bottoms of the narrowed trenches.

In the illustrated embodiment, the conductive shield material fills the narrowed trenches 32. In some embodiments, the shield material 44 may be considered to substantially fill the narrowed trenches 32; with the term "substantially fill" meaning that the shield material 44 fills the trenches to at least a level of the top surfaces 21 of the semiconductor material 22 within the rails 30.

Figure 18:
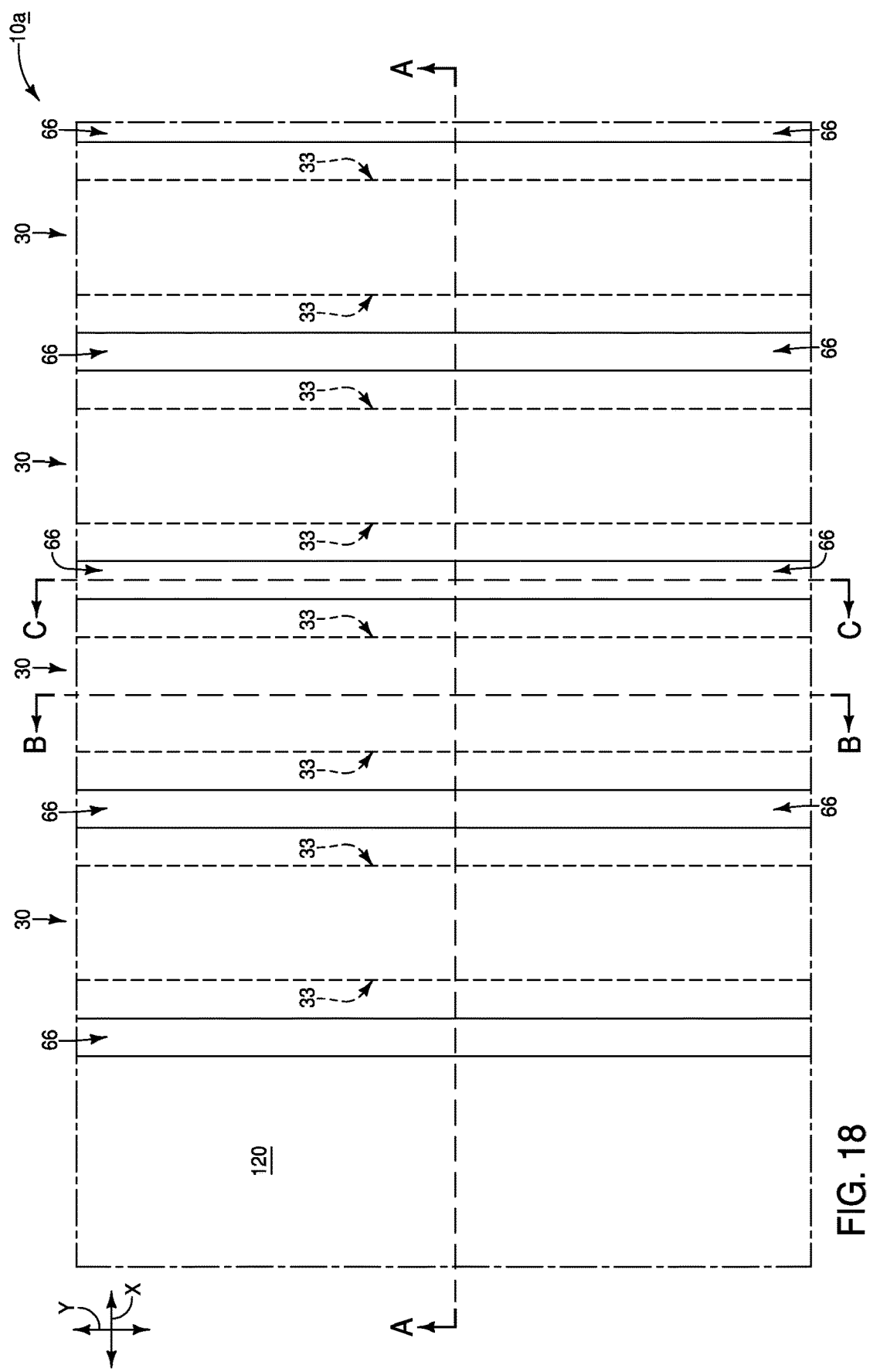
FIGS. 18-18C are diagrammatic views of the region of the example construction of FIGS. 14-14C at an example processing stage subsequent to that of FIGS. 17-17C.
Figure 18A:
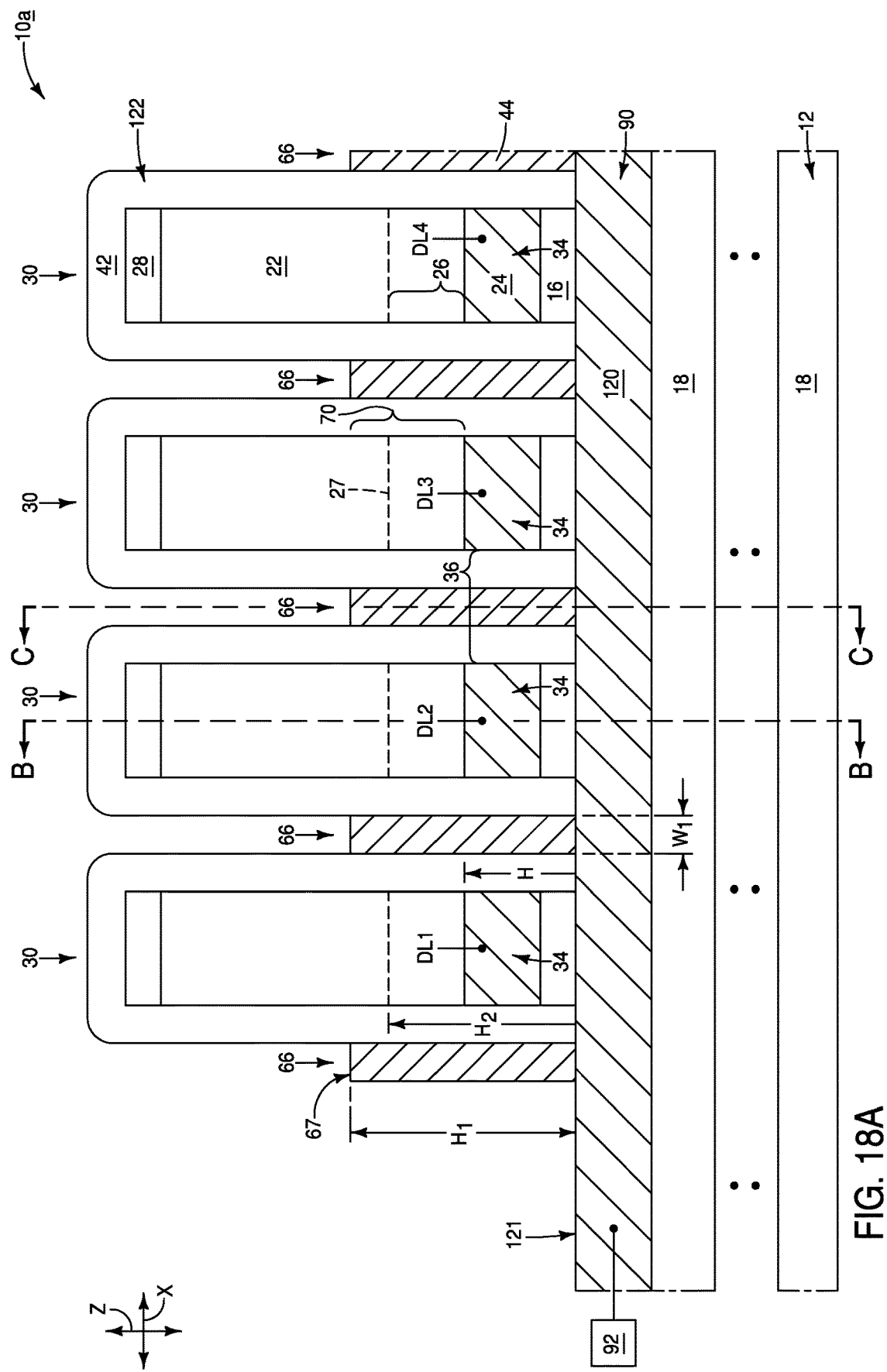
FIG. 18A is a diagrammatic cross-sectional view along the line A-A of FIG. 18.
Figure 18B:
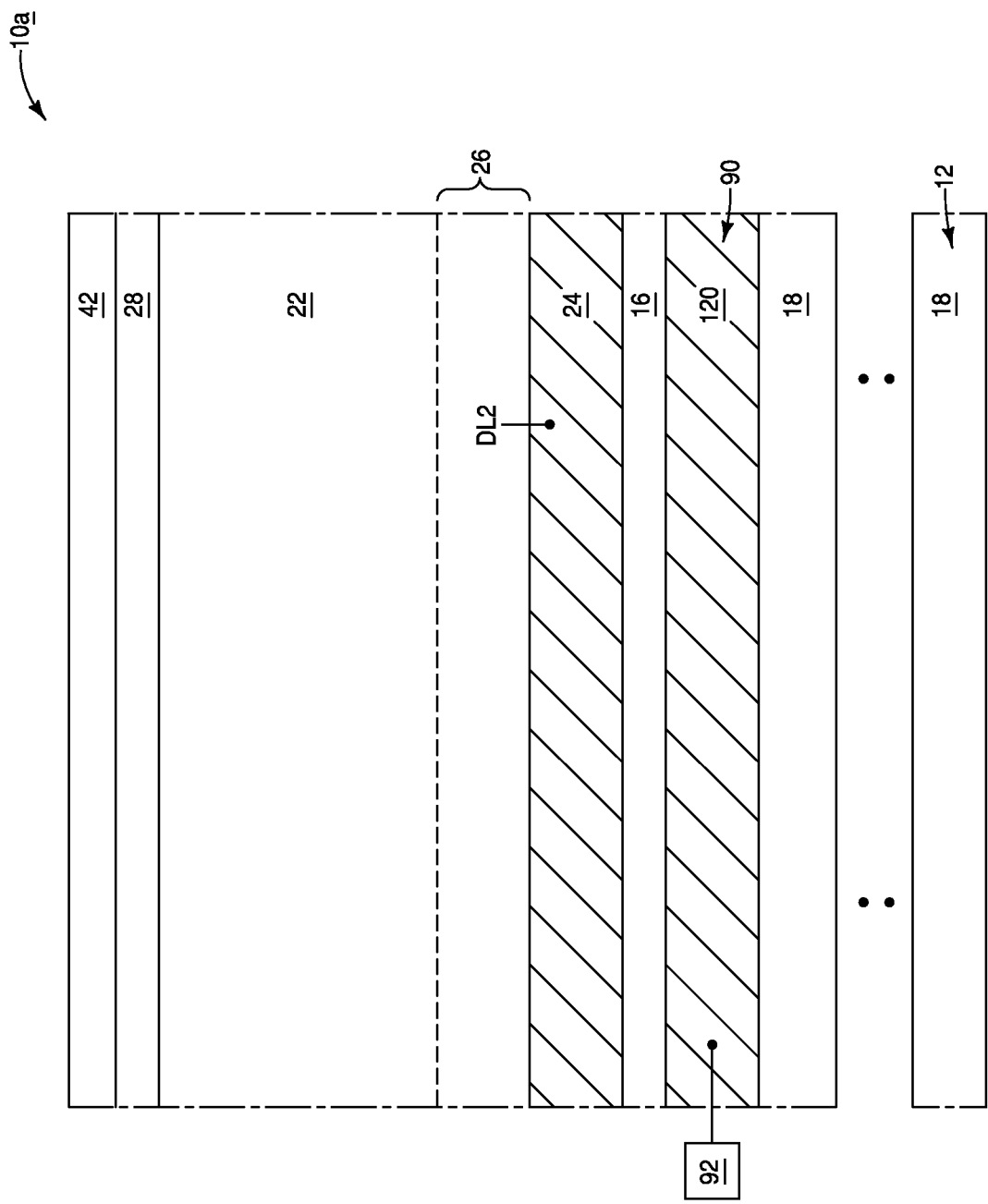
Figure 18C:
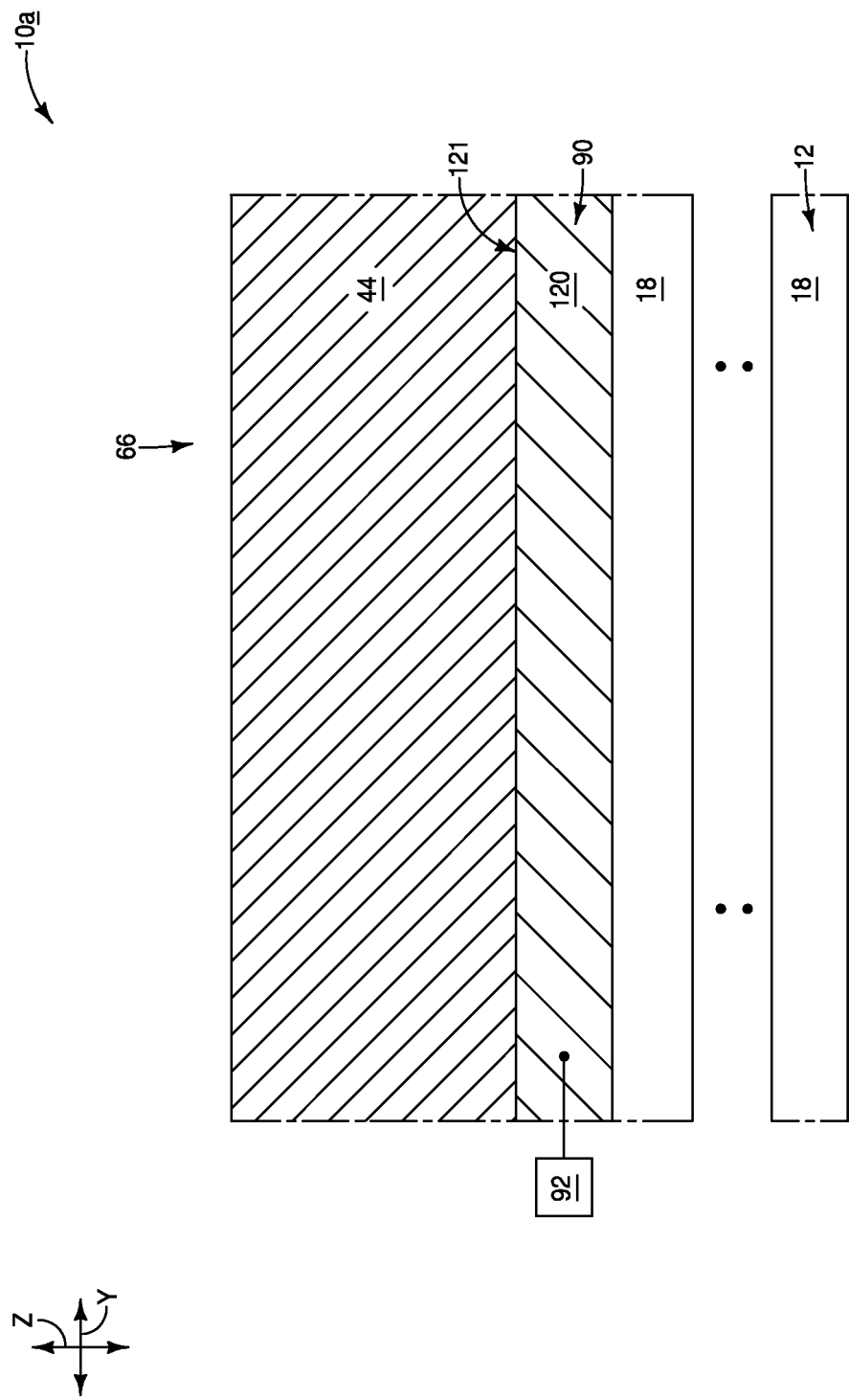

Referring to FIGS. 18-18C, the shield material 44 is recessed (i.e., reduced in height) to form the conductive shield lines 66; with the conductive shield lines extending along the first direction of the y-axis. In the shown embodiment, the conductive shield lines vertically overlap the entire height of the digit lines (e.g., DL1), and vertically overlap lower segments 70 of the semiconductor material 22. In some embodiments, the digit lines (e.g., DL4) may be considered to extend to the first height H above the reference structure 90, and the shield lines 66 may be considered to comprise top surfaces 67 which are at the second height $H_1$ above the reference structure. The second height $H_1$ may be greater than or equal to the first height H. The doped regions 26 may be considered to extend to the third height H₂, and the second height H₁ may also be greater than or equal to the third height H₂.

Figure 16A:
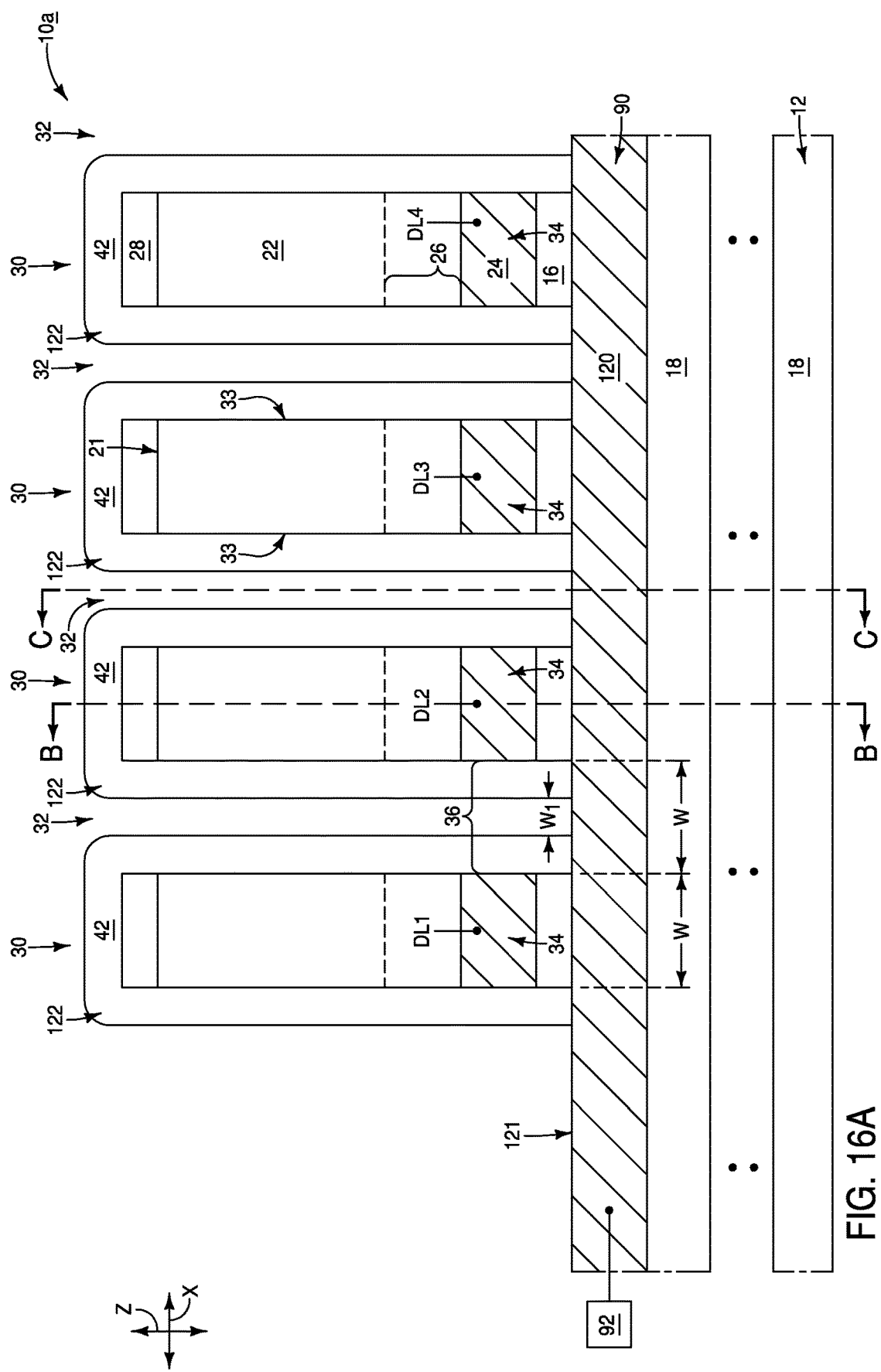
FIG. 16A is a diagrammatic cross-sectional view along the line A-A of FIG. 16.
Figure 16B:
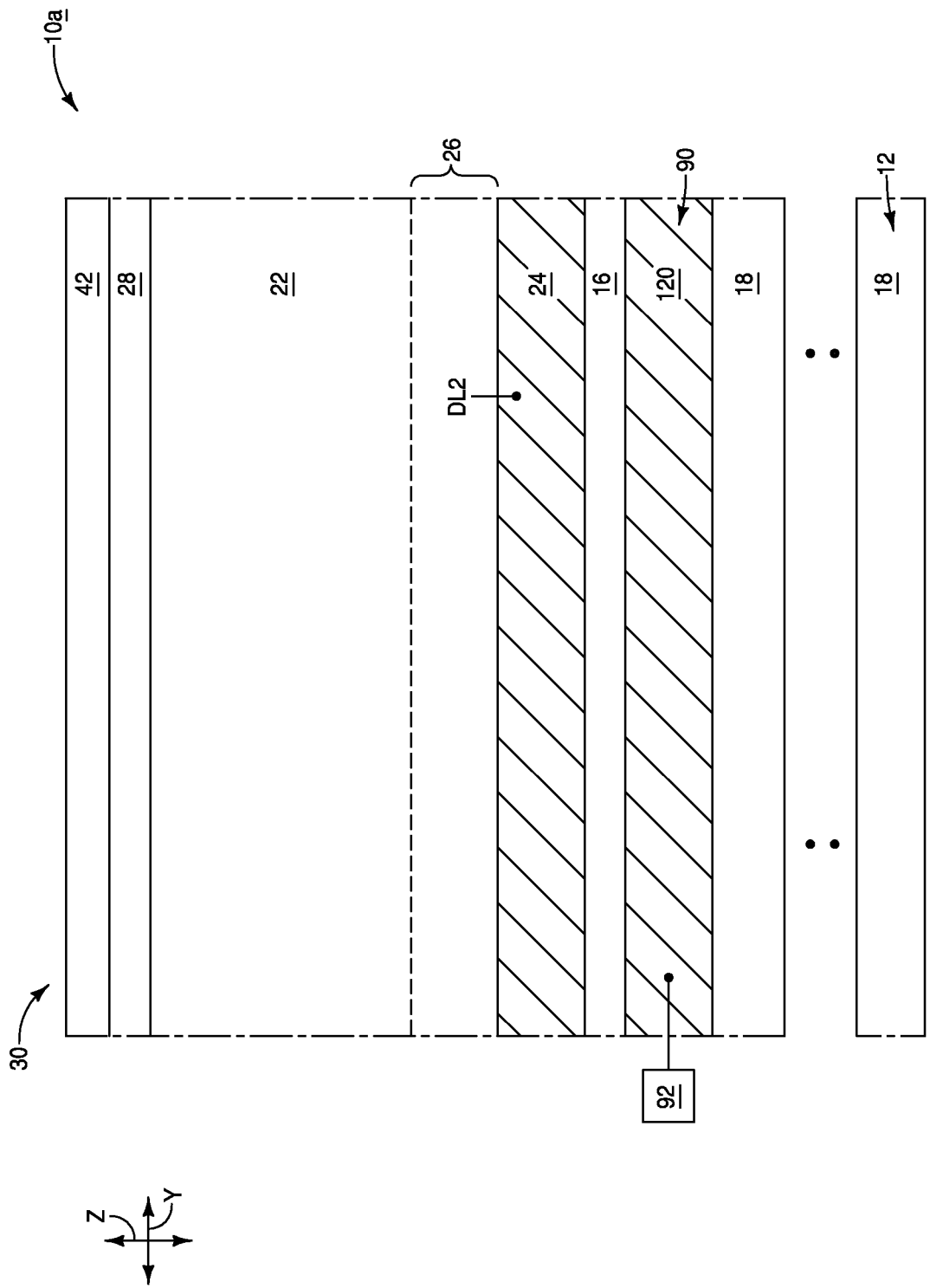

The shield lines 66 within the intervening regions 36 have horizontal widths corresponding to the width W₁ described above with reference to FIG. 16A.

Figure 19:
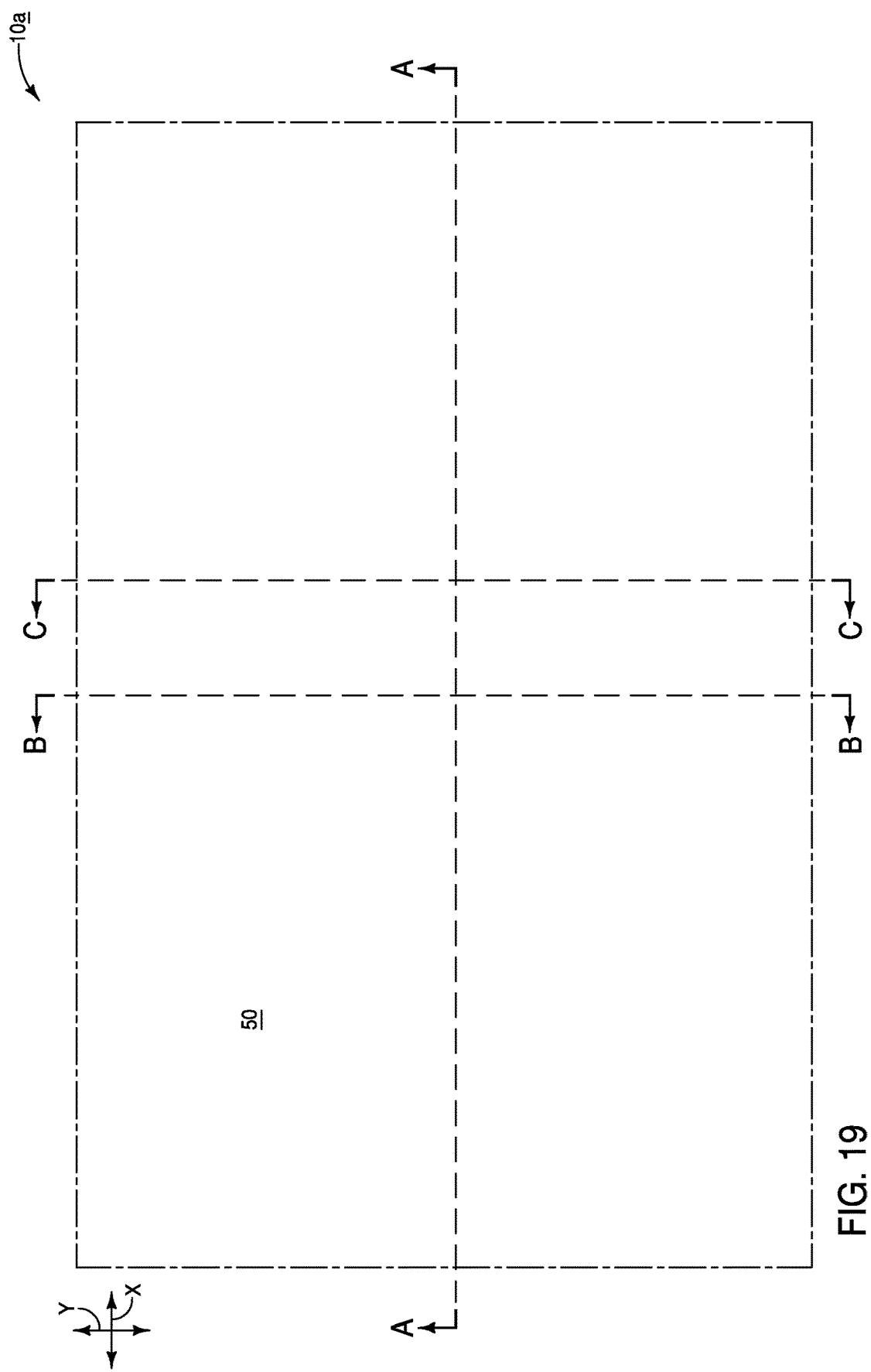
FIGS. 19-19C are diagrammatic views of the region of the example construction of FIGS. 14-14C at an example processing stage subsequent to that of FIGS. 18-18C.
Figure 19A:
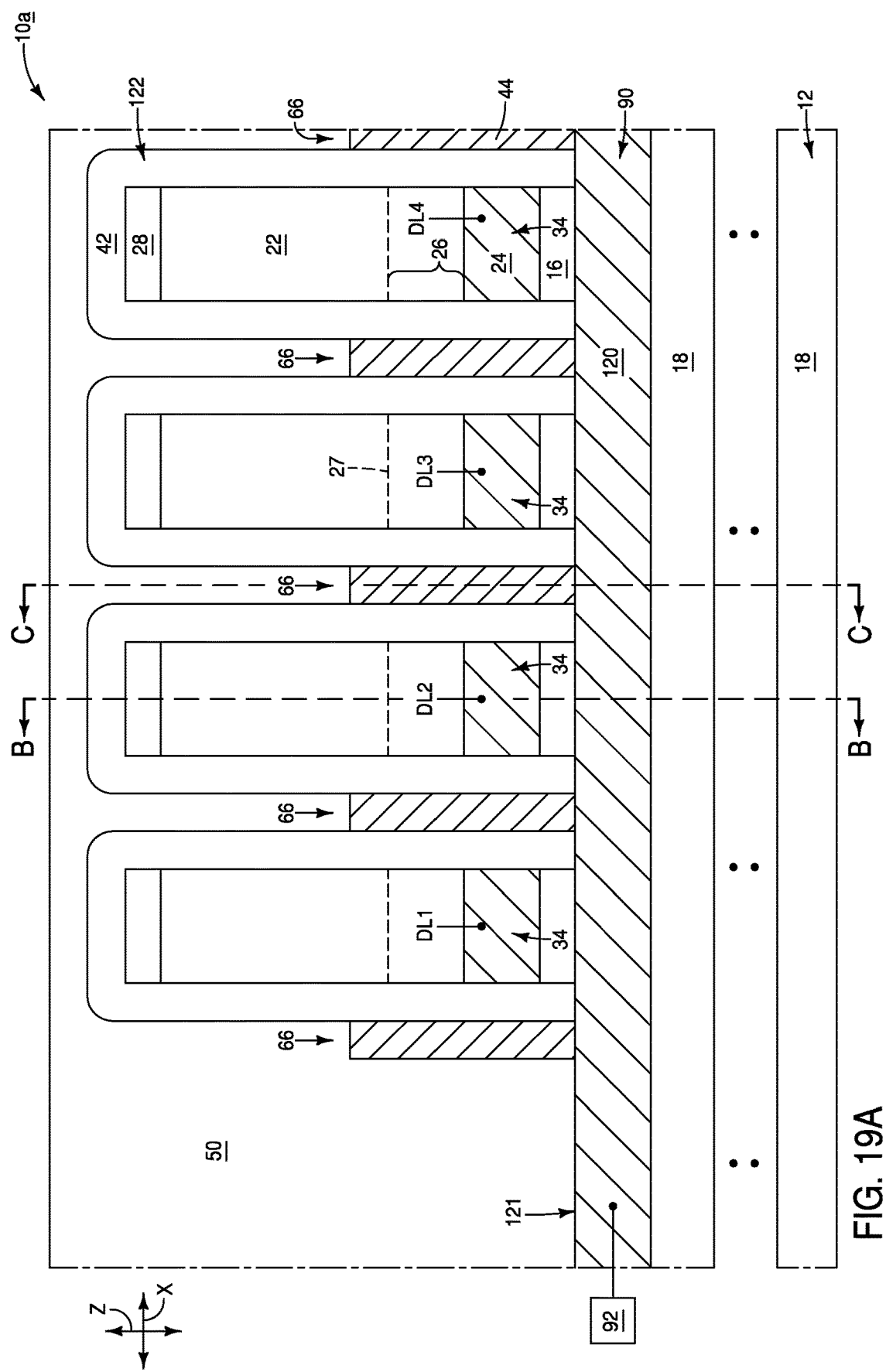
FIG. 19A is a diagrammatic cross-sectional view along the line A-A of FIG. 19.
Figure 19B:
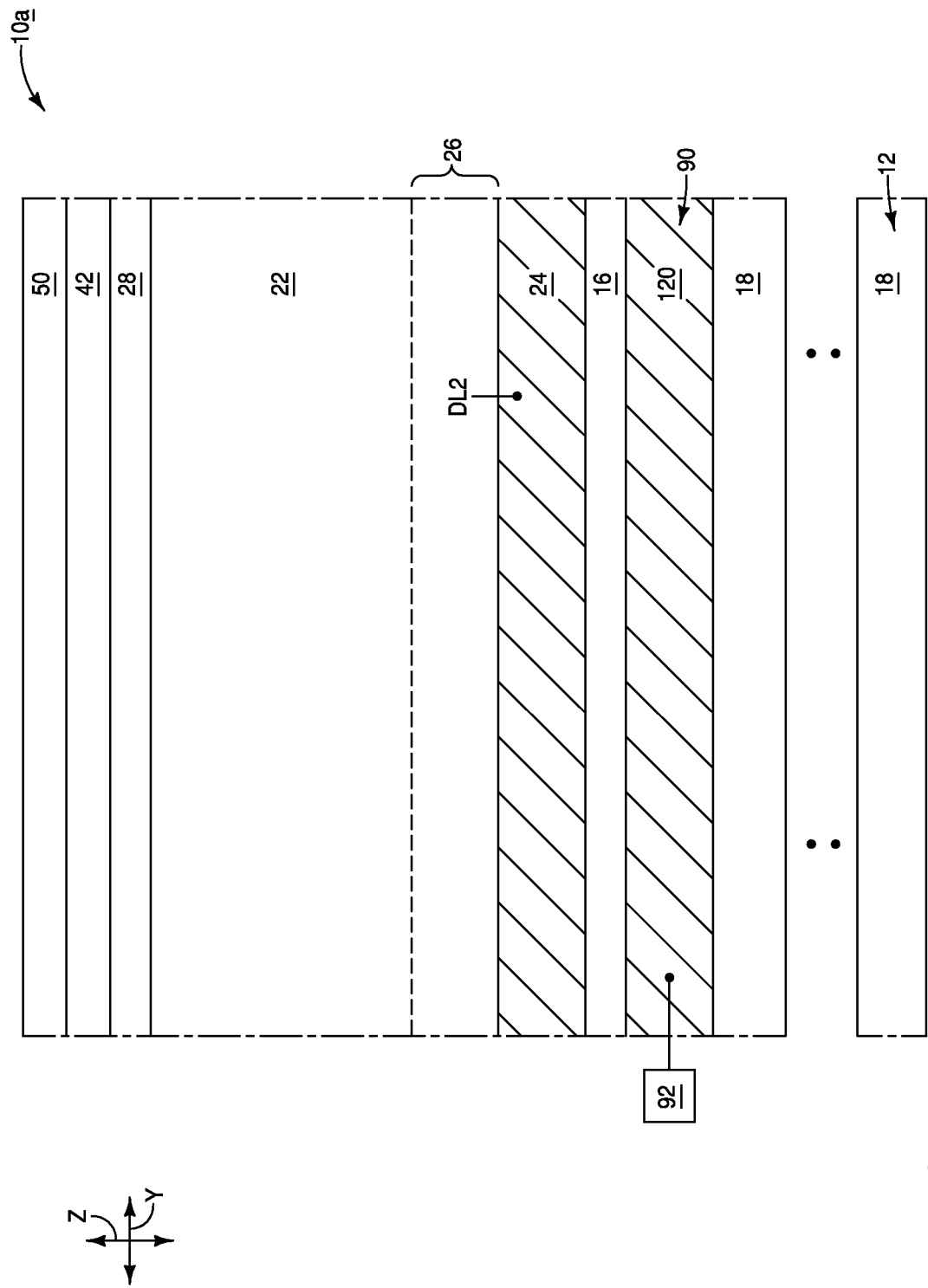
Figure 19C:
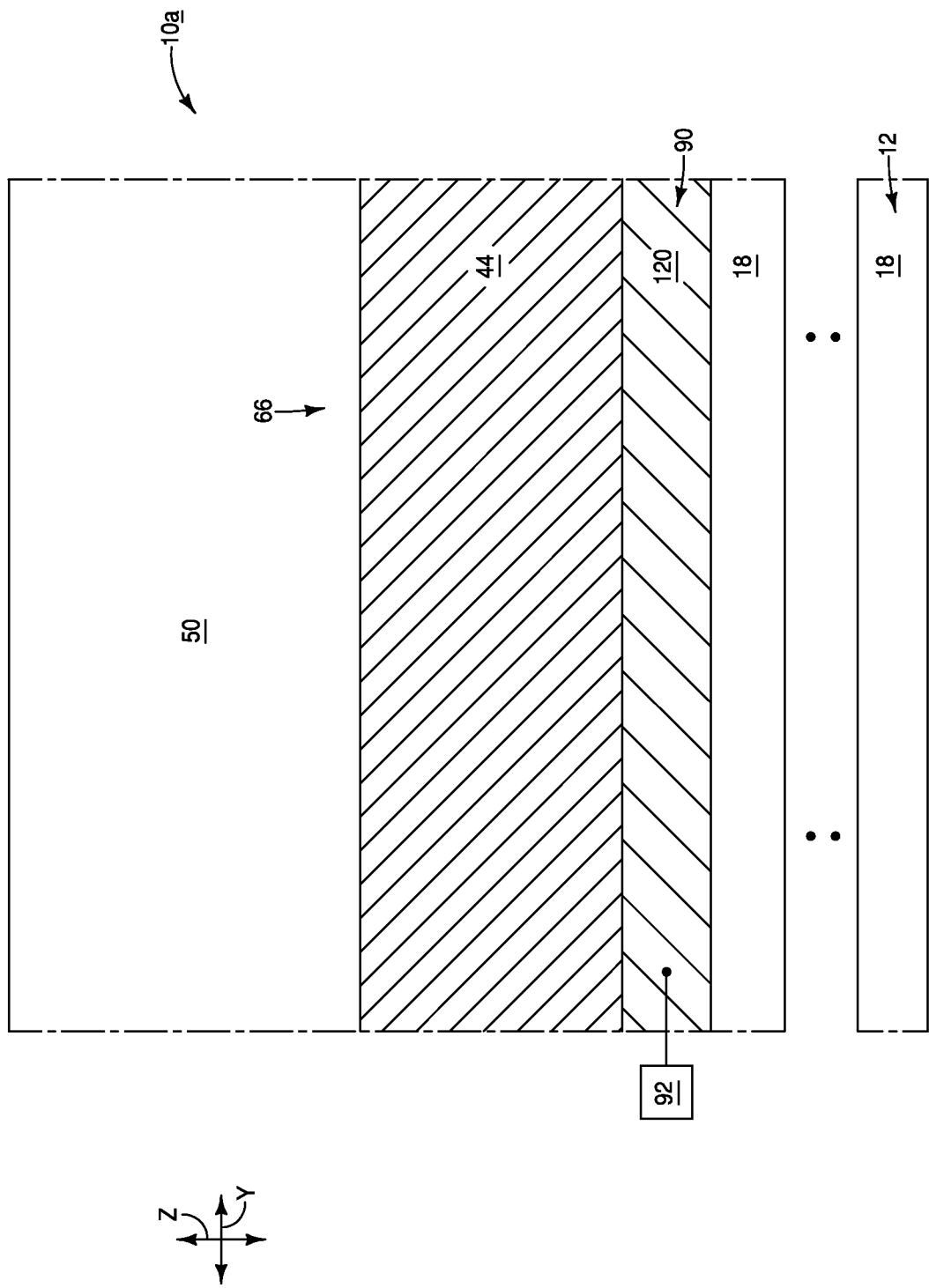

Referring to FIGS. 19-19C, additional insulative material 50 is formed over the conductive shield lines 66. The additional insulative material 50 may comprise any suitable composition(s); and in some embodiments may comprise silicon dioxide. The silicon dioxide may be formed with a spin-on-dielectric (SOD) process. The additional insulative material 50 may comprise a same composition as the insulative material 42, or may be a different composition than the insulative material 42.

Figure 20:
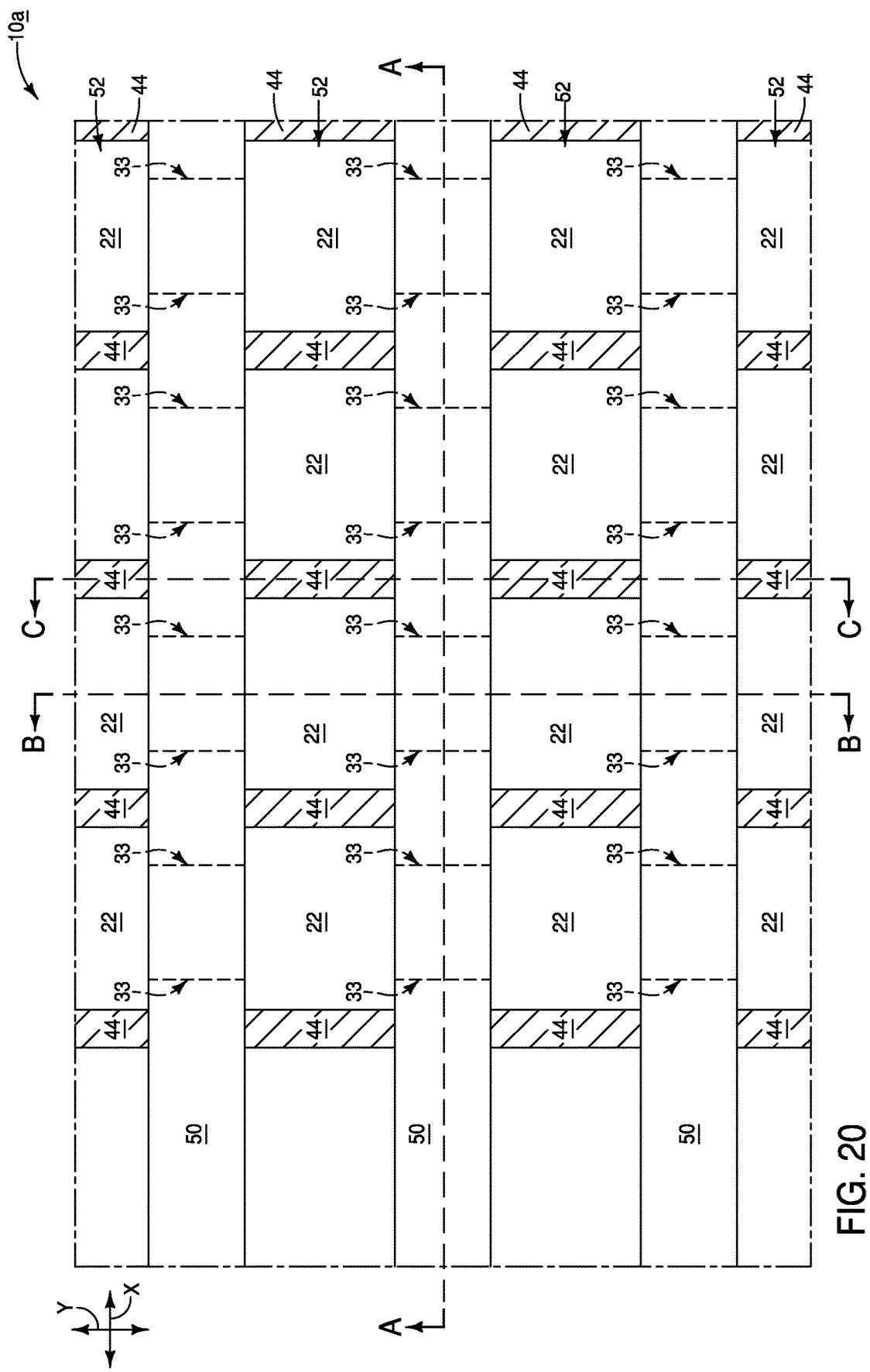
Figure 20A:
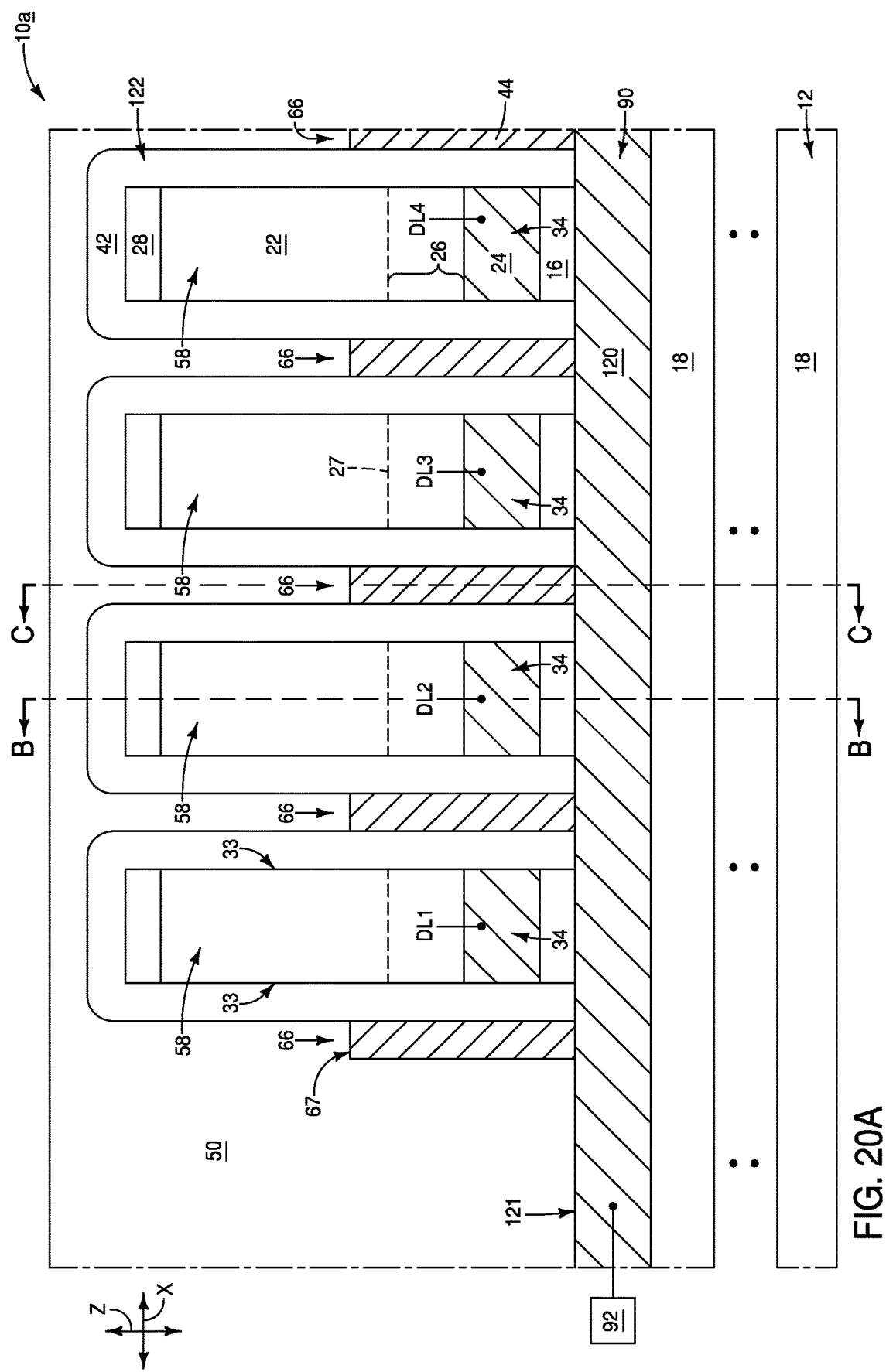
FIG. 20A is a diagrammatic cross-sectional view along the line A-A of FIG. 20.
Figure 20B:
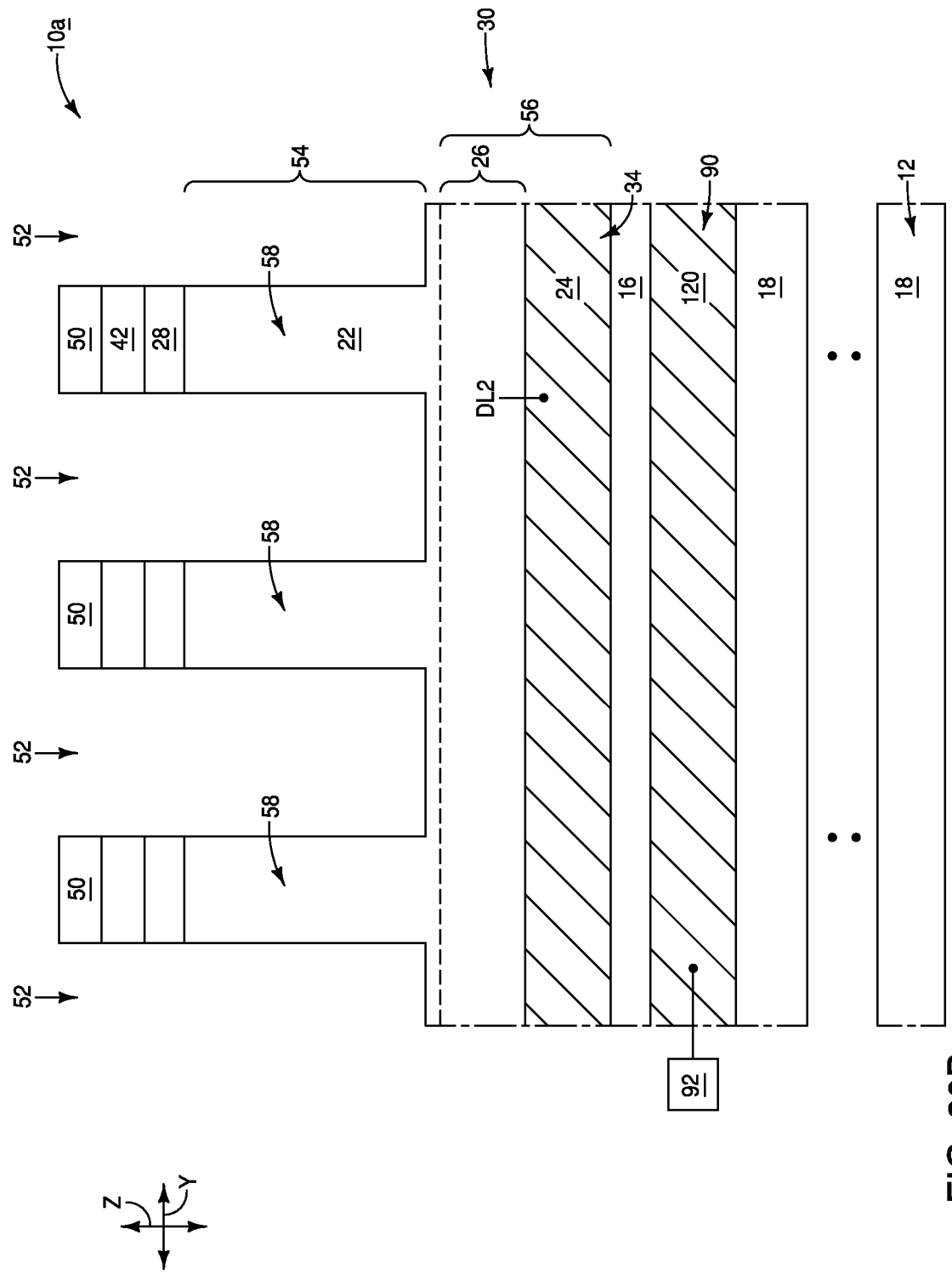

Referring to FIGS. 20-20C, the second trenches 52 are formed to extend along the second direction (i.e., the x-axis direction). The second trenches 52 pattern upper regions 54 of the rails 30, and do not pattern lower regions 56 of the rails (as shown in FIG. 20B); and the digit lines (e.g., DL2) remain within the unpatterned lower regions 56 of the rails.

The patterned upper regions 54 include vertically-extending pillars 58 of the semiconductor material 22, with such pillars being over the digit lines 34.

Figure 21:
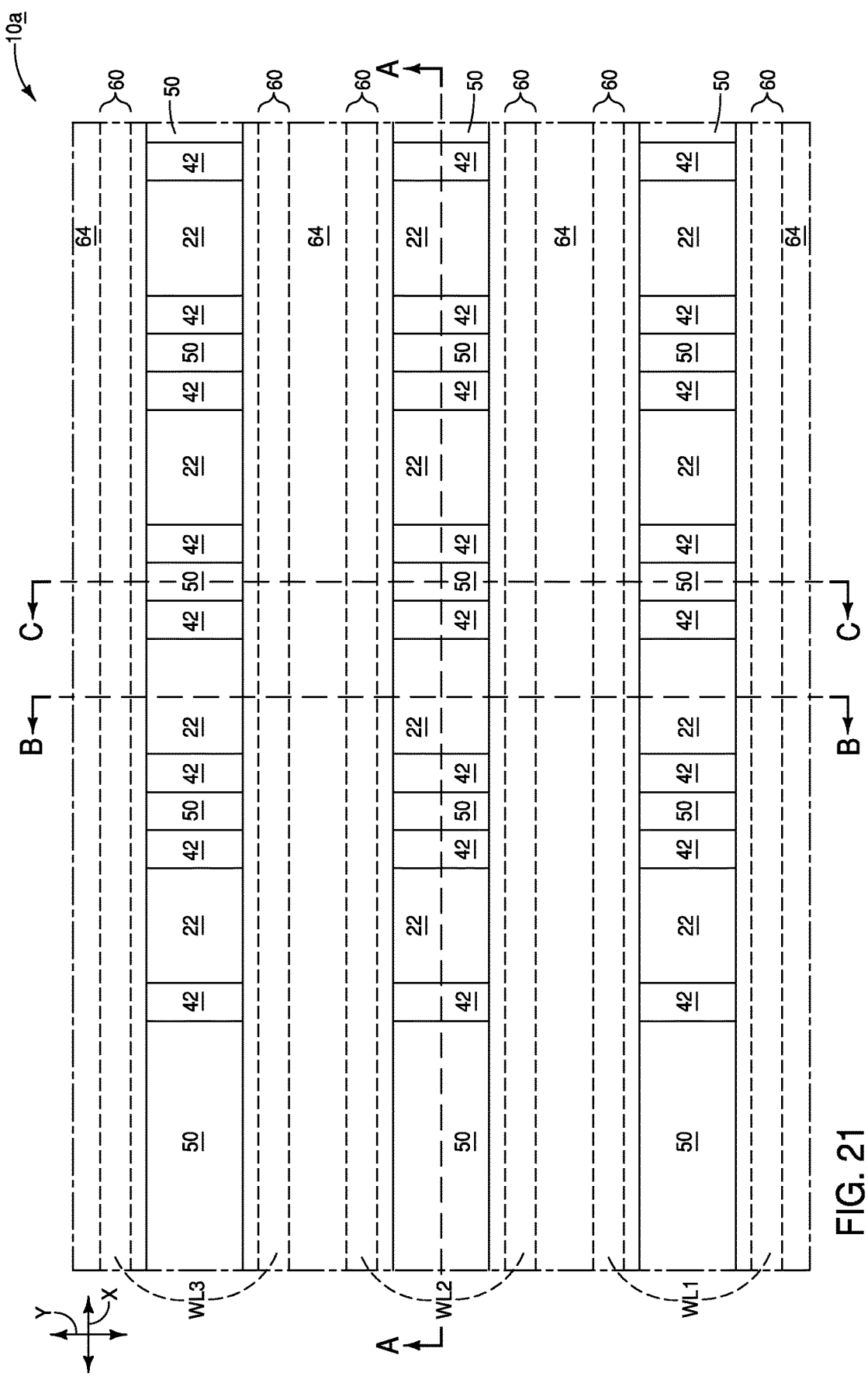
FIGS. 21-21C are diagrammatic views of the region of the example construction of FIGS. 14-14C at an example processing stage subsequent to that of FIGS. 20-20C.
Figure 21A:
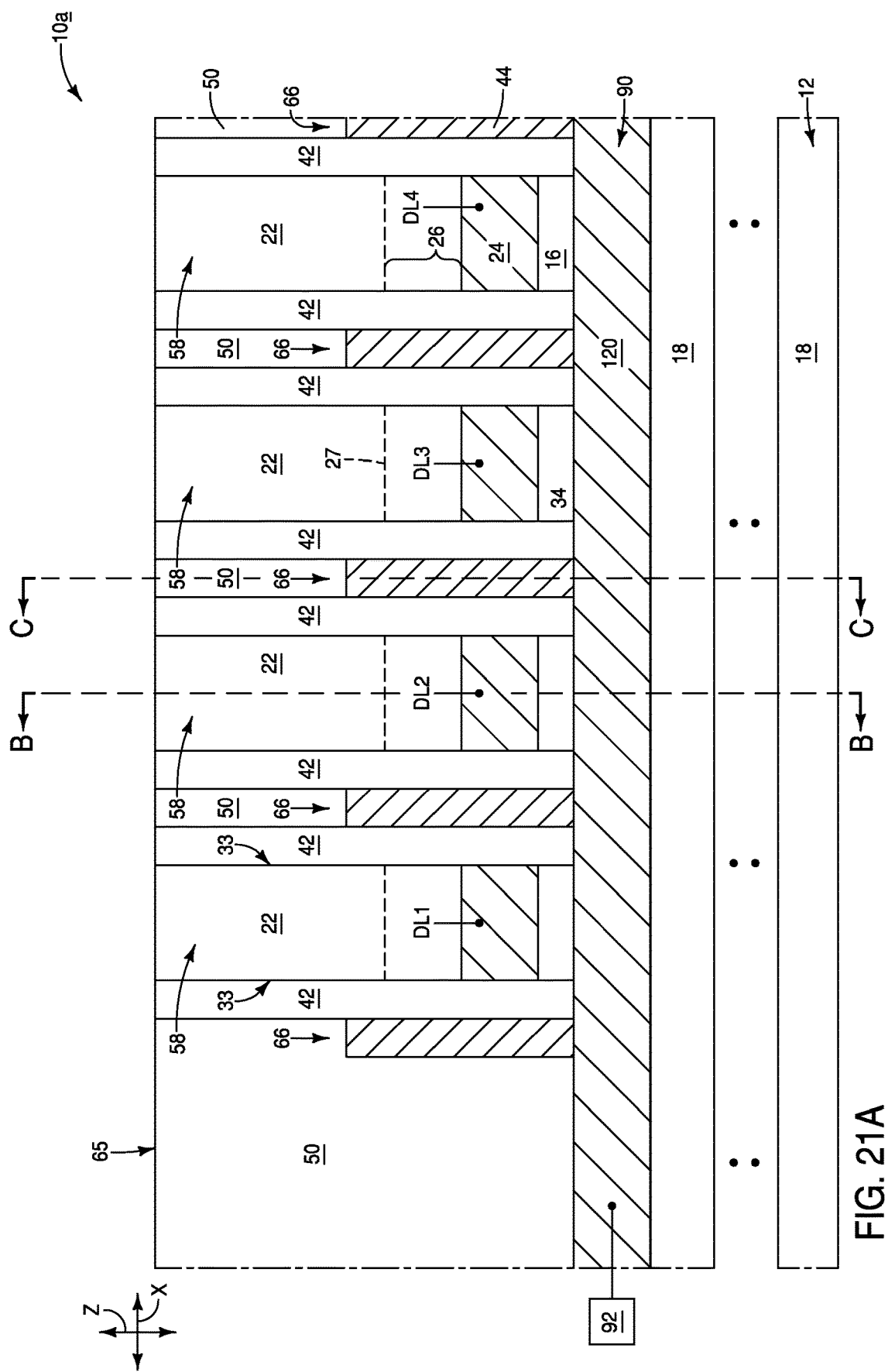
FIG. 21A is a diagrammatic cross-sectional view along the line A-A of FIG. 21.
Figure 21B:
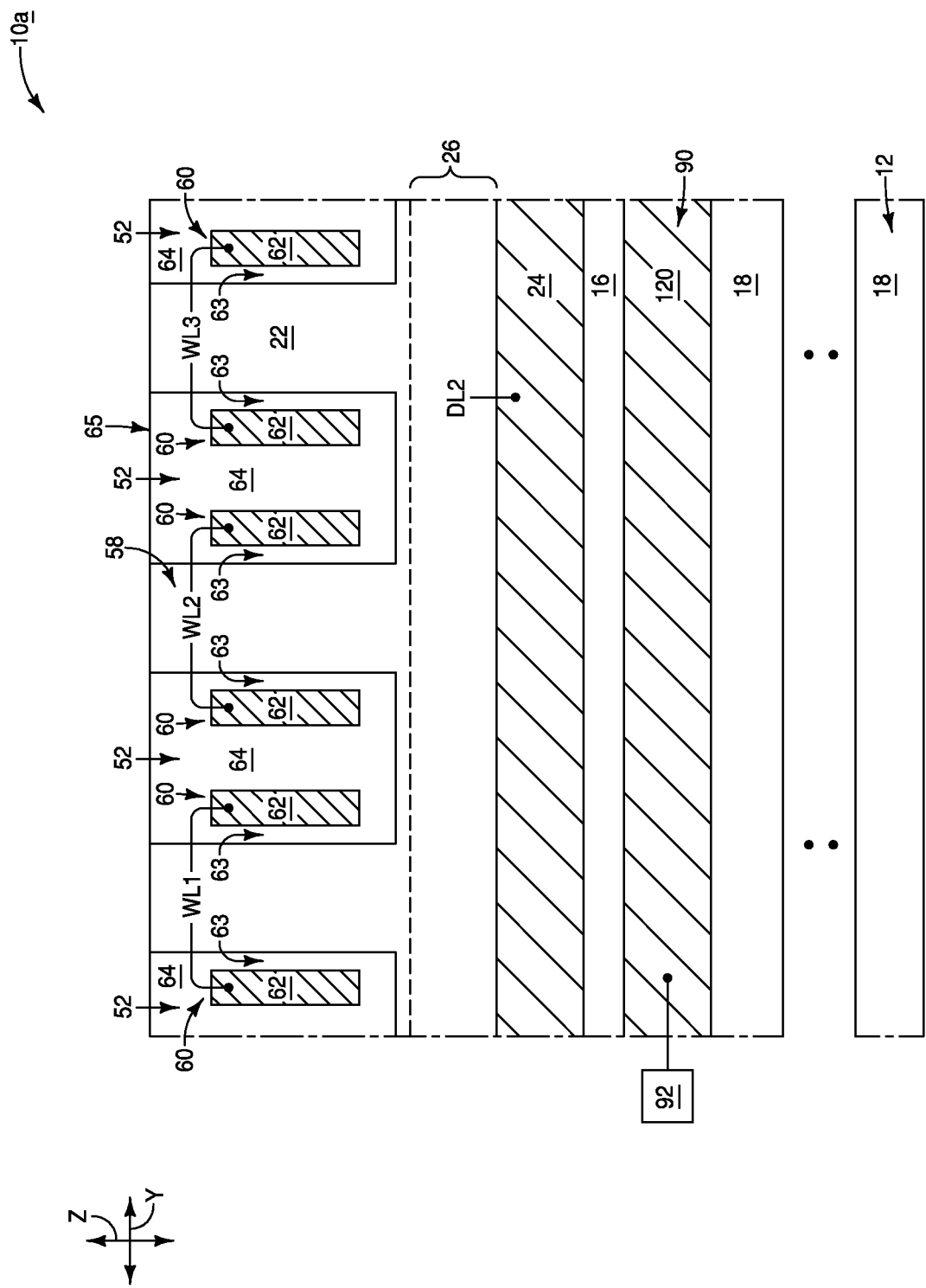
Figure 21C:
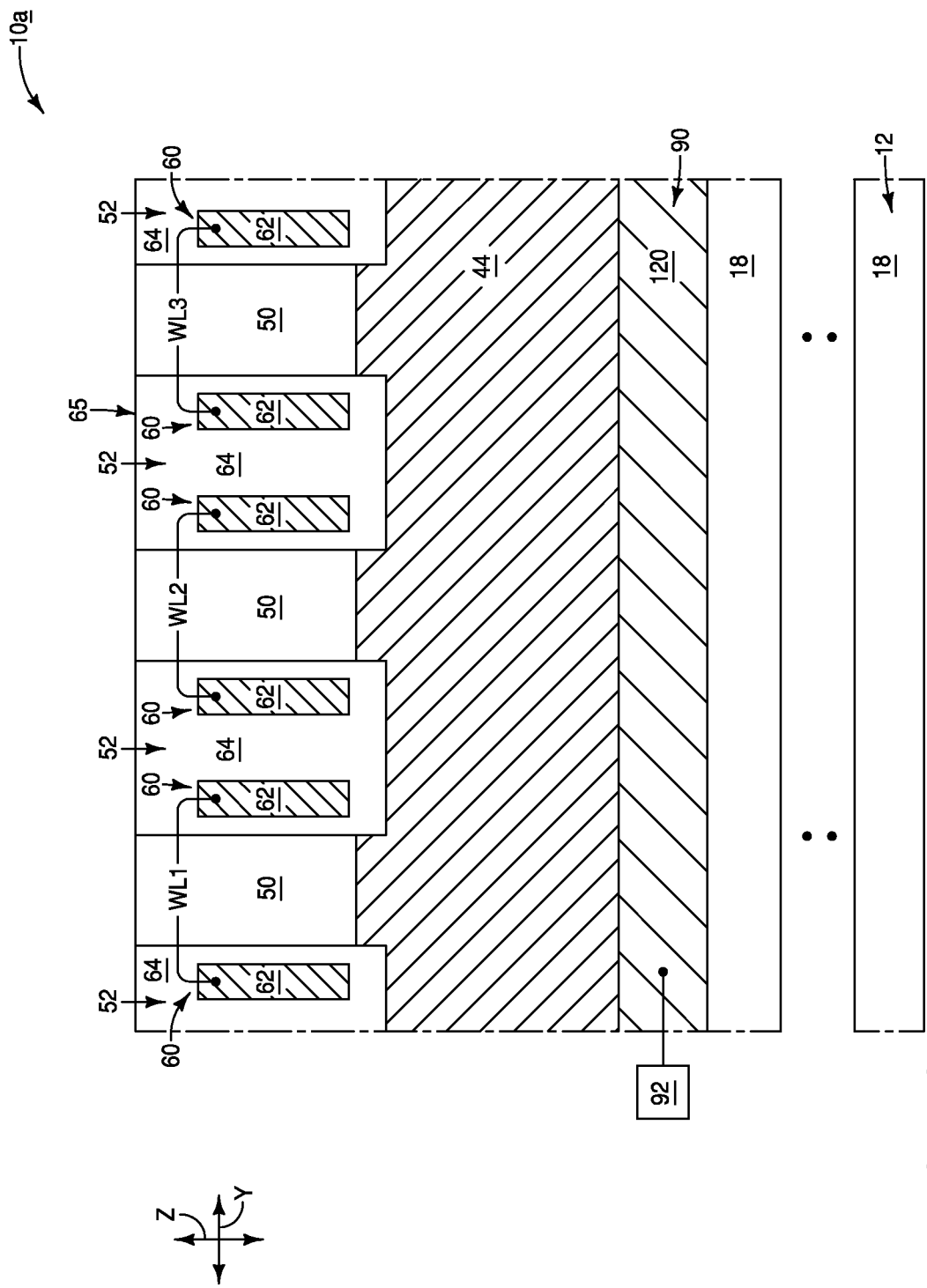

Referring to FIGS. 21-21C, the wordlines 60 are formed within the second trenches 52. The wordlines comprise the conductive wordline material 62.

The insulative material 64 is also provided within the second trenches 52, and the wordlines 60 are embedded within such insulative material. The insulative material 64 may comprise any suitable composition(s); and in some embodiments may comprise one or both of silicon dioxide and silicon nitride.

The gate dielectric material (or gate insulative material) 63 is provided between the wordlines and the semiconductor pillars 58.

The wordlines 60 are shown to correspond to wordlines WL1, WL2 and WL3.

Construction 10 is subjected to planarization (e.g., CMP) to form a planarized upper surface 65 extending across the insulative materials 42, 50 and 64, and across the semiconductor material 22.

Figure 22:
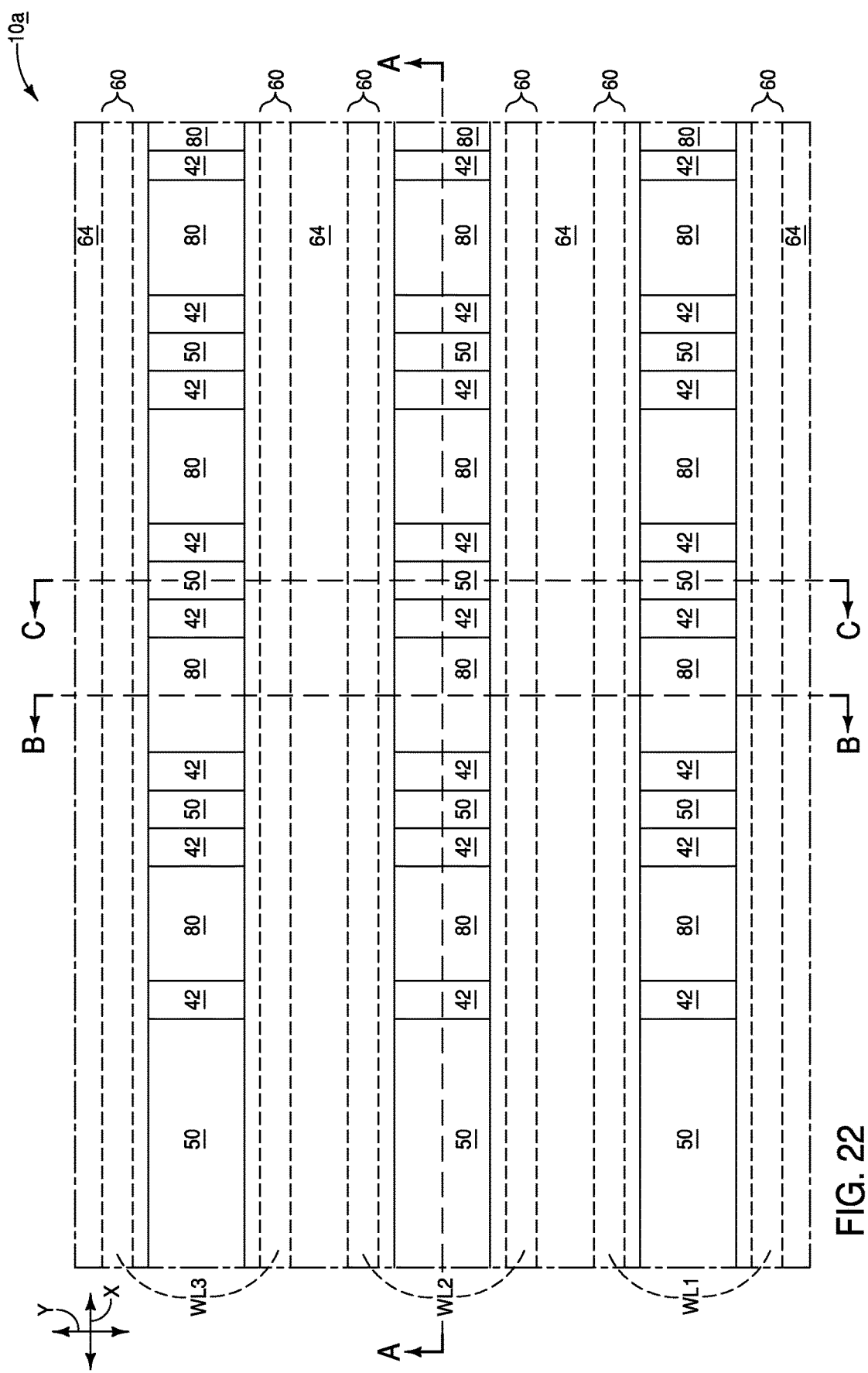
FIGS. 22-22C are diagrammatic views of the region of the example construction of FIGS. 14-14C at an example processing stage subsequent to that of FIGS. 21-21C.
Figure 22A:
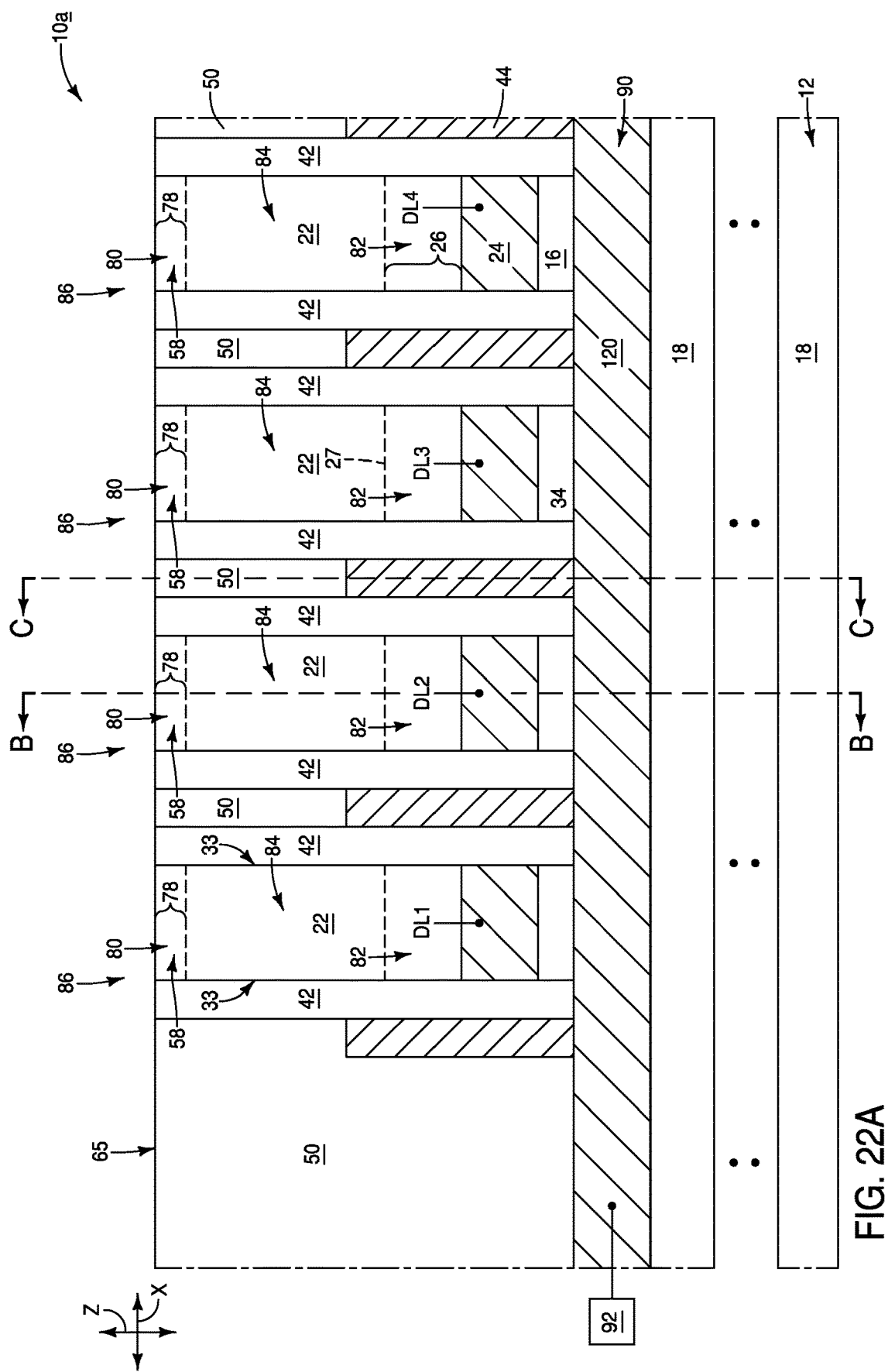
FIG. 22A is a diagrammatic cross-sectional view along the line A-A of FIG. 22.
Figure 22B:
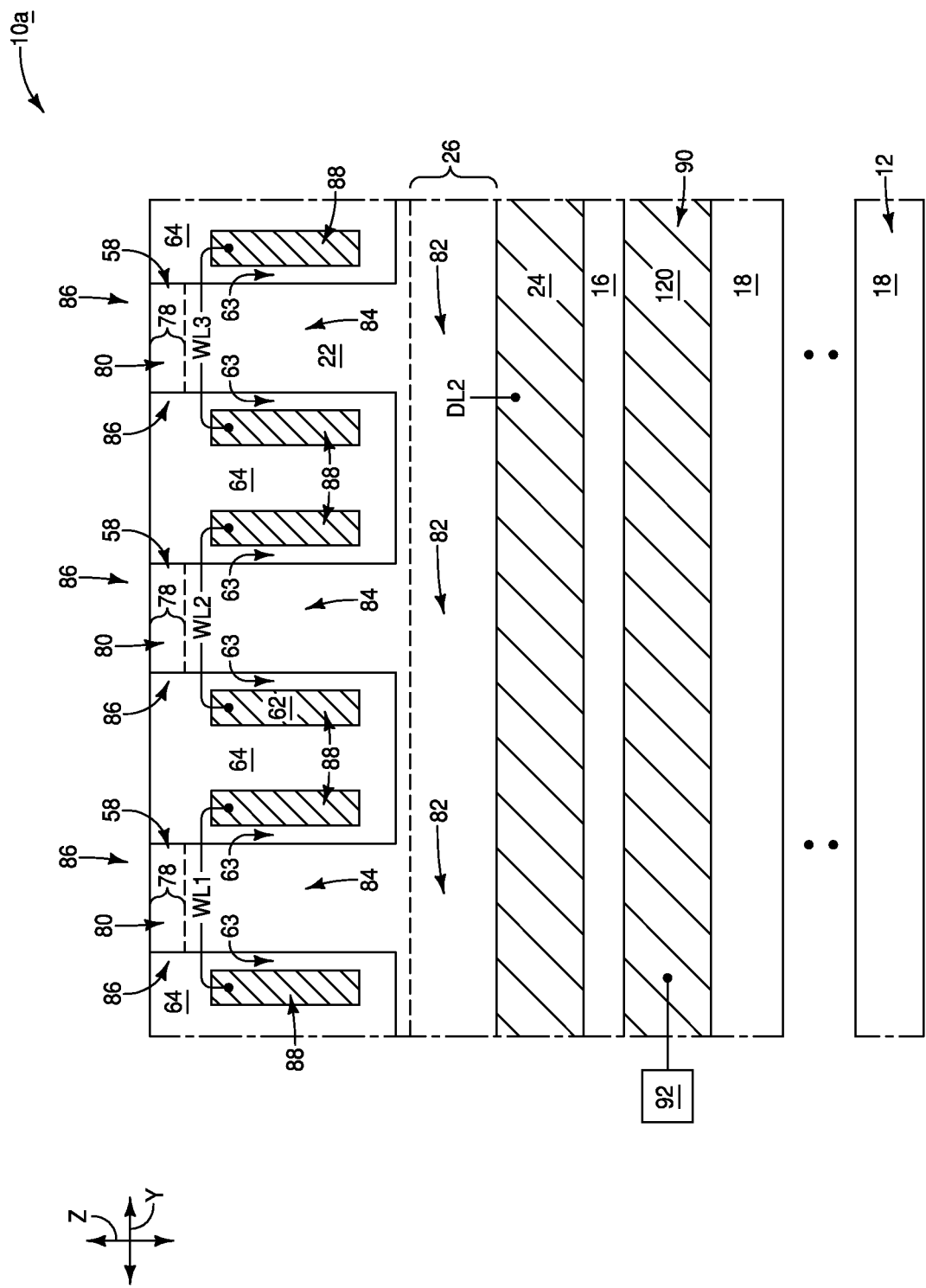
Figure 22C:
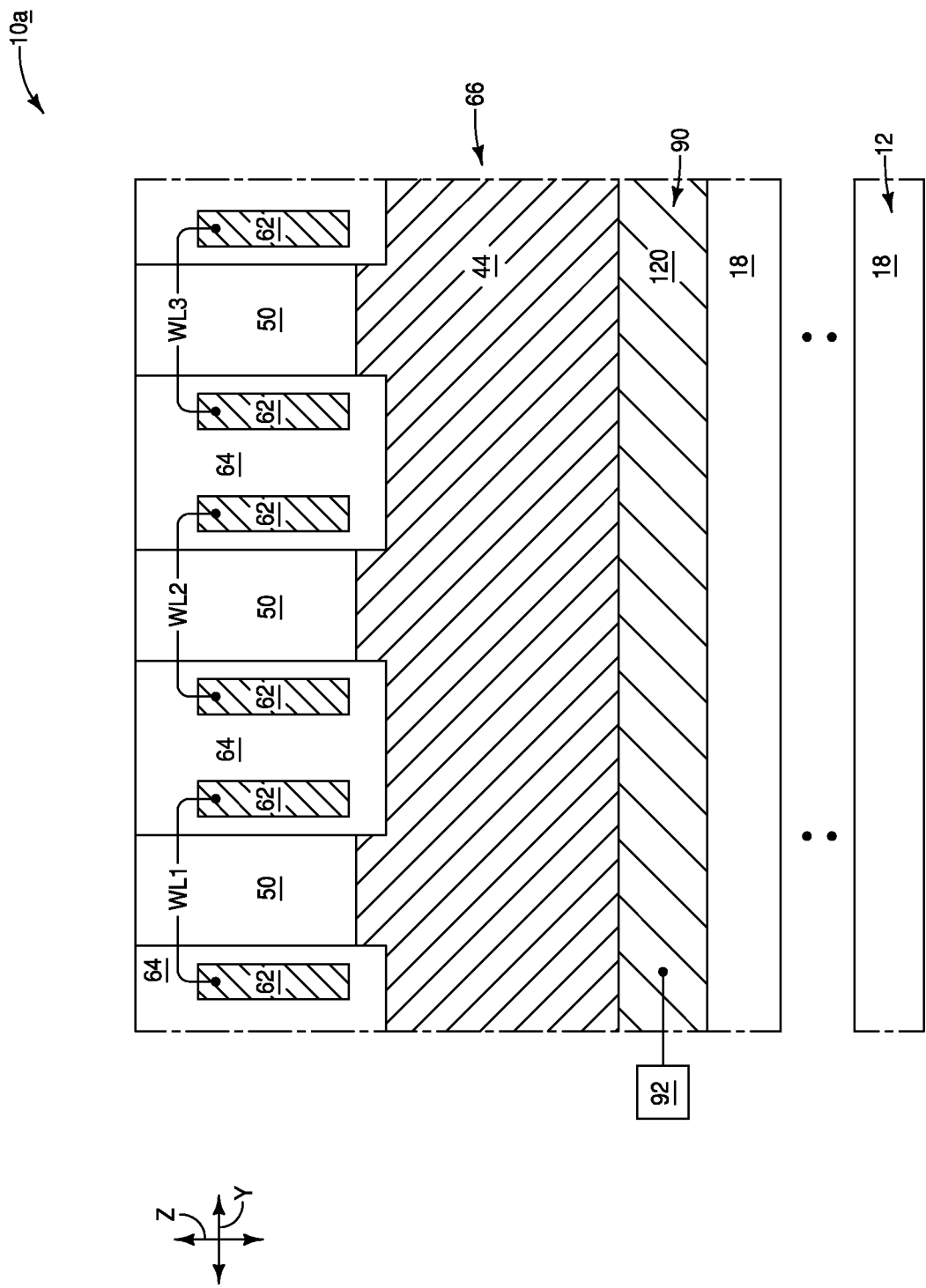

Referring to FIGS. 22-22C, the top sections 78 of the semiconductor material pillars 58 are doped. The top sections 78 may be doped with the same type dopant as is utilized in the bottom section 26. The doped top sections 78 form upper source/drain regions 80 of transistors 86, and the doped bottom sections 26 form lower source/drain regions 82 of the transistors. Transistor channel regions 84 are within the semiconductor pillars 58 and extend vertically between the lower source/drain regions 82 and the upper source/drain regions 80. The wordlines (e.g., WL3) are adjacent the channel regions, and are spaced from the channel regions by the gate dielectric material 63. The wordlines comprise gates of the transistors 86 and may be utilized to gatedly couple the source/drain regions 80 and 82 of individual transistors to one another through the channel regions 84. FIG. 22B shows gates 88 along the wordlines 60, with such gates corresponding to regions of the wordlines adjacent the channel regions 84. In some embodiments, the gates 88 may be considered to correspond to gate regions of the wordlines 60.

The shield lines 66 may be utilized to alleviate, and even prevent, undesired parasitic capacitance between adjacent digit lines (e.g., parasitic capacitance between the digit lines DL1 and DL2), in manner analogous to that described above with reference to FIG. 9.

In the embodiment of FIGS. 14-22, the bottom sections 26 of the semiconductor material 22 are doped prior to forming the wordlines 60 (specifically, are shown to be doped at the processing stage of FIG. 14), and the top sections 78 of the semiconductor material 22 are doped after forming the wordlines 60 (specifically, are doped at the processing stage of FIG. 22). In other embodiments the top and bottom sections 26 and 78 may be doped at other process stages. For instance, both the top and bottom sections 26 and 78 may be doped in the semiconductor material 22 at the process stage of FIG. 14.

In the embodiment of FIGS. 14-22, the height of the conductive shield material 44 is reduced prior to forming the wordlines 60. In other embodiments, the height of the conductive shield material may be reduced after forming the wordlines 60 analogously to the embodiment described above with reference to FIGS. 1-10.

Figure 23:
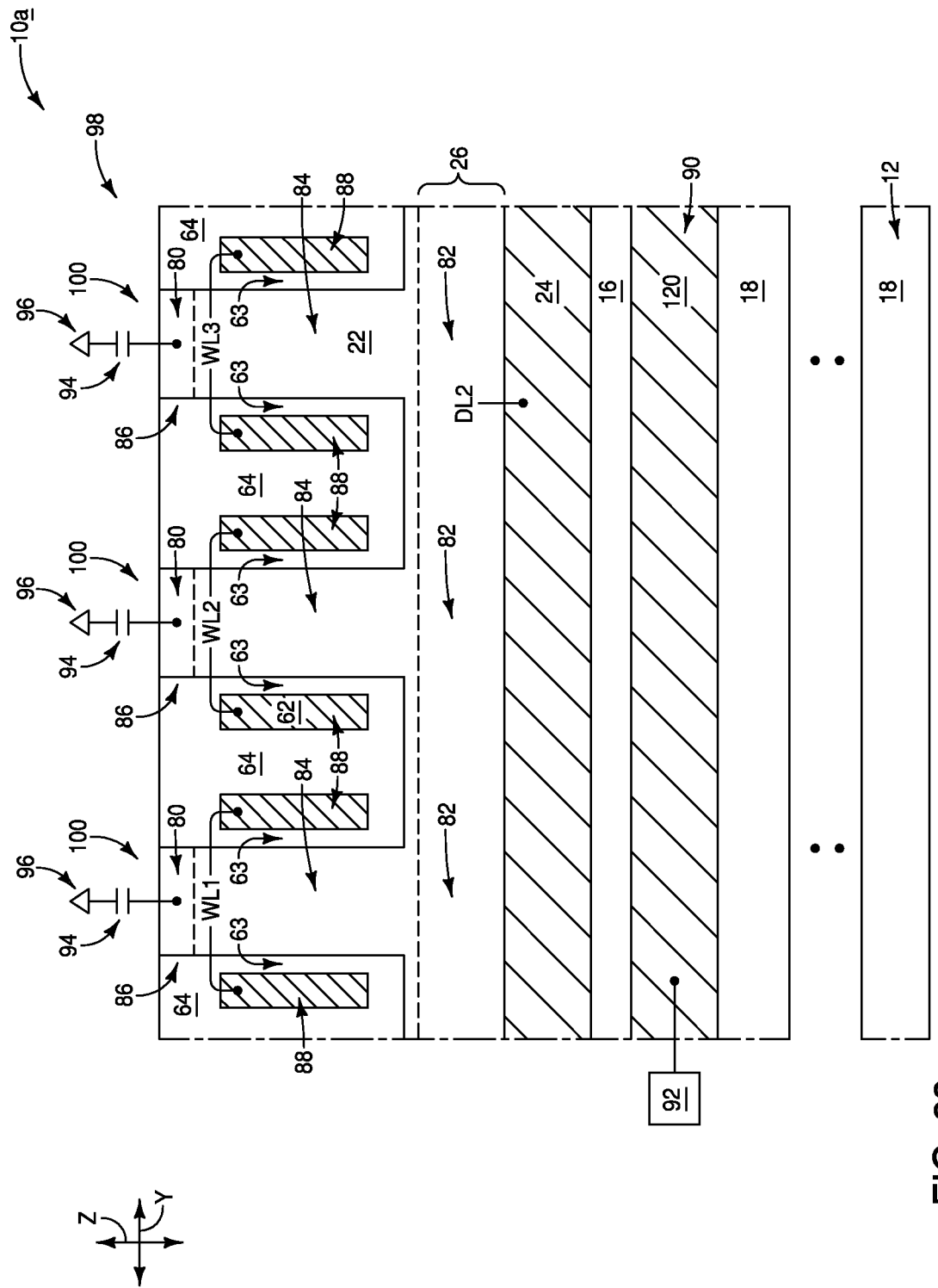
FIG. 23 is a diagrammatic view of the region of the example construction of FIG. 22B at an example processing stage subsequent to that of FIG. 22B.

Referring to FIG. 23, construction 10a is shown at a process stage following that of FIG. 22B. The storage elements 94 are formed to be conductively coupled with the upper source/drain regions 80. In the shown embodiment, the storage elements 94 are capacitors. Each capacitor has a node coupled with the reference voltage 96.

The storage elements 94 and transistors 86 may be incorporated into memory cells 100 of a memory array 98. In some embodiments, the transistors 86 may be referred to as access transistors of the memory cells. The memory array 98 may be analogous to that described above with reference to FIG. 11.

The reference voltage source 92 (i.e., reference voltage circuitry) may be provided in any suitable location relative to the reference structure 90; and in some embodiments may be below the reference structure, above the reference structure, laterally outward of the reference structure, etc. In some embodiments, one or more dummy wordlines may be utilized to supply the reference voltage to the reference structure 90.

Figure 24:
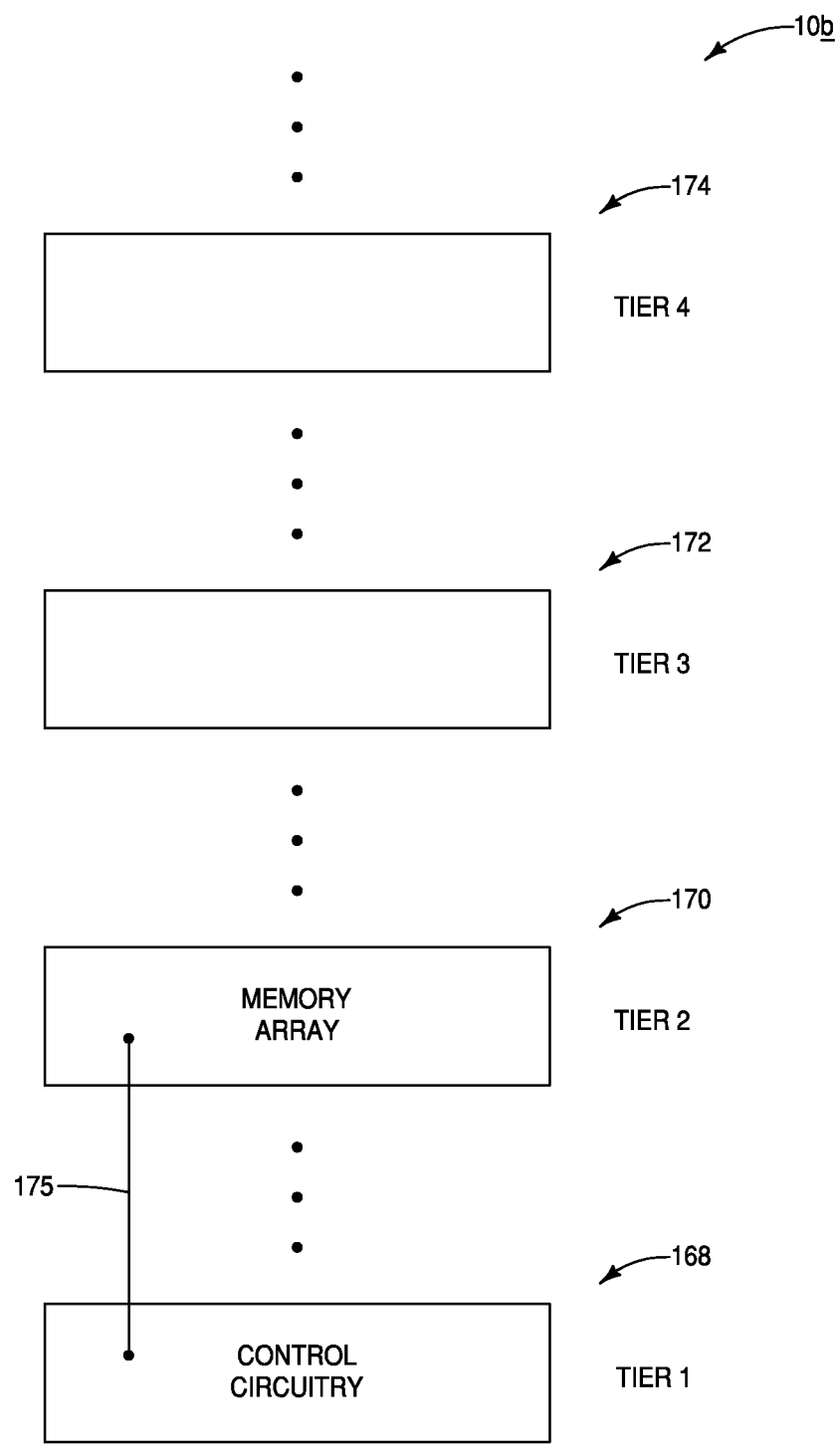
FIG. 24 is a diagrammatic cross-sectional side view of a region of an example assembly comprising stacked tiers.

In some embodiments, a memory array 98 (e.g., the memory array 98 of FIG. 10 or that of FIG. 23) may be within a memory tier (i.e., memory deck) which is within a vertically-stacked arrangement of tiers (or decks). For instance, FIG. 24 shows a portion of an integrated assembly 10b comprising a vertically-stacked arrangement of tiers 168, 170, 172 and 174 (also labeled as tiers 1-4). The vertically-stacked arrangement may extend upwardly to include additional tiers. The tiers 1-4 may be considered to be examples of levels that are stacked one atop the other. The levels may be within different semiconductor dies (wafers), or at least two of the levels may be within the same semiconductor die. The bottom tier (tier 1) may include control circuitry and/or sensing circuitry (e.g., may include wordline drivers, sense amplifiers, reference-voltage-control-circuitry 92, etc.; and in some embodiments may include CMOS circuitry). The upper tiers (tiers 2-4) may include memory arrays, such as, for example, the memory array 98. The memory arrays within the various tiers may be the same as one another (e.g., may all be DRAM arrays), or may be different relative to one another (e.g., some may be DRAM arrays, while others are NAND arrays). Also, one or more of the upper tiers may include control circuitry or other logic circuitry. FIG. 24 diagrammatically shows an upper deck (tier 2) comprising a memory array, and a lower deck (tier 1) comprising control circuitry, and shows the control circuitry of the lower deck coupled with the circuitry of the upper deck through a conductive interconnect 175.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having digit lines which extend along a first direction. The digit lines are spaced from one another by intervening regions. Each of the digit lines has a first width along a cross-section orthogonal to the first direction. Each of the intervening regions also has the first width along the cross-section. Each of the digit lines has a top surface at a first height. Vertically-extending pillars are over the digit lines. Each of the pillars includes a transistor channel region which extends vertically between an upper source/drain region and a lower source/drain region. The lower source/drain regions are coupled with the digit lines. Each of the pillars has the first width along the cross-section. The intervening regions extend upwardly to between the pillars and have the first width from top surfaces of the upper source/drain regions to bottom surfaces of the digit lines. Storage elements are coupled with the upper source/drain regions. Wordlines extend along a second direction which crosses the first direction. The wordlines include gate regions adjacent the channel regions. Shield lines are within the intervening regions and extend along the first direction. Each of the shield lines has a top surface at a second height which is greater than or equal to the first height.

Some embodiments include a method of forming an integrated assembly. A support structure is formed to comprise insulative material over a reference structure. The reference structure comprises metal and is configured as a horizontally-extending expanse. A stack is formed over the support structure. The stack comprises semiconductor material over digit line material. The stack is patterned into rails extending along a first direction. The rails are spaced from one another by first trenches. The patterning punches through the insulative material to leave an upper surface of the reference structure exposed along bottoms of the first trenches. Each of the rails has a top surface, and has sidewall surfaces extending downwardly from the top surface. The patterning of the stack into the rails forms the digit line material into digit lines which extend along the first direction. Insulative shells are formed that cover the top surfaces and the sidewall surfaces of the rails. The insulative shells narrow the first trenches. The upper surface of the reference structure is exposed along bottoms of the narrowed first trenches. Conductive shield lines are formed within the narrowed first trenches and directly against the exposed upper surface of the reference structure at the bottoms of the narrowed first trenches. Second trenches are formed which extend along a second direction. The second direction crosses the first direction. The second trenches pattern upper regions of the rails into pillars and do not pattern lower regions of the rails. The lower regions of the rails include the digit lines. Wordlines are formed within the second trenches. Bottom sections of the semiconductor material are doped to form lower source/drain regions. The lower source/drain regions are coupled with the digit lines. Top sections of the semiconductor material are doped to form upper source/drain regions. Channel regions are vertically between the lower source/drain regions and the upper source/drain regions. The wordlines are adjacent the channel regions. Storage elements are formed to be coupled with the upper source/drain regions.

Some embodiments include a method of forming an integrated assembly. A stack is formed to comprise semiconductor material over digit line material. The stack is patterned into rails extending along a first direction. The rails are spaced from one another by first trenches. The rails have top surfaces, and have sidewall surfaces extending downwardly from the top surfaces. The patterning of the stack into the rails forms the digit line material into digit lines which extend along the first direction. An insulative material is formed to covers the top surfaces and the sidewall surfaces of the rails. The insulative material narrows the first trenches. Conductive shield lines are formed within the narrowed first trenches. Second trenches are formed to extend along a second direction. The second direction crosses the first direction. The second trenches pattern upper regions of the rails into pillars and do not pattern lower regions of the rails. The lower regions of the rails include the digit lines. Wordlines are formed within the second trenches. Bottom sections of the semiconductor material are doped to form lower source/drain regions. The lower source/drain regions are coupled with the digit lines. Top sections of the semiconductor material are doped to form upper source/drain regions. Channel regions are vertically between the lower source/drain regions and the upper source/drain regions. The wordlines are adjacent the channel regions. Storage elements are formed to be coupled with the upper source/drain regions. The storage elements are comprised by memory cells of a memory array. The digit lines extend along columns of the memory array and the wordlines extend along rows of the memory array. Each of the shield lines has a first end along a first peripheral edge of the memory array and has a second end along a second peripheral edge of the memory array in opposing relation to the first peripheral edge of the memory array. At least one of the first and second ends of each of the conductive shield lines is electrically connected with a reference voltage source In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
    digit lines extending along a first direction; the digit lines being spaced from one another by intervening regions; each of the digit lines having a first width along a cross-section orthogonal to the first direction; each of the intervening regions also having the first width along the cross-section; each of the digit lines having a top surface at a first height;
    vertically-extending pillars over the digit lines; each of the vertically-extending pillars comprising a transistor channel region and an upper source/drain region; lower source/drain regions being under the channel region and being coupled with the digit lines; the transistor channel regions extending vertically between the lower source/drain regions and the upper source/drain regions; each of the vertically-extending pillars having the first width along the cross-section; the intervening regions extending upwardly to between the vertically-extending pillars and comprising the first width from top surfaces of the upper source/drain regions to bottom surfaces of the digit lines;
    storage elements coupled with the upper source/drain regions;
    wordlines extending along a second direction which crosses the first direction; the wordlines including gate regions adjacent the channel regions; and
    shield lines within the intervening regions and extending along the first direction; each of the shield lines having a top surface at a second height which is greater than or equal to the first height.

2. The integrated assembly of claim 1 wherein the storage elements are capacitors.

3. The integrated assembly of claim 1 wherein the vertically-extending pillars comprise one or more semiconductor materials.

4. The integrated assembly of claim 1 wherein the storage elements are comprised by memory cells of a memory array; wherein the digit lines extend along columns of the memory array and the wordlines extend along rows of the memory array; wherein one of columns is an edge column; the edge column having one of the intervening regions extending along one side, and having an edge region extending along a second side in opposing relation to said one side; the shield lines within the intervening regions being first shield lines and being configured as vertically-extending plates; one of the shield lines being within the edge region and being a second shield line; the second shield line being configured different than the first shield lines and comprising an elbow region connecting a vertically-extending region to a horizontally-extending region.

5. The integrated assembly of claim 1 wherein each of the shield lines has a second width along the cross-section; and wherein the second width is less than or equal to about one-half of the first width.

6. The integrated assembly of claim 5 wherein the second width is less than or equal to about one-third of the first width.

7. The integrated assembly of claim 1 wherein each of the lower source/drain regions has a top surface at a third height, and wherein the second height is greater than or equal to the third height.

8. The integrated assembly of claim 7 wherein each of the wordlines has a bottom surface at a fourth height, and wherein the second height is less than the fourth height.

9. The integrated assembly of claim 1 wherein the digit lines comprise first conductive material, the shield lines comprise second conductive material and the wordlines comprise third conductive material; and wherein at least one of the first, second and third conductive materials is different from at least one other of the first, second and third conductive materials.

10. The integrated assembly of claim 1 wherein the digit lines comprise first conductive material, the shield lines comprise second conductive material and the wordlines comprise third conductive material; wherein the first, second and third conductive materials are a same composition; and wherein said same composition comprises metal.

11. The integrated assembly of claim 1 wherein the storage elements are comprised by memory cells of a memory array; wherein the digit lines extend along columns of the memory array and the wordlines extend along rows of the memory array; and further comprising a metal-containing reference structure under the memory array; each of the shield lines having a bottom surface directly adjacent to an upper surface of the metal-containing reference structure.

12. The integrated assembly of claim 1 wherein the storage elements are comprised by memory cells of a memory array; wherein the digit lines extend along columns of the memory array and the wordlines extend along rows of the memory array; wherein each of the shield lines has an end along a peripheral edge of the memory array; and further comprising:
    a reference structure offset from the memory array; and
    interconnects extending from the ends of the shield lines to the reference structure.

13. The integrated assembly of claim 12 wherein the reference structure is a metal-containing plate.

14. The integrated assembly of claim 12 wherein the reference structure is vertically offset from the memory array.

15. The integrated assembly of claim 12 wherein the reference structure is laterally offset from the memory array.

16. The integrated assembly of claim 12 wherein at least a portion of the reference structure is laterally offset from the memory array and is also vertically offset from the memory array.

17. The integrated assembly of claim 12 wherein the memory array is within a memory deck of a vertically-stacked arrangement of decks.

18. The integrated assembly of claim 17 wherein the vertically-stacked arrangement of decks includes a lower deck under the memory deck; the lower deck comprising control circuitry which is coupled with circuitry of the memory deck.

19. The integrated assembly of claim 18 wherein the reference structure is along the lower deck.

20. The integrated assembly of claim 1 wherein the storage elements are comprised by memory cells of a memory array; wherein the digit lines extend along columns of the memory array and the wordlines extend along rows of the memory array; wherein each of the shield lines has a first end and has a second end in opposing relation to the first end; and further comprising:
 a first reference structure laterally offset from a first side of the memory array;
 a second reference structure laterally offset from a second side of the memory array;
 first interconnects extending from the first ends of the shield lines to the first reference structure; and
 second interconnects extending from the second ends of the shield lines to the second reference structure.

21. The integrated assembly of claim 1 wherein the storage elements are comprised by memory cells of a memory array; wherein the digit lines extend along columns of the memory array and the wordlines extend along rows of the memory array; wherein each of the shield lines has a first end and has a second end in opposing relation to the first end; and further comprising:
 a first reference structure laterally offset from a first side of the memory array;
 a second reference structure laterally offset from a second side of the memory array;
 first interconnects extending from the first ends of a first set of the shield lines to the first reference structure; and
 second interconnects extending from the second ends of a second set of the shield lines to the second reference structure; the second set comprising different shield lines than the first set.

22. The integrated assembly of claim 1 wherein the storage elements are comprised by memory cells of a memory array; wherein the digit lines extend along columns of the memory array and the wordlines extend along rows of the memory array; and further comprising:
 a reference structure peripherally surrounding the memory array; and
 interconnects extending from the shield lines to the reference structure.

23. The integrated assembly of claim 22 wherein the reference structure is vertically offset from the memory array.

* * * * *